US012108605B2

United States Patent
Chen et al.

(10) Patent No.: US 12,108,605 B2
(45) Date of Patent: Oct. 1, 2024

(54) MEMORY DEVICE AND METHOD OF FORMING THE SAME

(71) Applicant: Taiwan Semiconductor Manufacturing Company, Ltd., Hsinchu (TW)

(72) Inventors: Chieh-Fang Chen, Hsinchu County (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 64 days.

(21) Appl. No.: 17/891,152

(22) Filed: Aug. 19, 2022

(65) Prior Publication Data
US 2024/0064994 A1   Feb. 22, 2024

(51) Int. Cl.
*H01L 29/66* (2006.01)
*H01L 29/78* (2006.01)
*H10B 51/10* (2023.01)
*H10B 51/20* (2023.01)

(52) U.S. Cl.
CPC ......... *H10B 51/20* (2023.02); *H01L 29/6684* (2013.01); *H01L 29/78391* (2014.09); *H10B 51/10* (2023.02)

(58) Field of Classification Search
CPC ..... H10B 51/20; H10B 51/10; H01L 29/6684; H01L 29/78391; H01L 29/40111
USPC ............................................. 257/295; 438/3
See application file for complete search history.

(56) References Cited

U.S. PATENT DOCUMENTS

| | | | |
|---|---|---|---|
| 11,694,940 B1* | 7/2023 | Mathuriya | H01L 23/49816 257/295 |
| 2004/0058493 A1* | 3/2004 | Demange | H10B 69/00 257/E21.664 |
| 2008/0265235 A1* | 10/2008 | Kamigaichi | H10B 63/30 257/E47.001 |
| 2010/0181610 A1* | 7/2010 | Kim | H10B 43/27 257/314 |
| 2014/0340952 A1* | 11/2014 | Ramaswamy | H01L 29/78391 257/295 |
| 2015/0041873 A1* | 2/2015 | Karda | H10B 43/35 257/295 |
| 2016/0071852 A1* | 3/2016 | Domingues Dos Santos | H10B 53/30 257/532 |
| 2016/0322368 A1* | 11/2016 | Sun | H10B 51/20 |
| 2019/0067327 A1* | 2/2019 | Herner | H10B 43/20 |
| 2019/0148406 A1* | 5/2019 | Liu | H01L 23/528 257/295 |

(Continued)

*Primary Examiner* — Sheikh Maruf
(74) *Attorney, Agent, or Firm* — JCIPRNET

(57) ABSTRACT

A memory device includes a plurality of first conductive pillars, a plurality of second conductive pillars, a plurality of gap filling pillars, a channel layer and first dielectric pillars. The gap filling pillars are located in between the first conductive pillars and the second conductive pillars. The channel layer is extending in a first direction, and located on side surfaces of the first conductive pillars and the second conductive pillars. The first dielectric pillars are located in between the channel layer and the plurality of gap filling pillars, wherein a length of an interface where the first dielectric pillars contact the gap filling pillars along the first direction is different from a length of the gap filling pillars along the first direction.

15 Claims, 71 Drawing Sheets

(56) References Cited

U.S. PATENT DOCUMENTS

| | | | |
|---|---|---|---|
| 2022/0139960 A1* | 5/2022 | Said | H10B 51/30 |
| | | | 257/295 |
| 2022/0278001 A1* | 9/2022 | Calabrese | H01L 29/40111 |
| 2023/0206976 A1* | 6/2023 | Lee | G11C 11/2255 |
| | | | 257/295 |

* cited by examiner

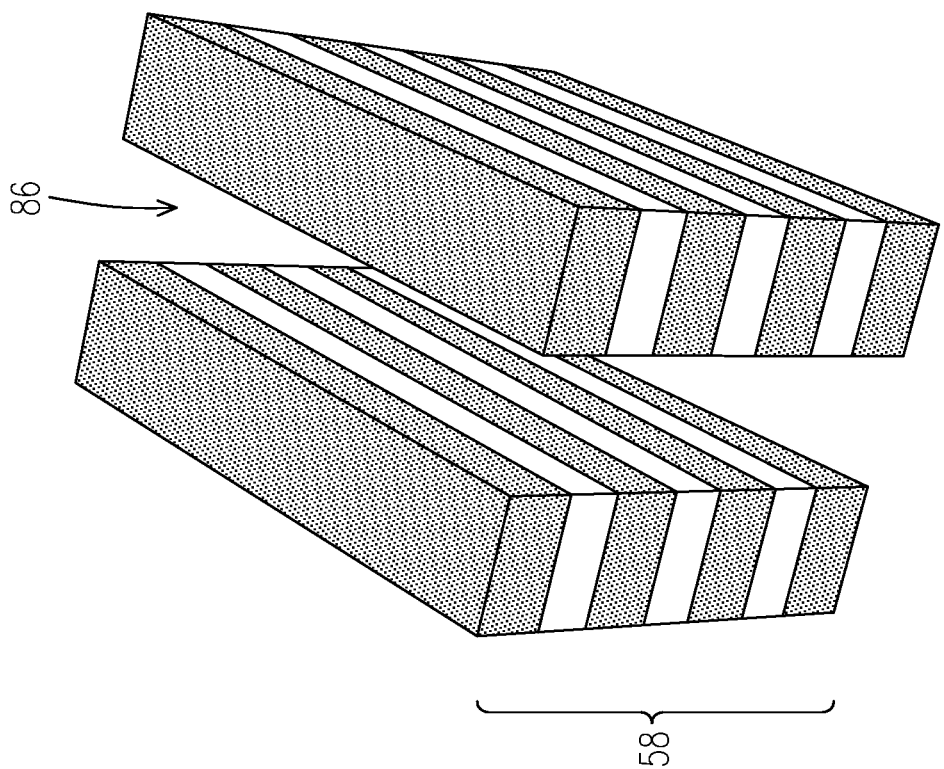

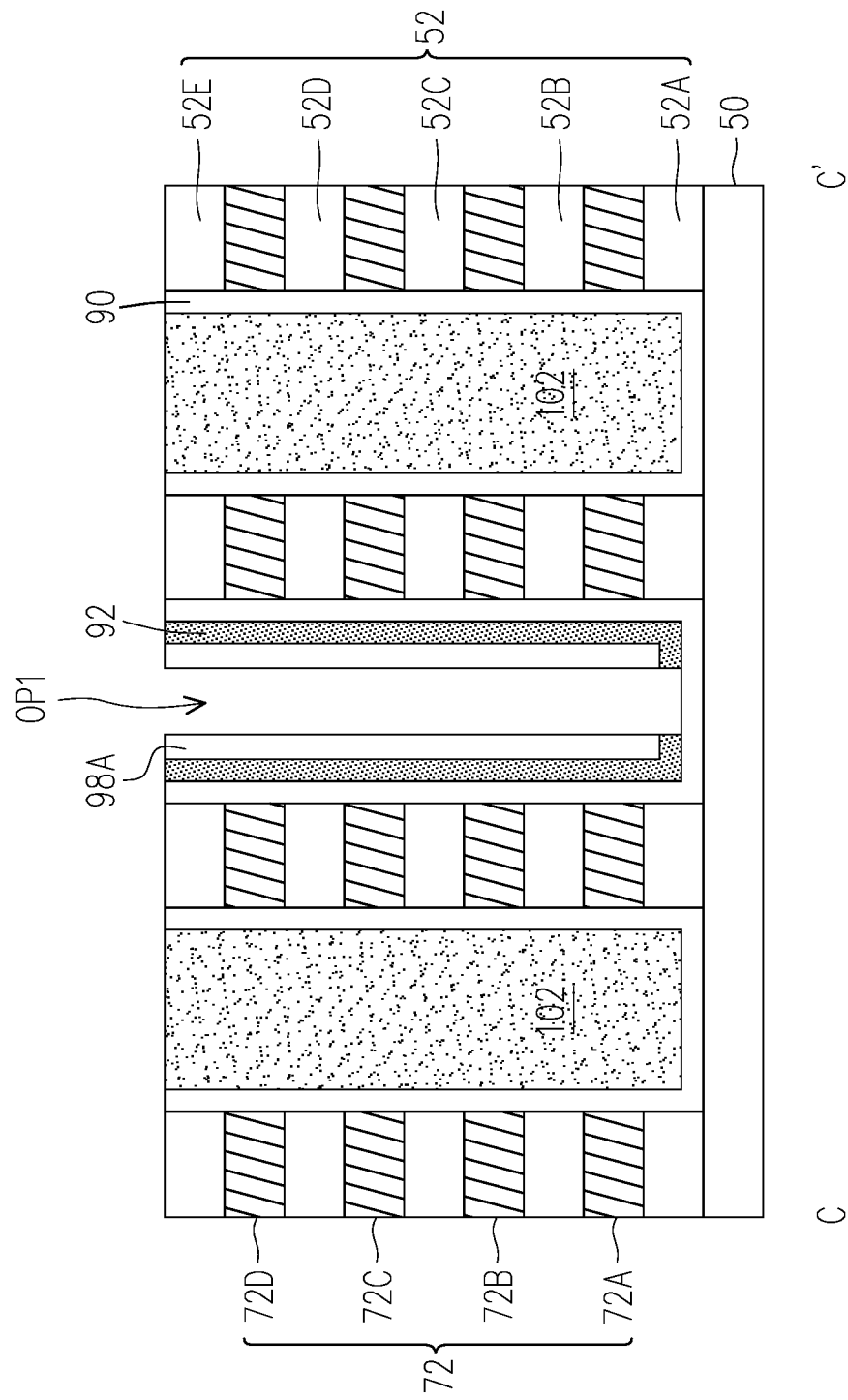

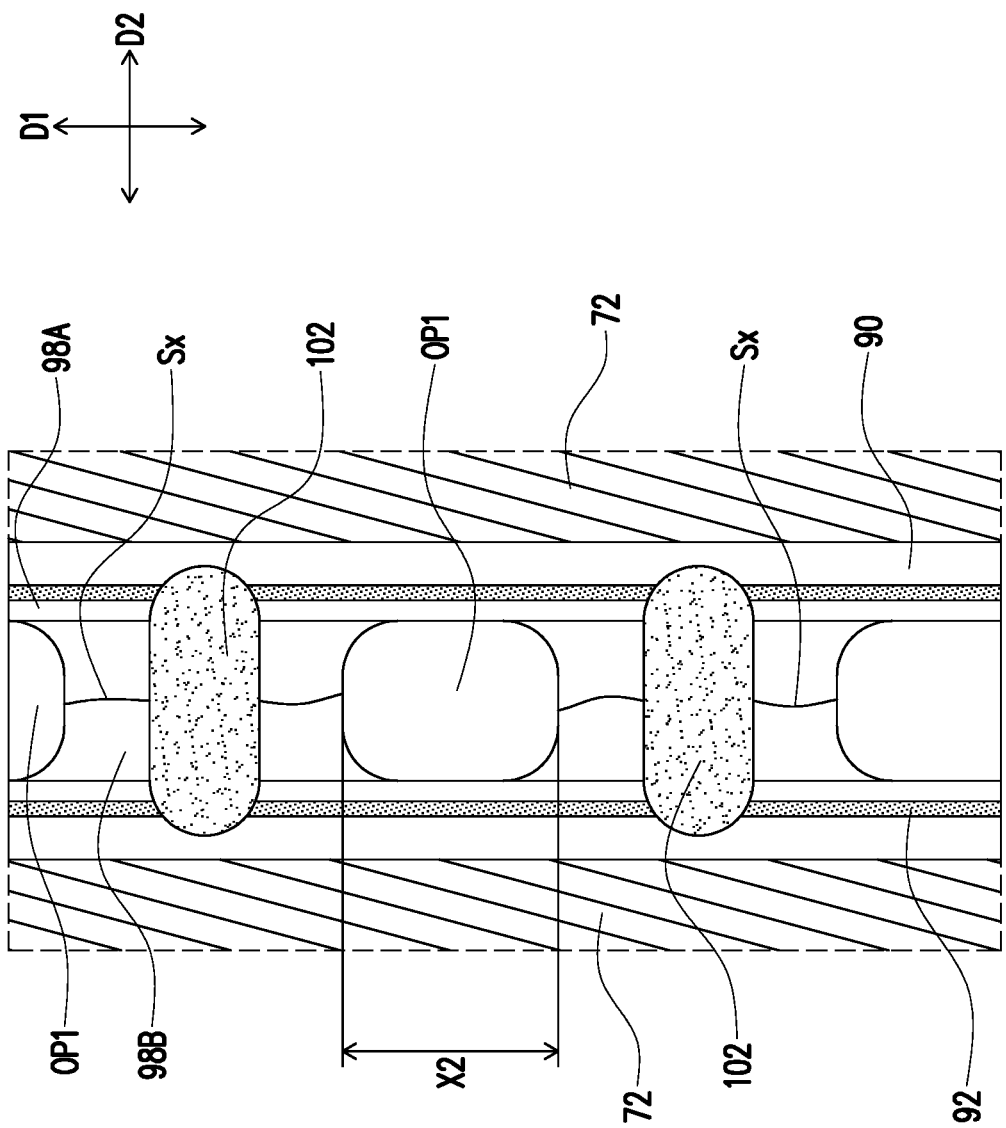

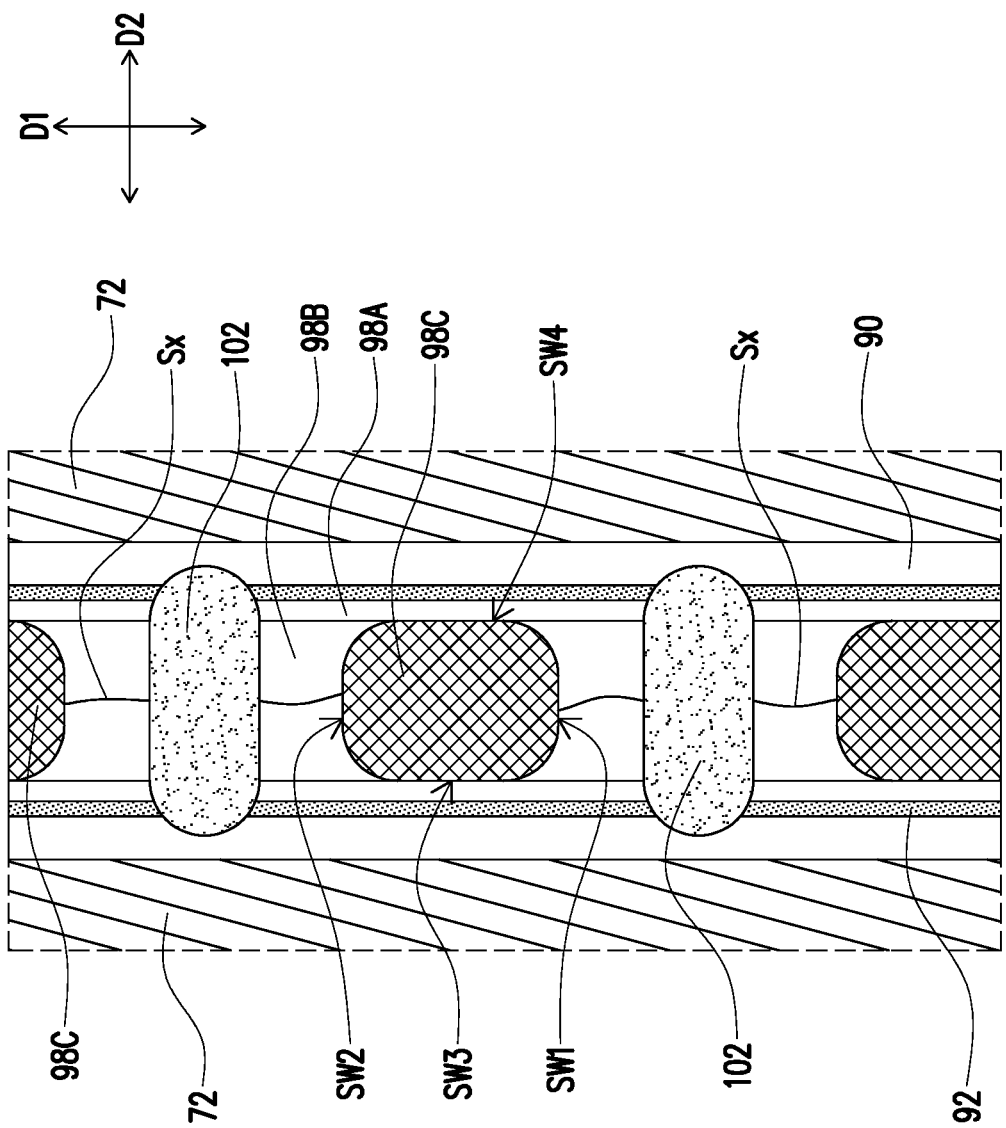

MEMORY DEVICE AND METHOD OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
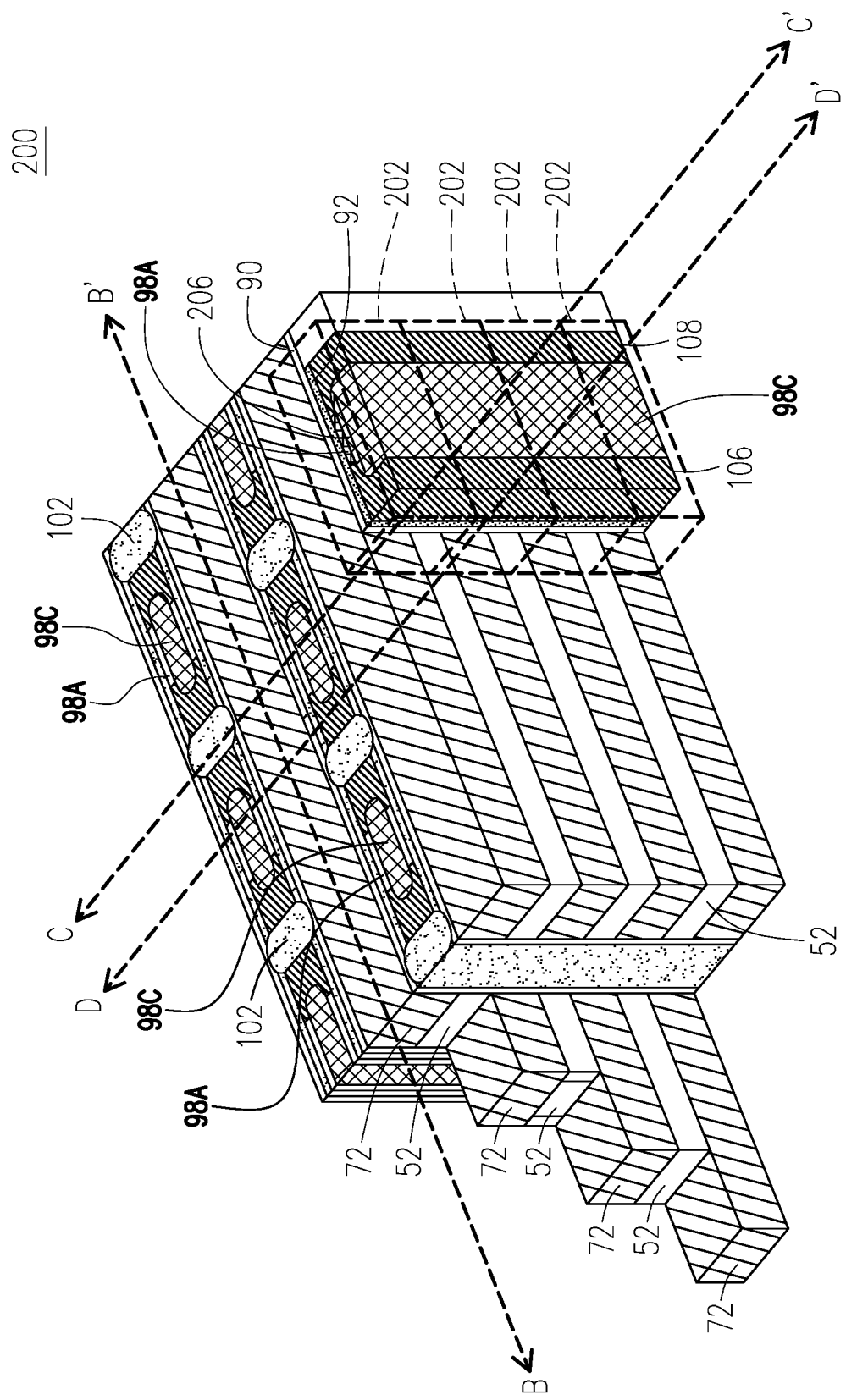
FIG. 1A to FIG. 1C illustrate a simplified perspective view, a circuit diagram, and a top down view of a memory device in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a semiconductor device such as a 3D memory device. In some embodiments, the 3D memory device is a field effect transistor (FET) memory circuit including a plurality of vertically stacked memory cells. In some embodiments, each memory cell of the 3D memory device is regarded as a FET that includes a word line region acting as a gate electrode, a bit line region acting as a first source/drain electrode, and a source line region acting as a second source/drain electrode, a gate dielectric, and an oxide semiconductor (OS) as a channel region. In some embodiments, each memory cell is regarded as a thin film transistor (TFT).

Due to the continual reductions in minimum feature size, memory devices are usually formed with dielectric pillars and conductive pillars having a high aspect ratio. However, most high aspect ratio trench gap filling process will naturally result in the formation of dielectric pillars (or dielectric layers) having a long seam in the center. As such, during the formation of conductive pillars (source/drain pillars) in a subsequent step, there would be a risk of bridging in the memory cell due to the presence of the seams. In some embodiments of the present disclosure, a pull-back process is performed to resolve the seams problem while maintaining controllable cell behavior.

Figure 1B:
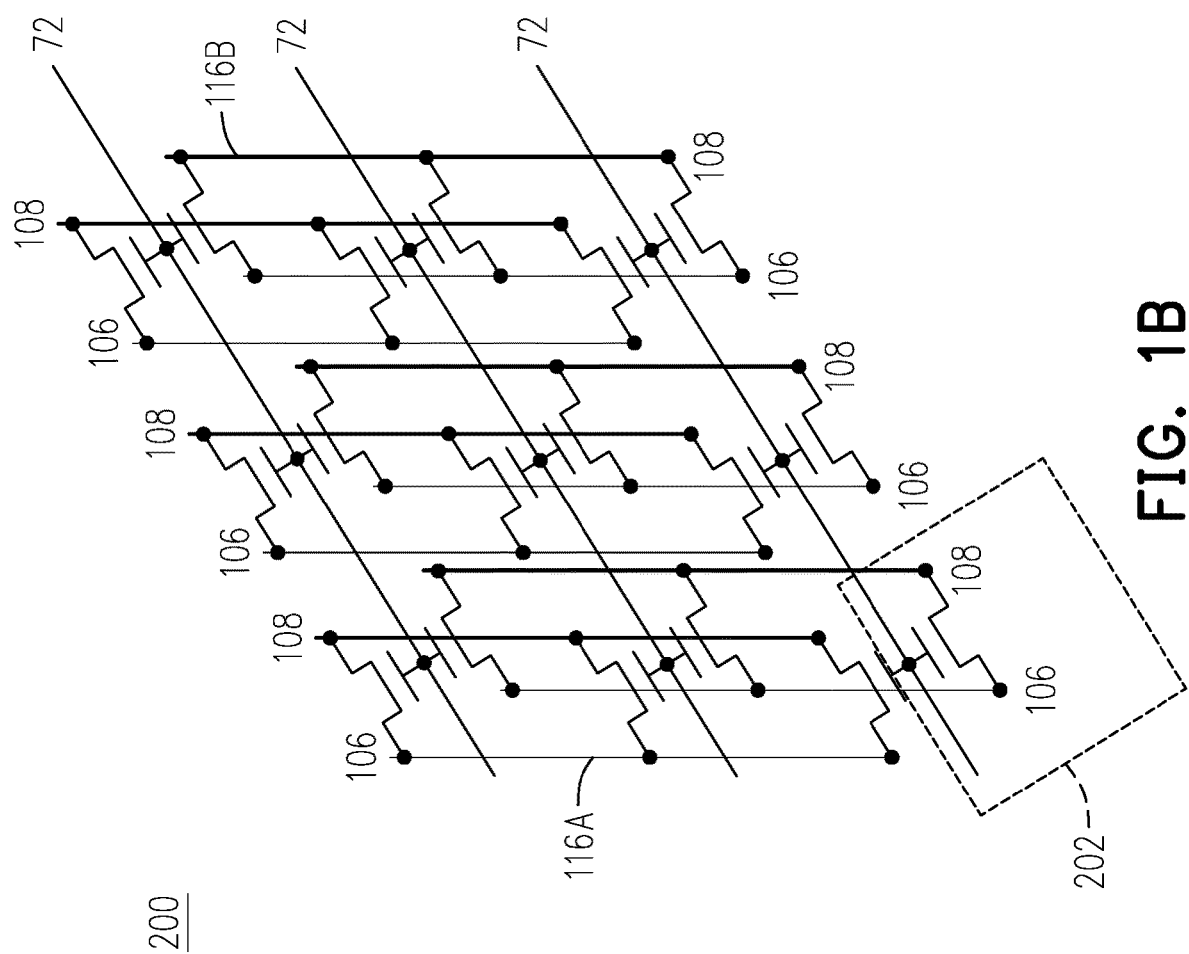
Figure 1C:
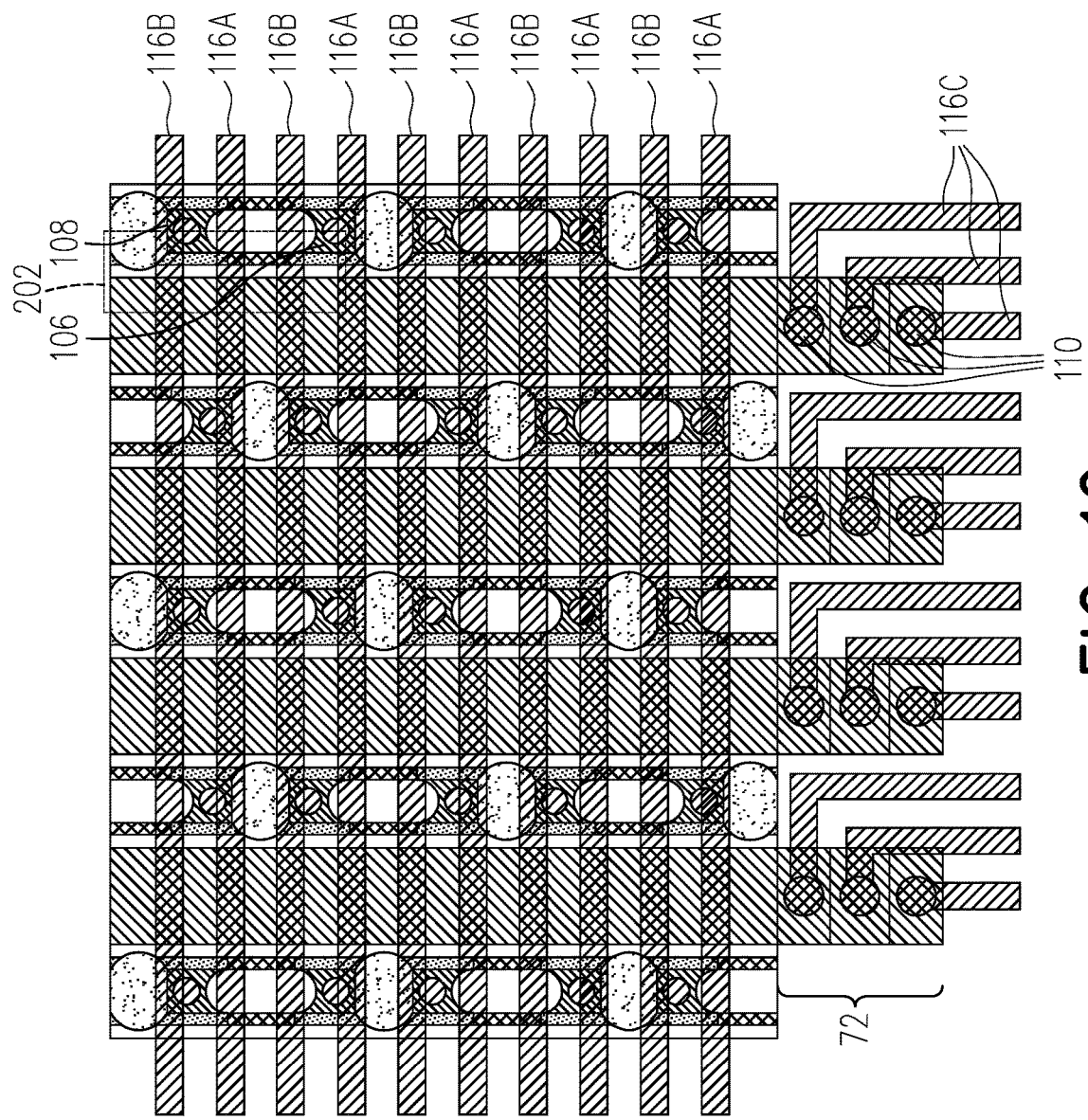

FIGS. 1A, 1B, and 1C illustrate examples of a memory device (or memory array) according to some embodiments. FIG. 1A illustrates an example of a portion of a simplified memory device 200 in a partial three-dimensional view; FIG. 1B illustrates a circuit diagram of the memory device 200; and FIG. 1C illustrates a top down view of the memory device 200 in accordance with some embodiments. The memory device 200 includes a plurality of memory cells 202, which may be arranged in a grid of rows and columns. The memory cells 202 may be further stacked vertically to provide a three-dimensional memory device, thereby increasing device density. The memory device 200 may be disposed in the back end of line (BEOL) of a semiconductor die. For example, the memory device may be disposed in the interconnect layers of the semiconductor die, such as, above one or more active devices (e.g., transistors) formed on a semiconductor substrate.

Referring to FIGS. 1A to 1C, in some embodiments, the memory device 200 is a flash memory device, such as a NOR flash memory device, or the like. In some other embodiments, the memory device 200 is another type of non-volatile memory array, such as a magnetoresistive random-access memory (MRAM) array, a resistive random-access memory (RRAM) array, or the like. In some embodiments, a gate of each memory cell 202 is electrically coupled to a respective word line (e.g., conductive line 72 (or conductive layer)), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the memory device 200 may share a common word line while the memory cells 202 in a same vertical column of the memory device 200 may share a common source line and a common bit line.

The memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory device 200, and conductive contacts may be made to expose portions of the conductive lines 72, respectively.

The memory device 200 further includes conductive pillars 106 (e.g., electrically connected to bit lines) and conductive pillars 108 (e.g., electrically connected to source lines) arranged alternately. The conductive pillars 106 and 108 (or electrode layers) may each extend in a direction perpendicular to the conductive lines 72. A dielectric layer 98 (including dielectric pillars 98A and gap filling pillars 98C) is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the memory device 200 may also include an oxide semiconductor (OS) material as a channel layer 92. The channel layer 92 (or oxide semiconductor layer) may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, a dielectric layer 90 (or ferroelectric layer 90) is disposed between the channel layer 92 and each of the conductive lines 72 and the dielectric layers 52, and the dielectric layer 90 may serve as a gate dielectric for each memory cell 202. In some embodiments, the dielectric layer 90 includes a ferroelectric material, such as a hafnium oxide, hafnium zirconium oxide, silicon-doped hafnium oxide, or the like. In some embodiments, the dielectric layer 90 includes a layer of SiNx between two SiOx layers (e.g., an ONO structure).

In some embodiments, when the dielectric layer 90 includes a ferroelectric material, the dielectric layer 90 may be polarized in one of two different directions, and the polarization direction may be changed by applying an appropriate voltage differential across the dielectric layer 90 and generating an appropriate electric field. The polarization may be relatively localized (e.g., generally contained within each boundaries of the memory cells 202), and a continuous region of the dielectric layer 90 may extend across a plurality of memory cells 202. Depending on a polarization direction of a particular region of the dielectric layer 90 (or ferroelectric layer 90), a threshold voltage of a corresponding memory cell 202 varies, and a digital value (e.g., 0 or 1) can be stored. For example, when a region of the dielectric layer 90 (or ferroelectric layer 90) has a first electrical polarization direction, the corresponding memory cell 202 may have a relatively low threshold voltage, and when the region of the dielectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the dielectric layer 90 (or ferroelectric layer 90) corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). By applying the write voltage across the portion of the dielectric layer 90, a polarization direction of the region of the dielectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the dielectric layer 90 (or ferroelectric layer 90), the memory cell 202 may or may not be turned on. As a result, the conductive pillar 106 may or may not be discharged through the conductive pillar 108 (e.g., a source line that is coupled to ground), and the digital value stored in the memory cell 202 can be determined. As the conductive lines 72 intersect the conductive pillars 106 and 108, individual memory cells 202 may be selected for the read operation.

FIG. 1A further illustrates reference cross-sections of the memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric layer 98 (including dielectric pillars 98A and gap filling pillars 98C) and the isolation pillars 102. Cross-section D-D' is perpendicular to cross-section B-B' and extends through the dielectric layer 98 (including dielectric pillars 98A and gap filling pillars 98C) and the conductive pillars 106. Subsequent figures refer to these reference cross-sections for clarity.

Figure 2:
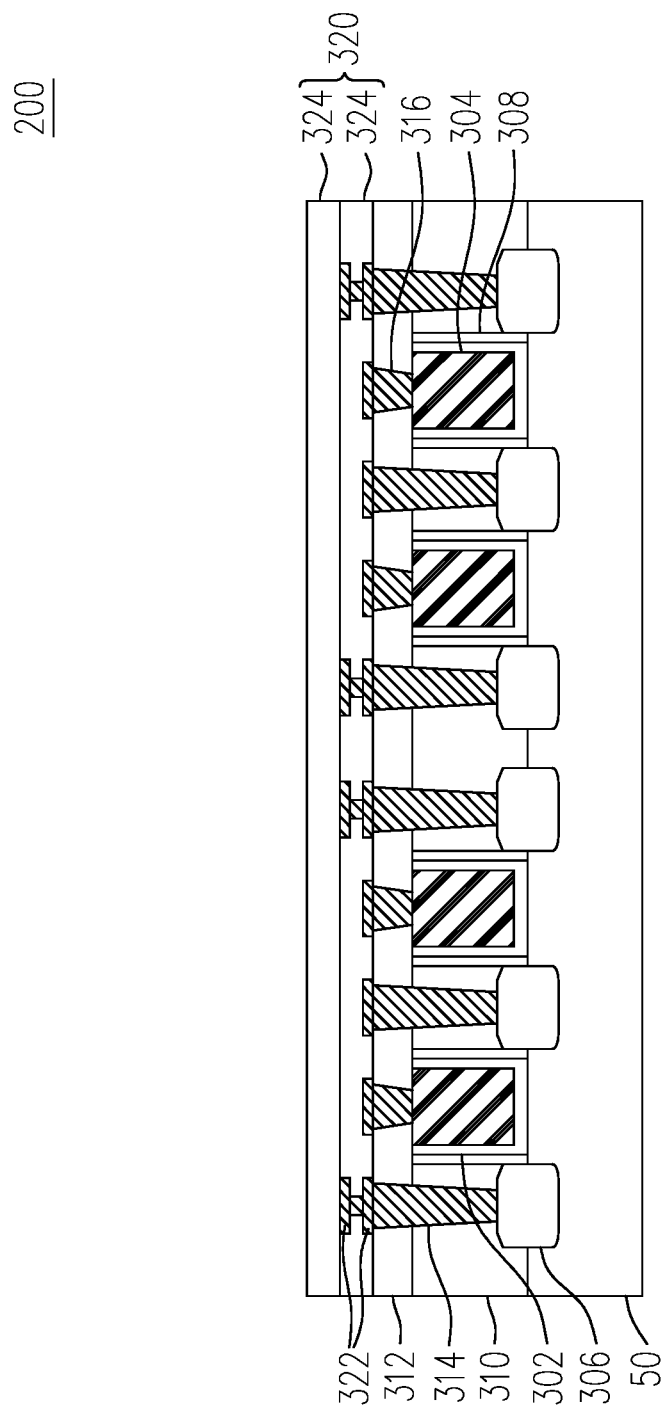
FIG. 2 to FIG. 30E illustrate various views in a method of manufacturing a memory device in accordance with some embodiments of the disclosure.

FIG. 2 through FIG. 30E are various views of intermediate stages in the manufacturing of a memory device, in accordance with some embodiments of the disclosure. Referring to FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an application specific integrated circuit (ASIC) die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
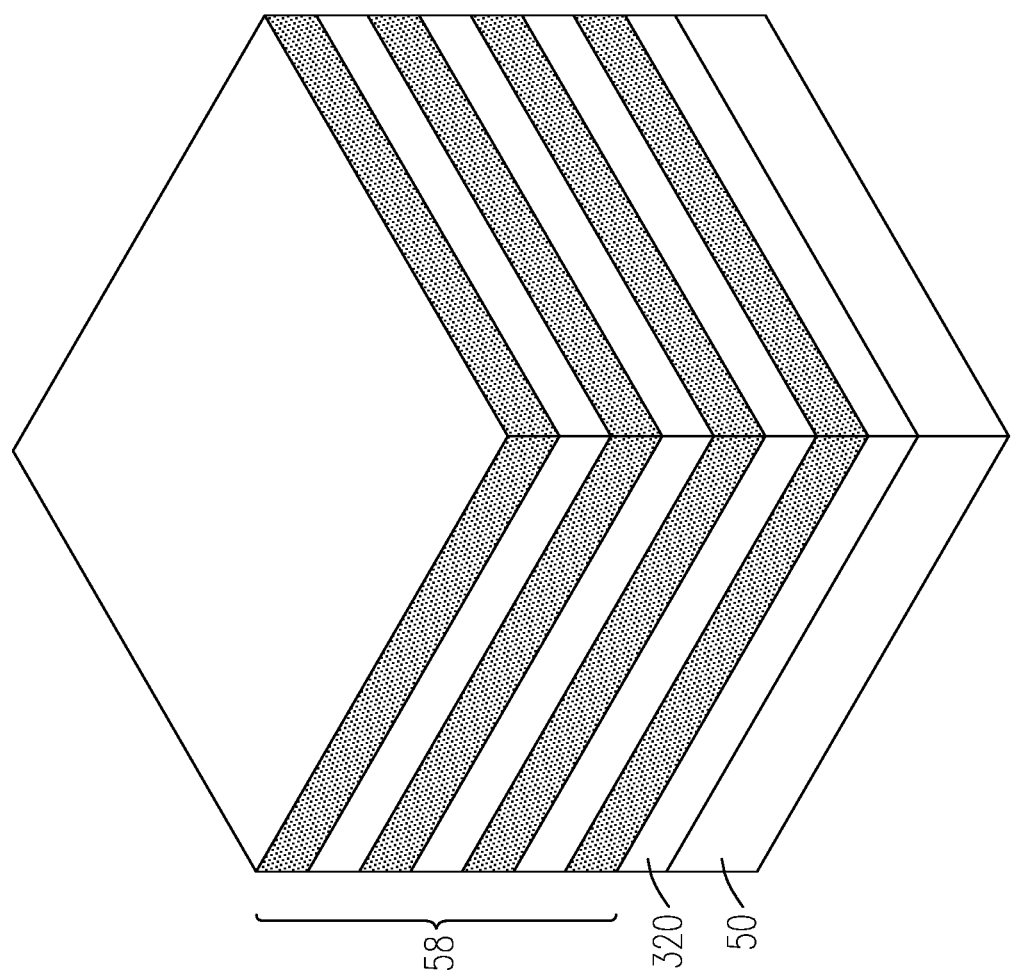
Figure 3B:
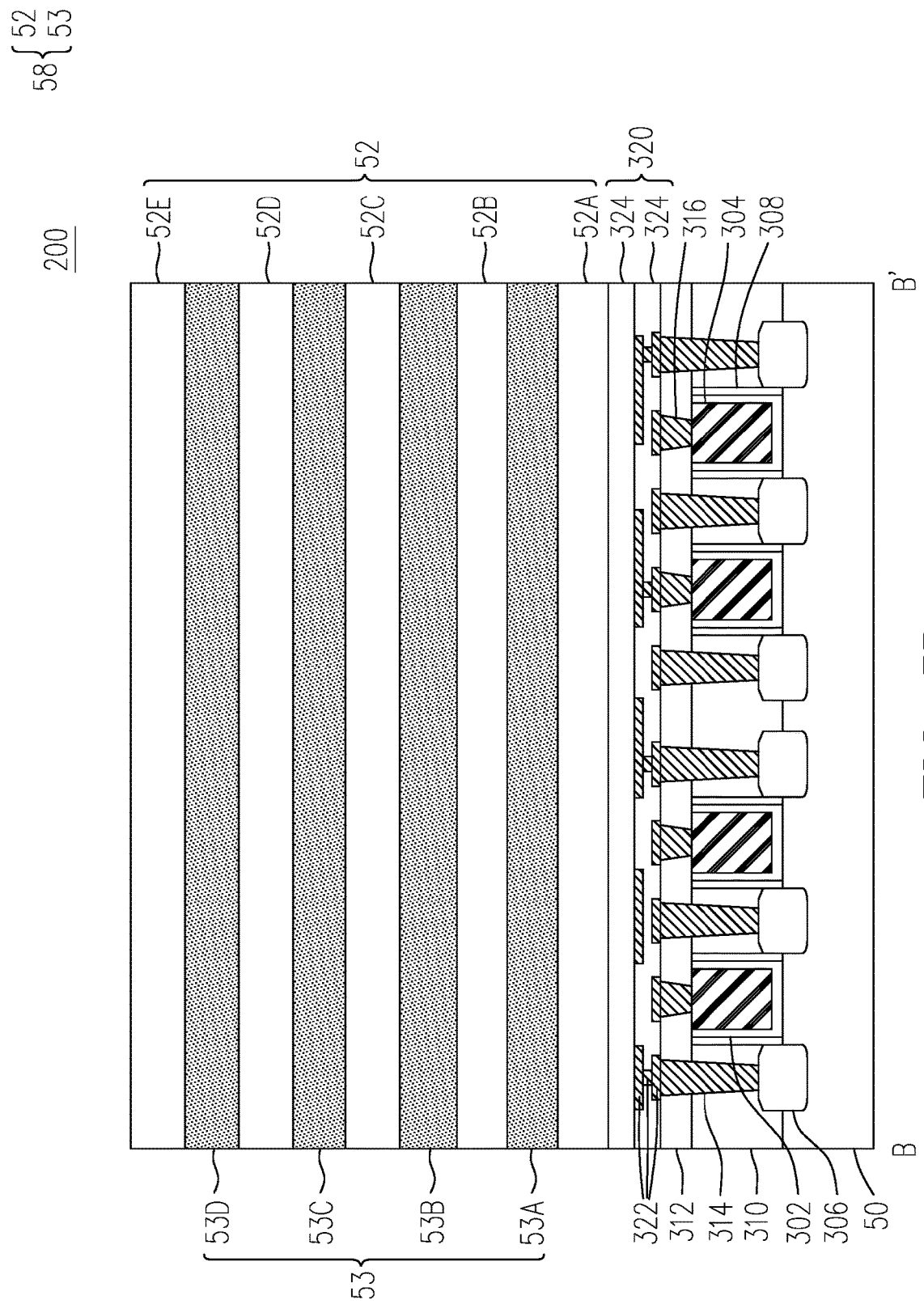

Referring to FIGS. 3A and 3B, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory device 200 (see FIGS. 1A and 1B). In some embodiments, one or more interconnect layers including conductive features in insulting layers (e.g., low-k dielectric layers) may be disposed over the multi-layer stack 58.

As illustrated in FIGS. 3A and 3B, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIGS. 3A and 3B illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIG. 4 through FIG. 11 and FIG. 12B are various views of intermediate stages in the manufacturing a staircase structure of the memory device 200, in accordance with some embodiments. FIG. 4 through FIG. 11 and FIG. 12B are illustrated along reference cross-section B-B' illustrated in FIG. 1A. FIG. 12A is illustrated as a three-dimensional view of the structure shown in FIG. 12B.

Figure 4:
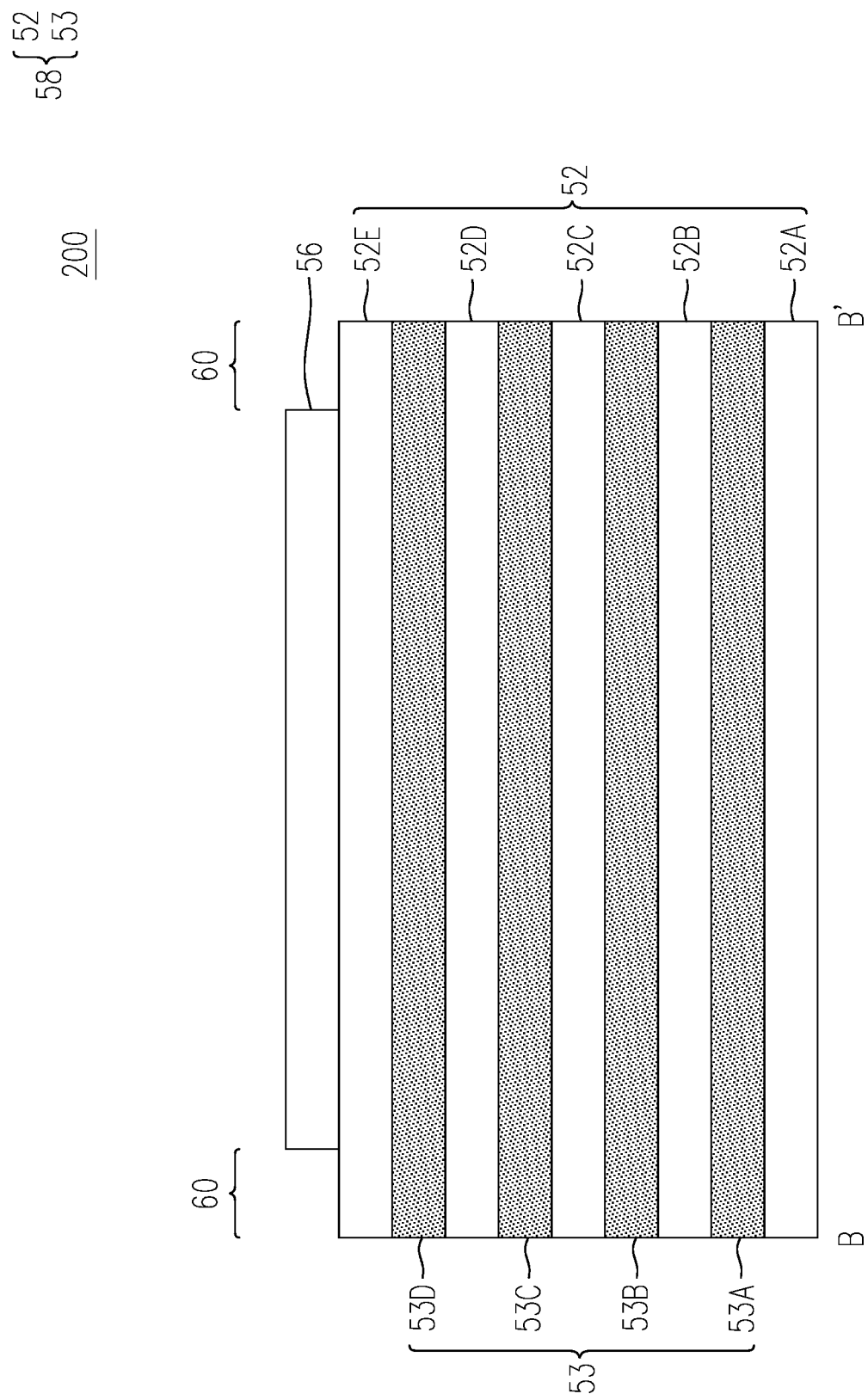

As illustrated in FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:
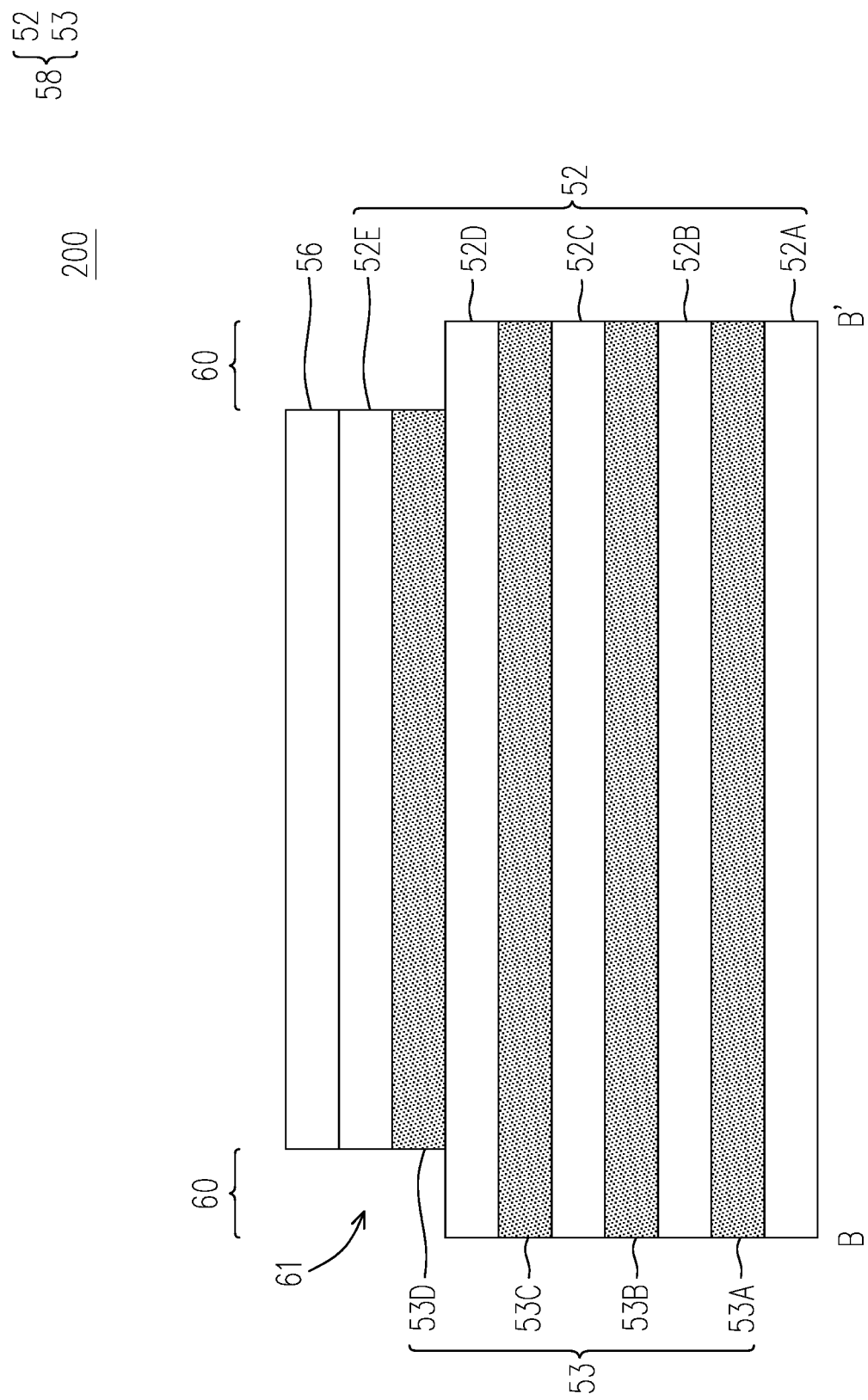

As illustrated in FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
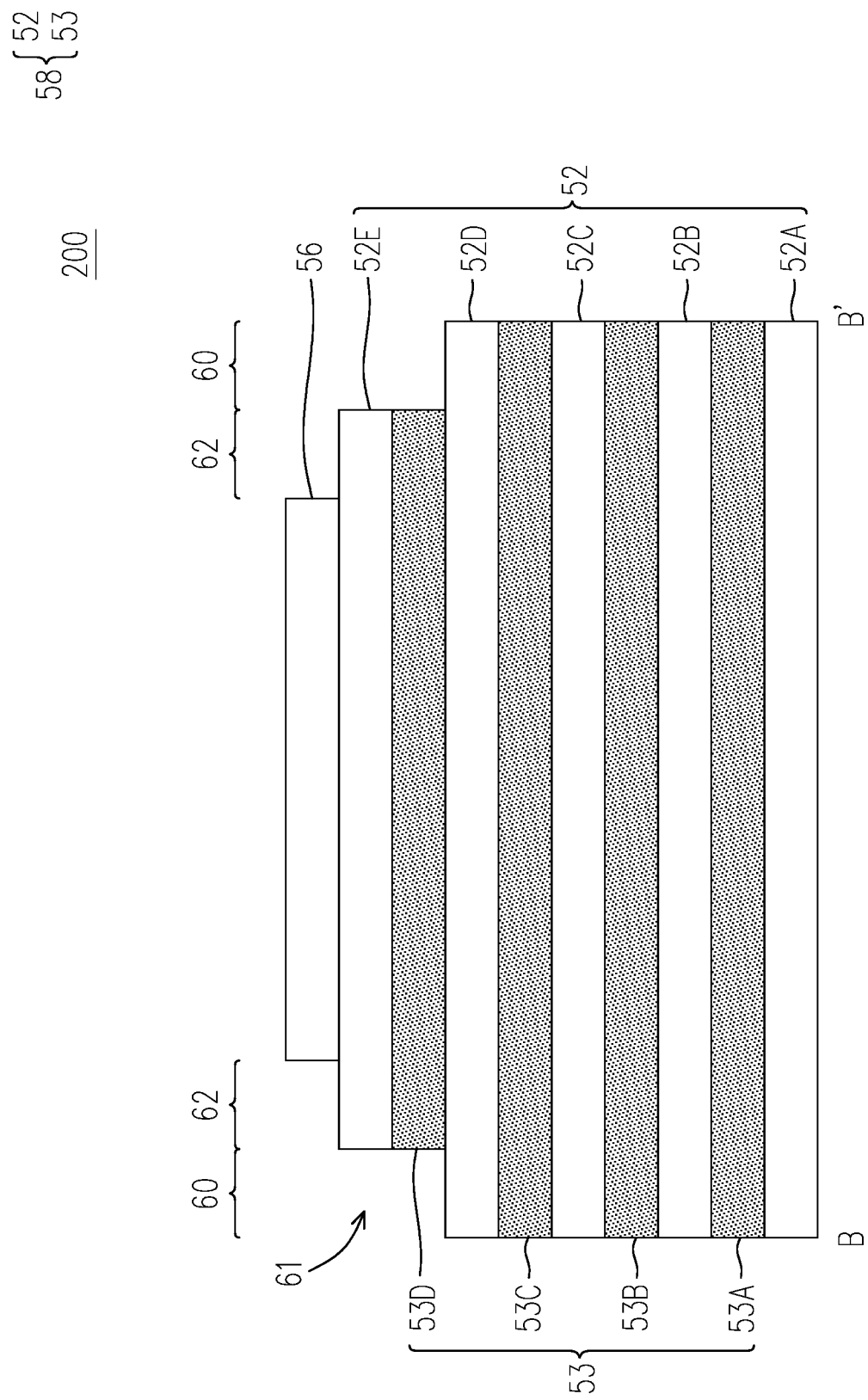

As illustrated in FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
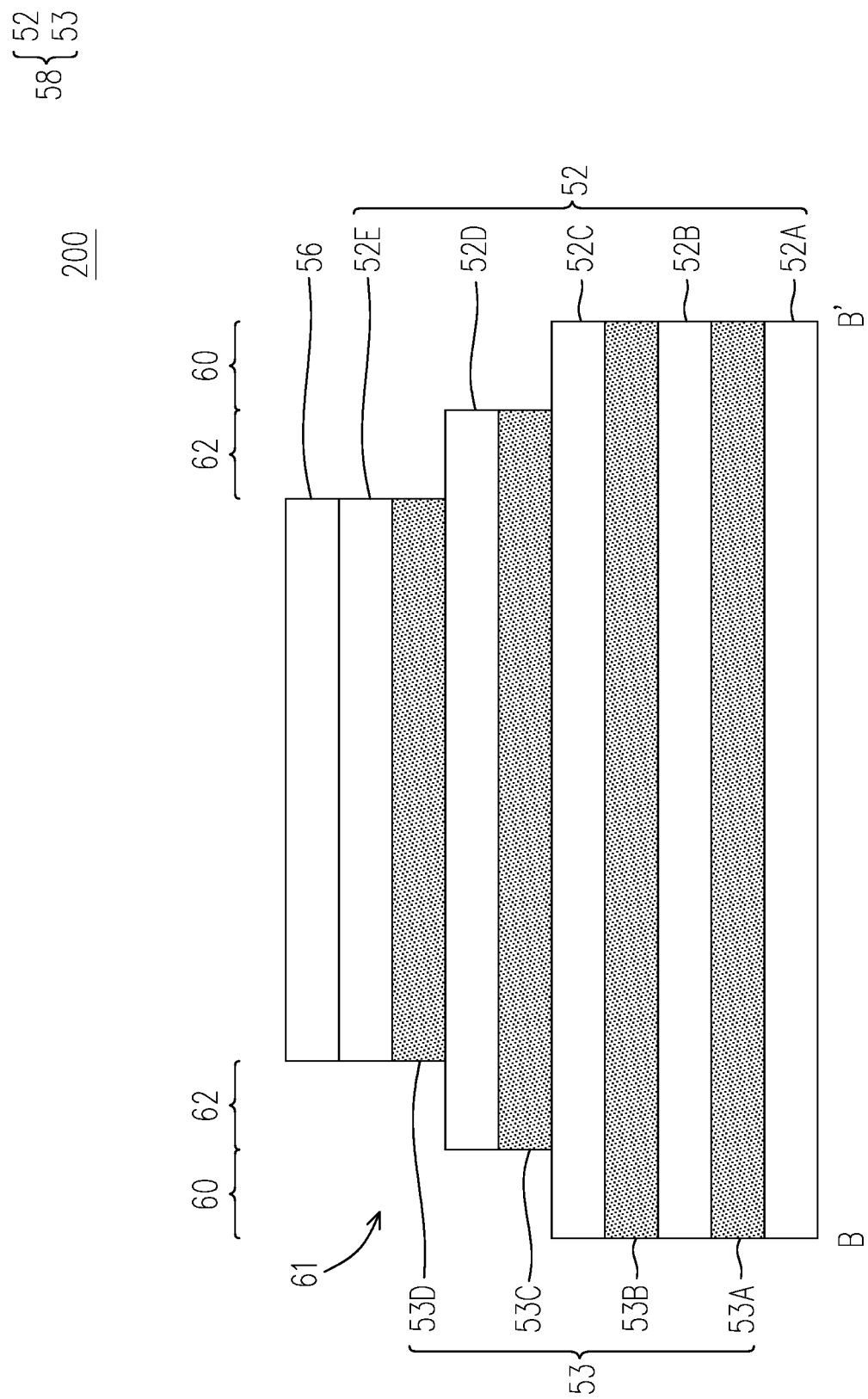

As illustrated in FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
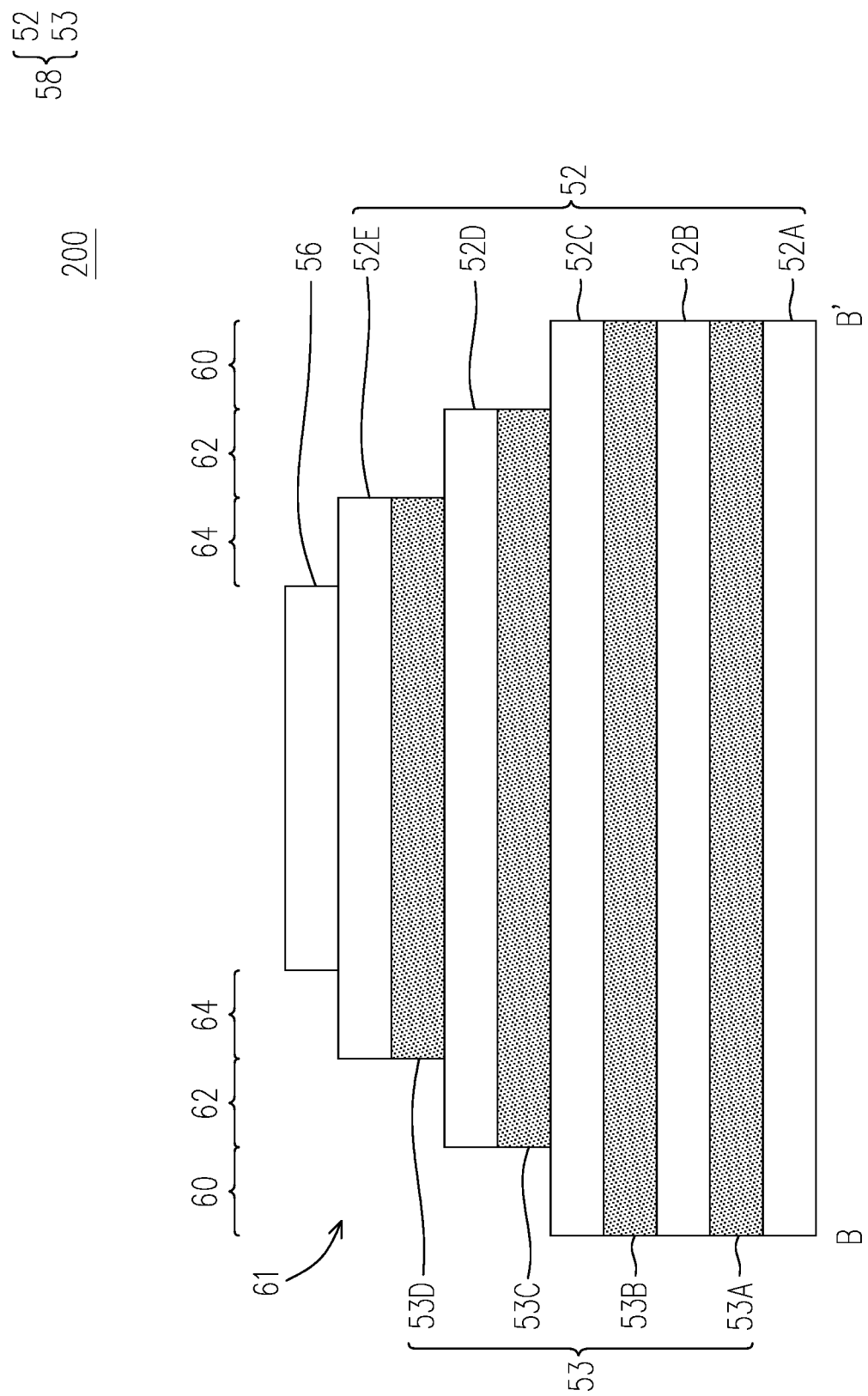

As illustrated in FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
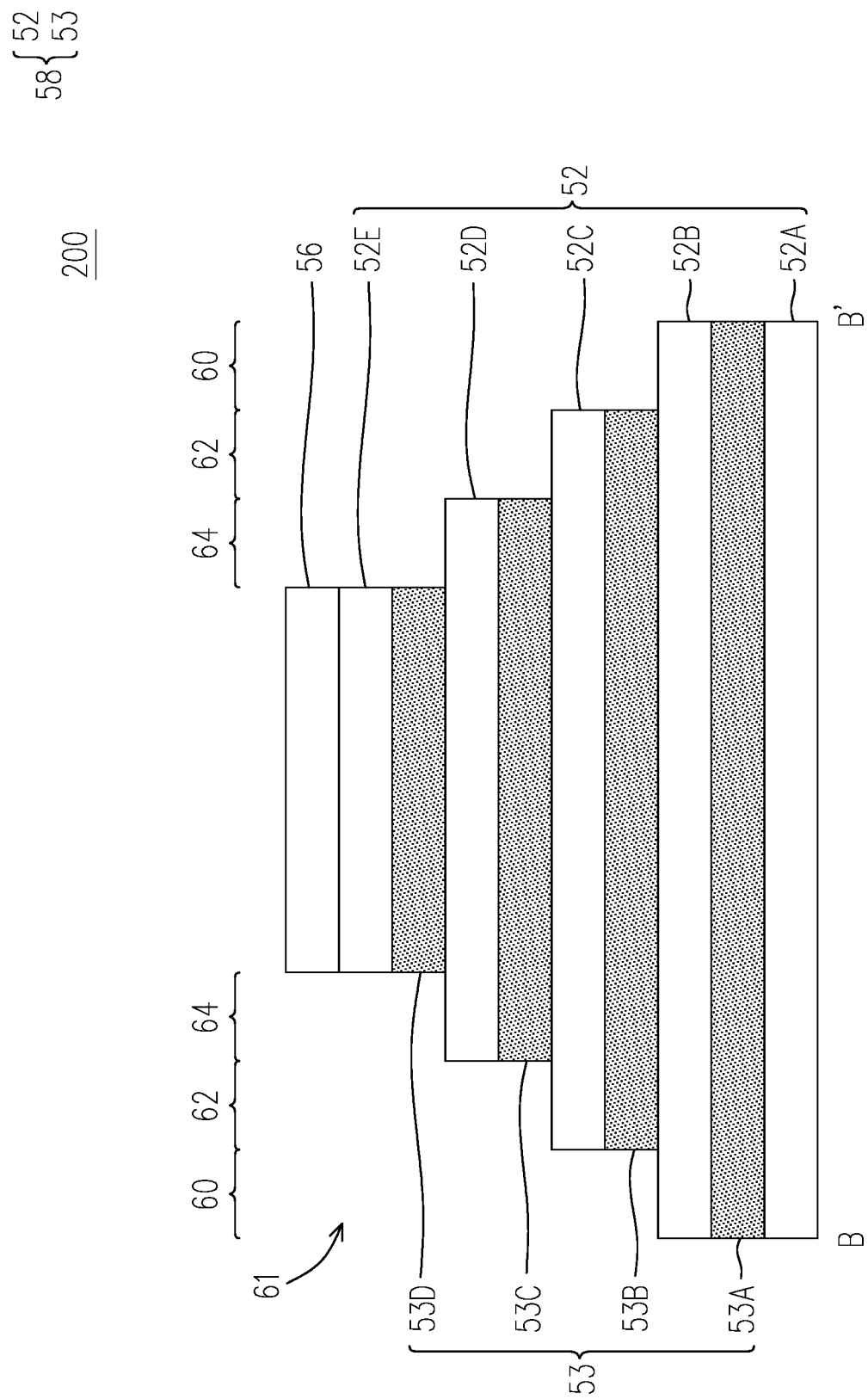

As illustrated in FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
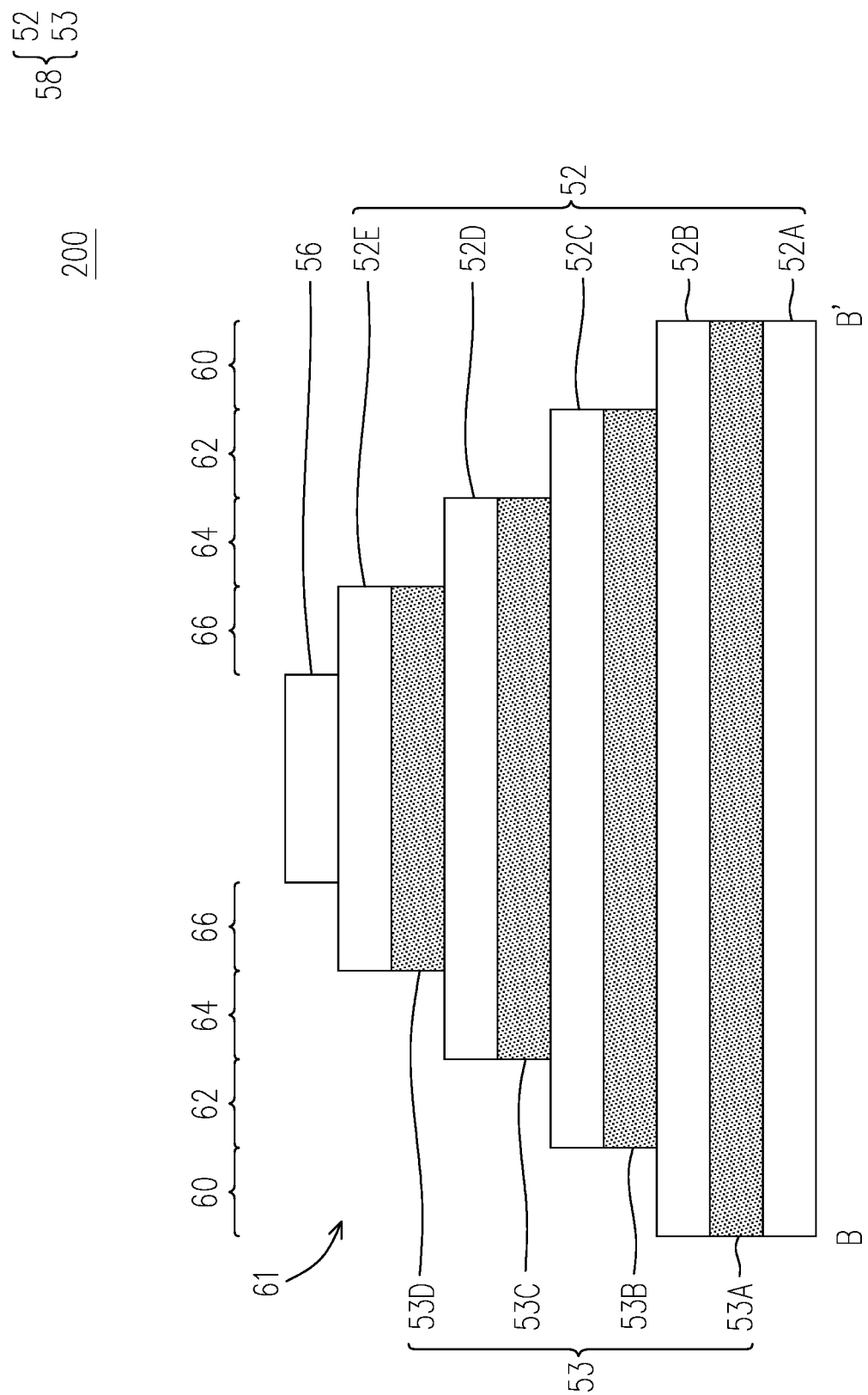

As illustrated in FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:
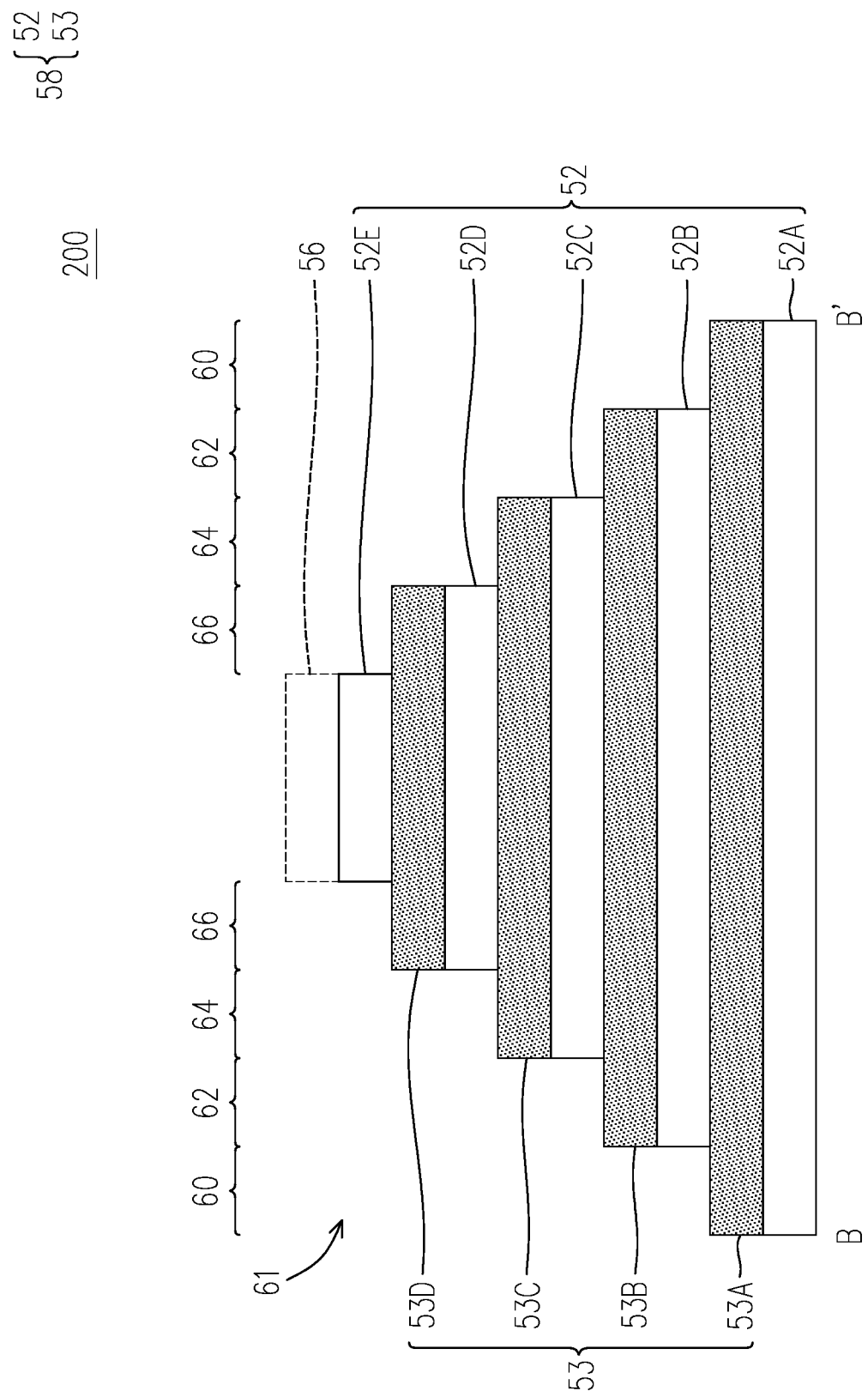
Figure 12A:
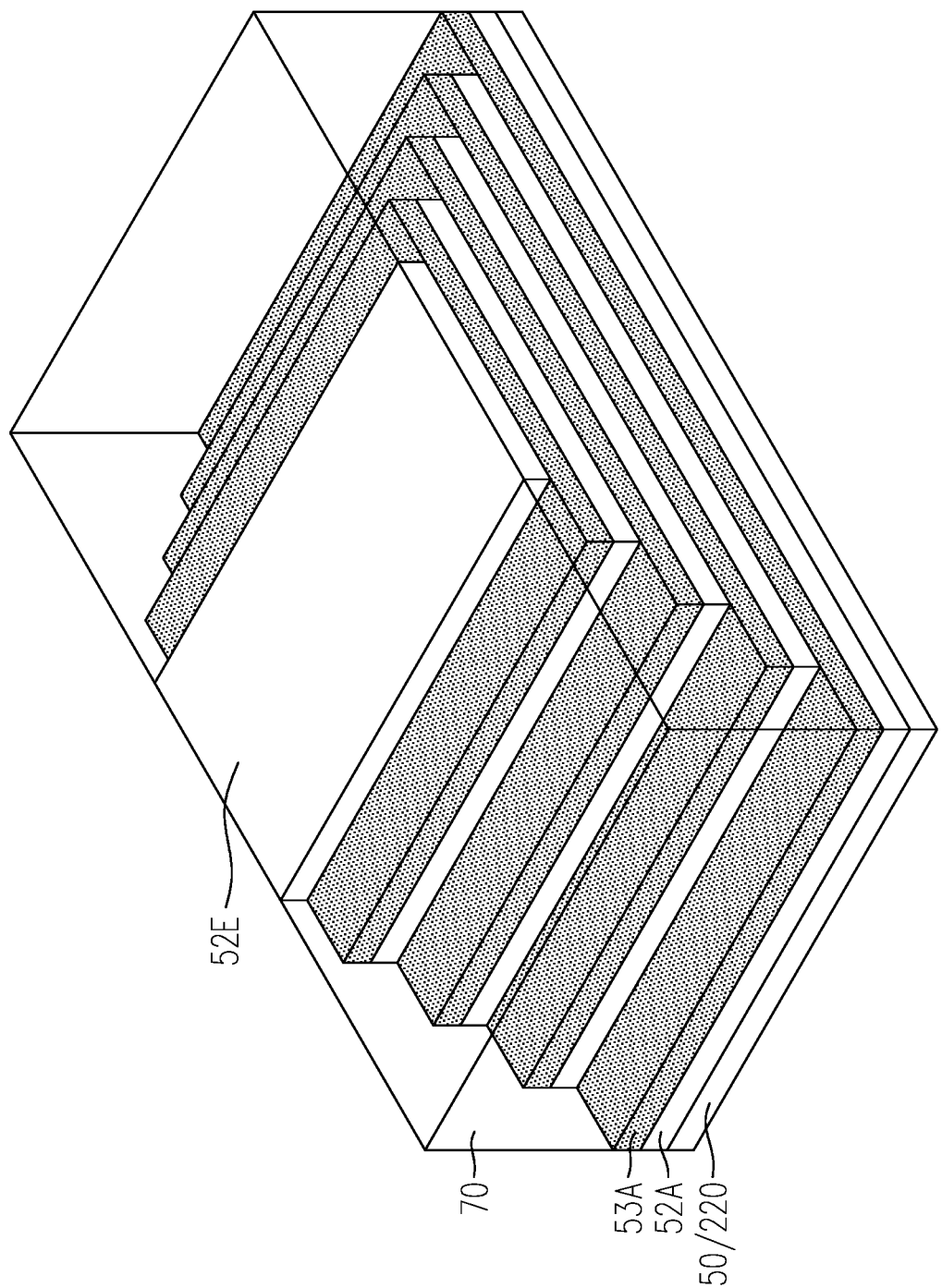

As illustrated in FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12B:
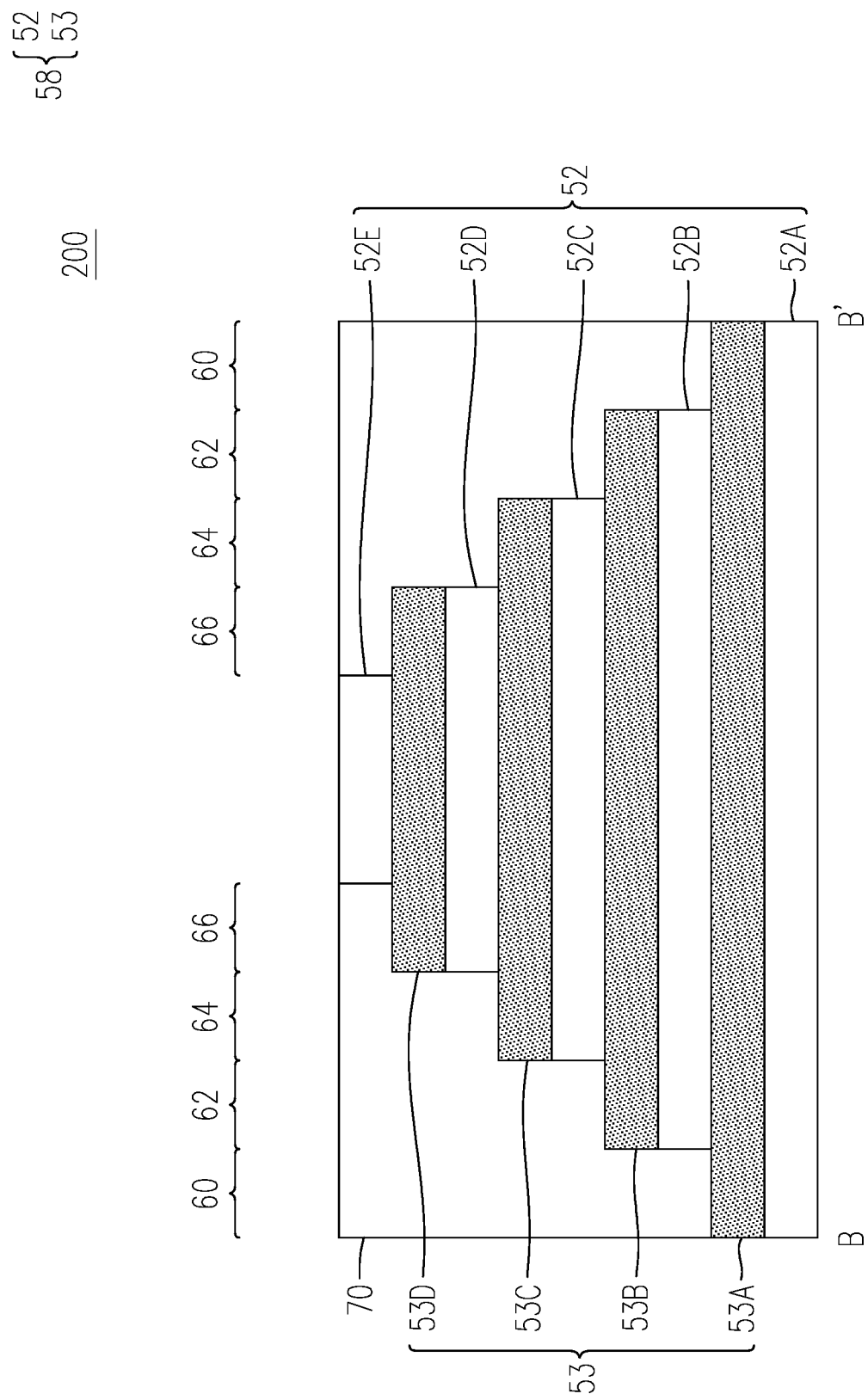

As illustrated in FIGS. 12A and 12B, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are leveled after the planarization process is completed.

As shown in FIGS. 12A and 12B, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIG. 1A).

FIG. 13 through FIG. 16B are various views of intermediate stages in the manufacturing of a memory region of the memory device 200, in accordance with some embodiments of the disclosure. In FIG. 13 through FIG. 16B, the bulk multi-layer stack 58 is patterned to form trenches 86 therethrough, and sacrificial layers 53 are replaced with conductive materials to define the conductive lines 72. The conductive lines 72 may correspond to word lines in the memory device 200, and the conductive lines 72 may further provide gate electrodes for the resulting memory cells of the memory device 200. FIGS. 13, 14, 15B and 16B are illustrated along reference cross-section C-C' illustrated in FIG. 1A. FIGS. 15A and 16A are illustrated in a partial three-dimensional view.

Figure 13:
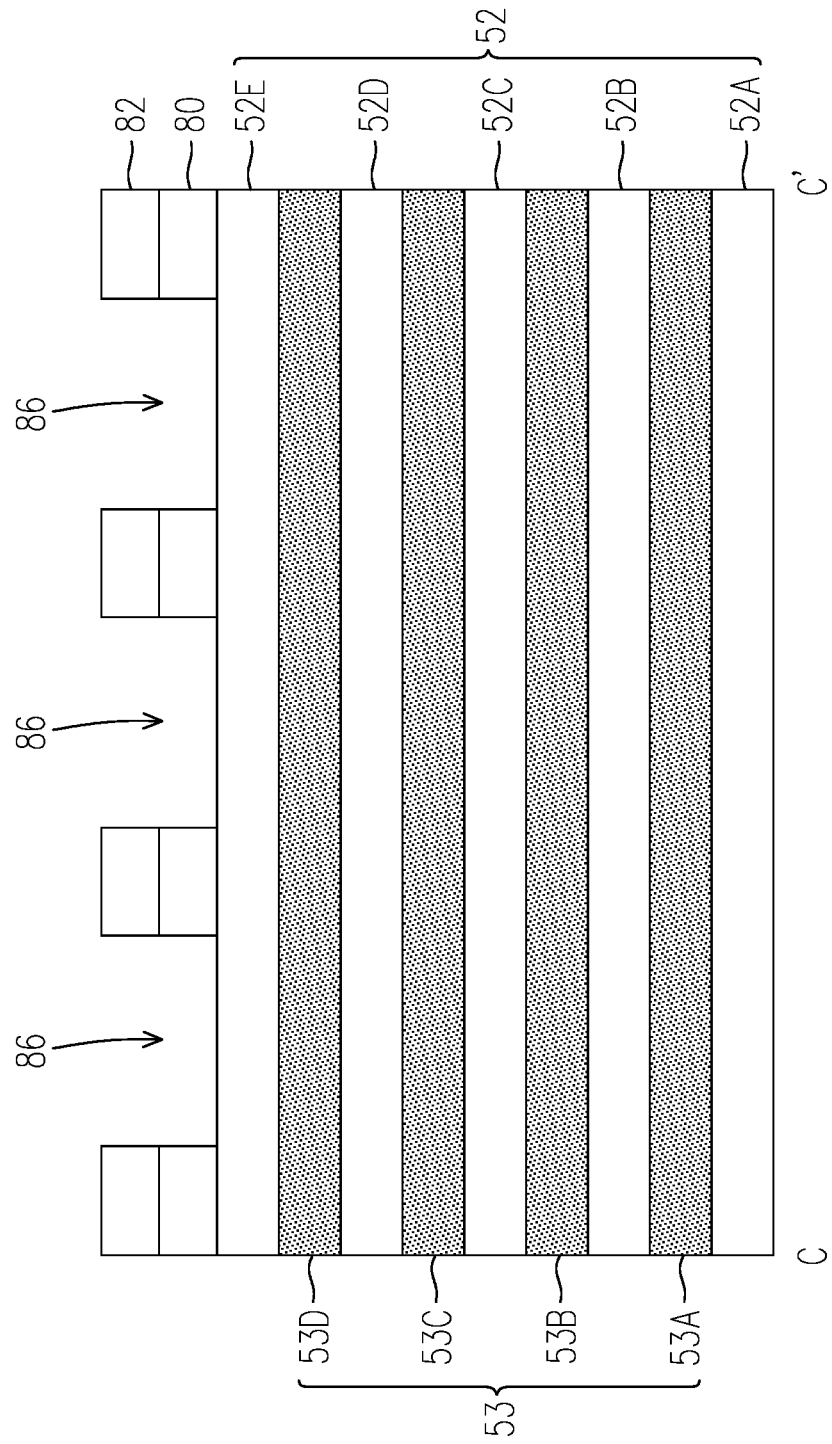

As illustrated in FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layer is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

Figure 14:
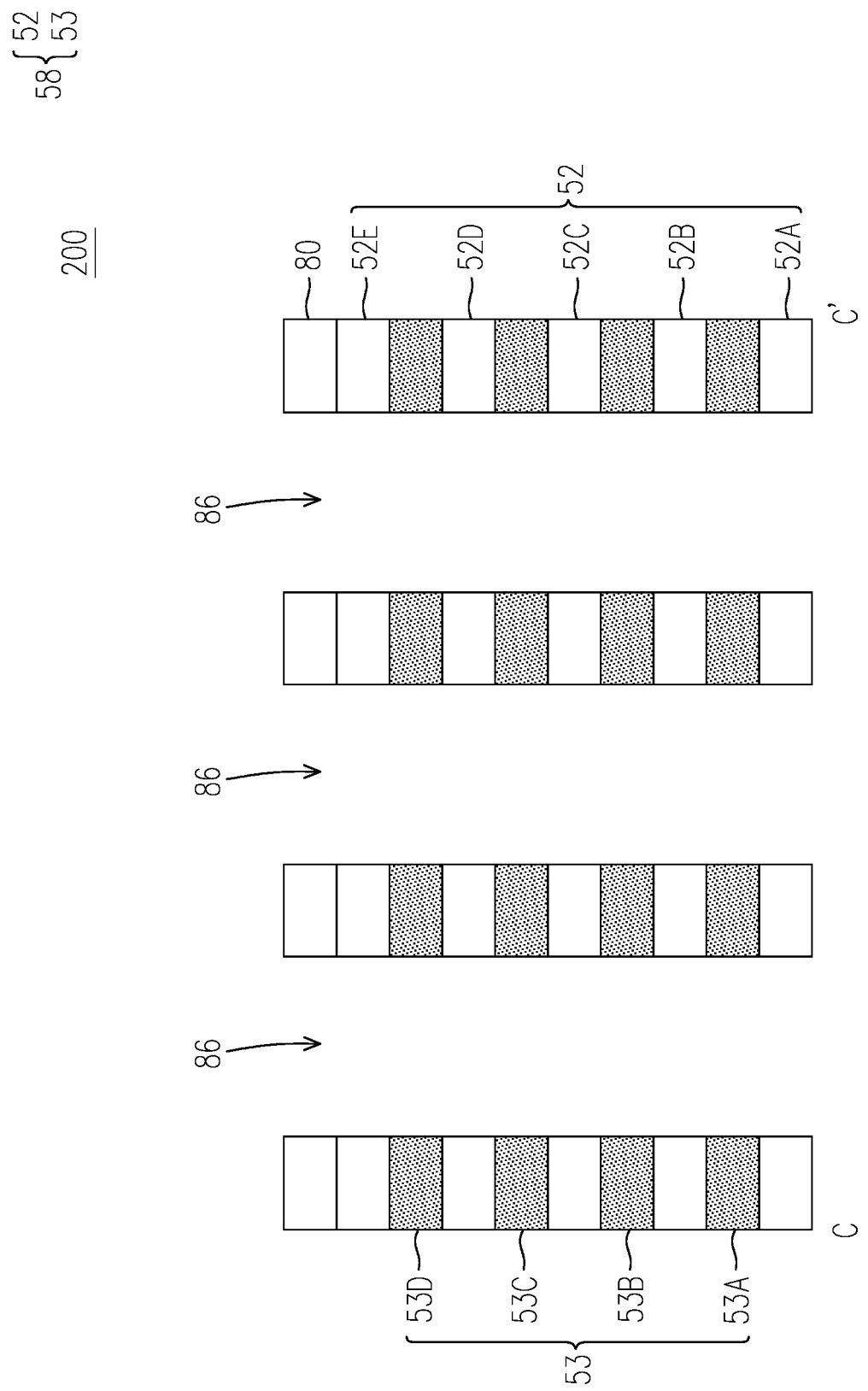
Figure 15B:
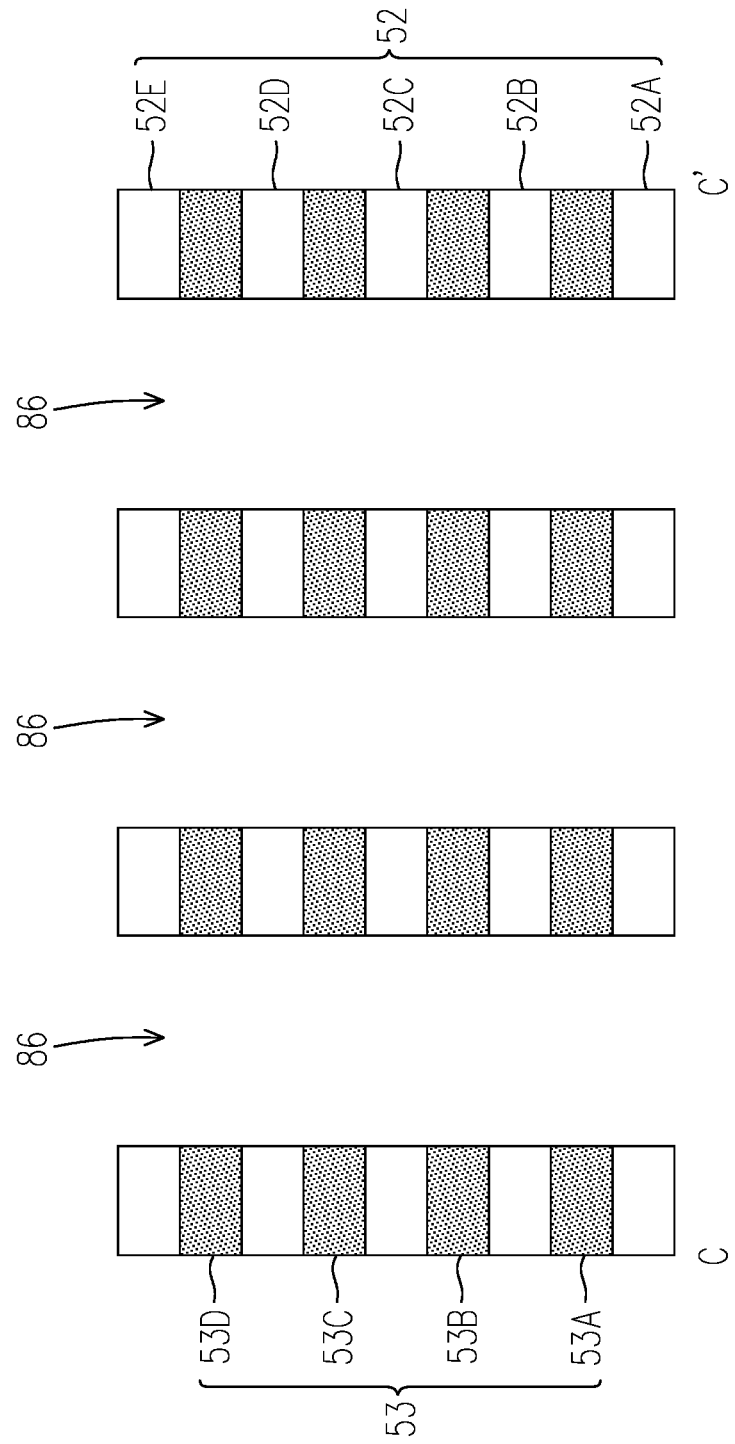

As illustrated in FIGS. 14 to 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

Figure 16A:
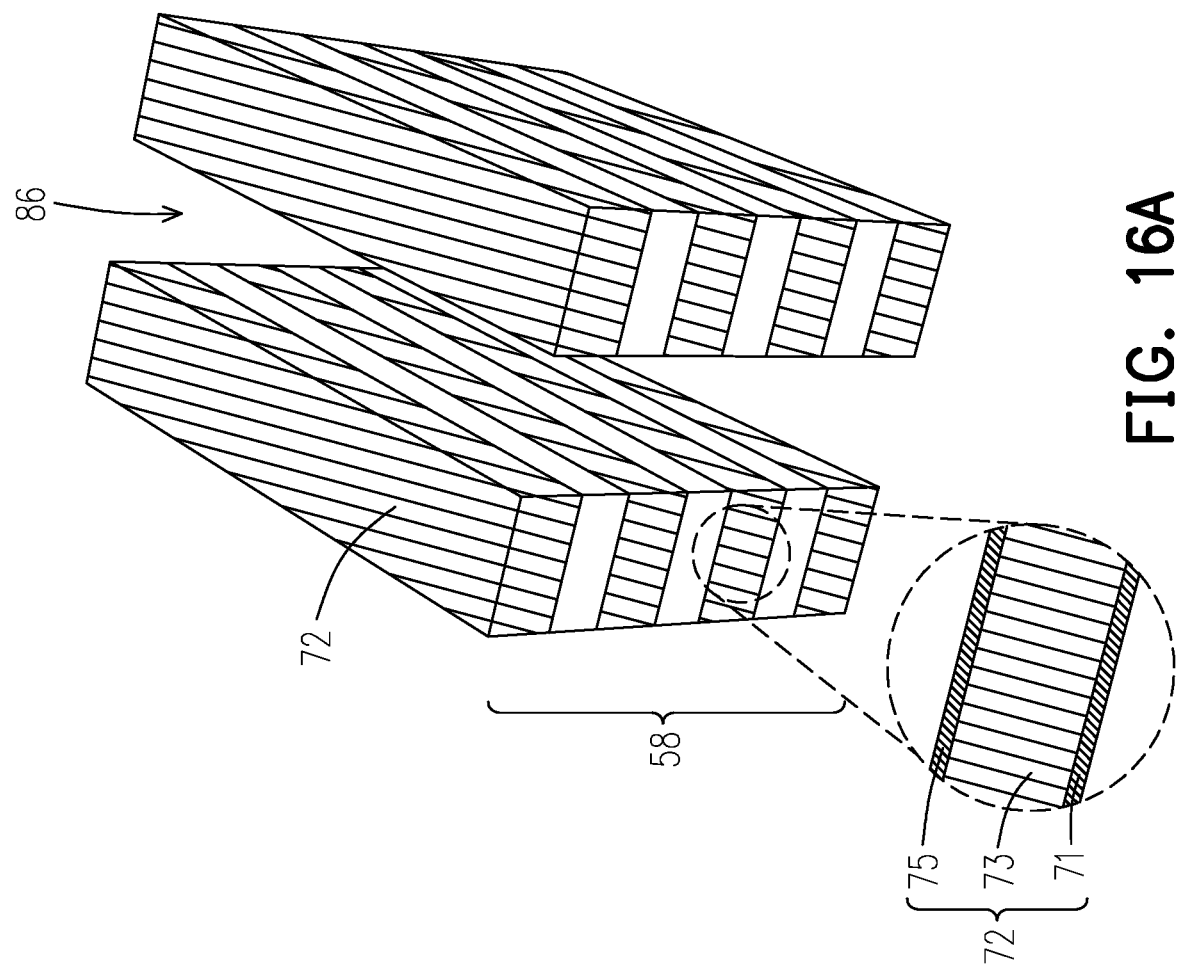
Figure 16B:
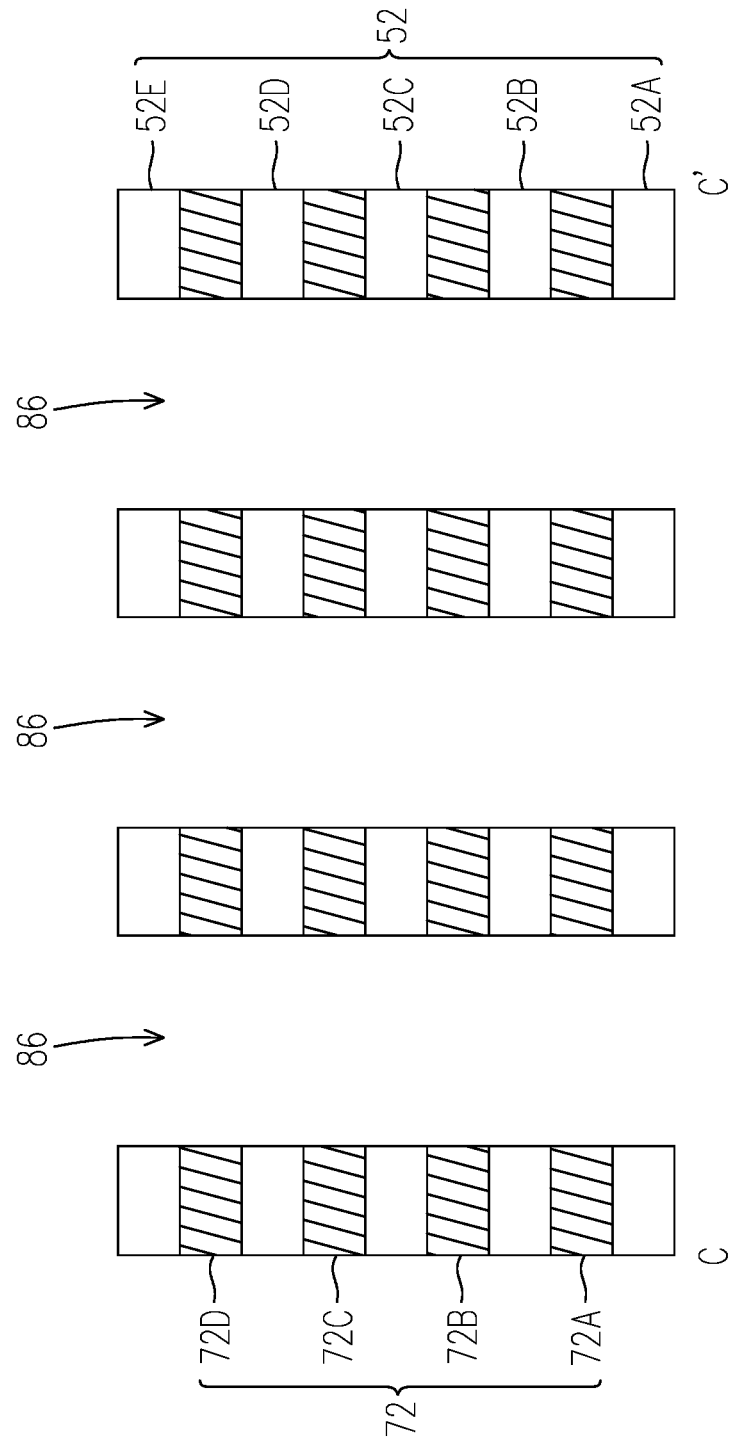

As illustrated in FIGS. 16A and 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the space between two adjacent dielectric layers 52. As shown in the local enlarged view, each conductive line 72 includes two barrier layers 71 and 75 and a metal layer 73 between the barrier layers 71 and 75. In some embodiments, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may are formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 and fill in the trenches 86. Thereafter, the barrier layers 71, 75 and the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

Figure 17A:
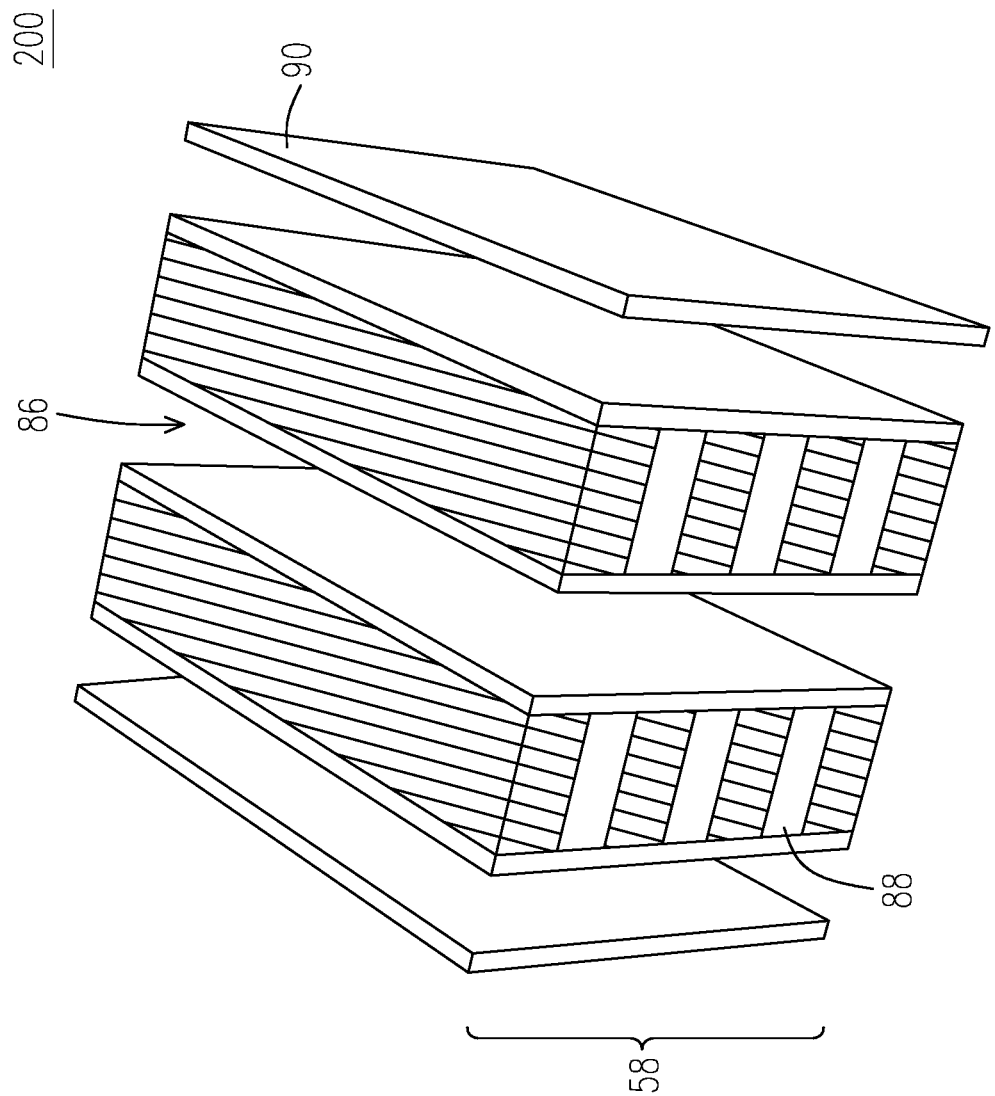

FIG. 17A through FIG. 22B illustrate forming and patterning channel regions for the memory cells 202 (see FIG. 1A) in the trenches 86. FIGS. 17A, 18A and 22A are illustrated in a partial three-dimensional view. In FIGS. 17B, 18B, 19, 20, 21 and 22B cross-sectional views are provided along line C-C' of FIG. 1A. As illustrated in FIG. 17A through FIG. 20, a dielectric layer 90 (ferroelectric layer), a channel layer 92 (oxide semiconductor layer), and a dielectric material 98A are deposited in the trenches 86.

Figure 17B:
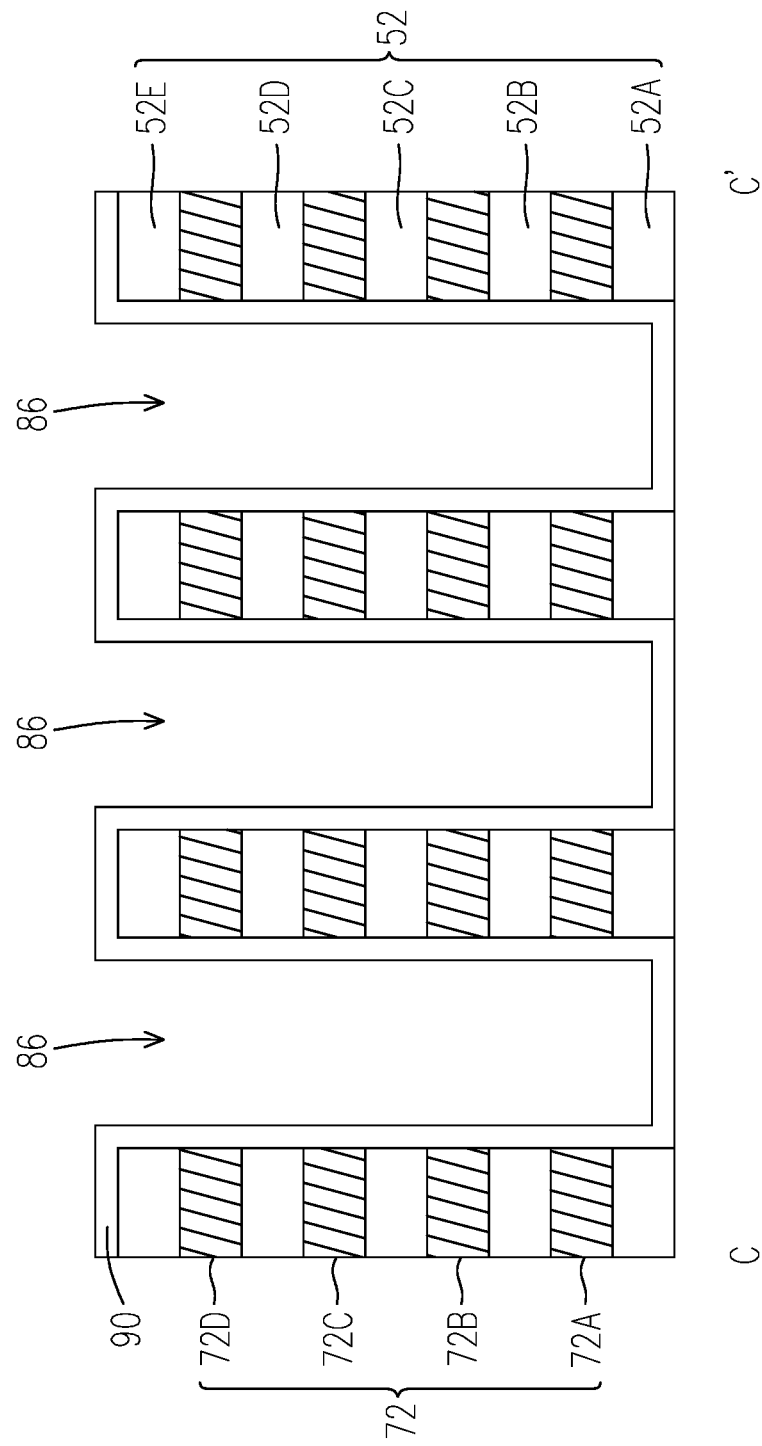

As illustrated in FIG. 17A and FIG. 17B, a dielectric layer 90 (or ferroelectric layer) may be deposited conformally in the trenches 86 along sidewalls of the conductive lines 72, sidewalls of the dielectric layers 52, over top surfaces of the dielectric layer 52E and along the bottom surfaces of the trenches 86. In some embodiments, a dielectric layer 90 (or ferroelectric layer) may be further deposited on the IMD 70 and along the sidewall of each step of the staircase structure in the staircase region. The dielectric layer 90 (or ferroelectric layer) may include materials that are capable of switching between two different polarization directions by applying an appropriate voltage differential across the dielectric layer 90. For example, the dielectric layer 90 includes a high-k dielectric material, such as a hafnium (Hf) based dielectric materials or the like. In some embodiments, the dielectric layer 90 includes hafnium oxide, hafnium zirconium oxide, silicon-doped hafnium oxide, or the like.

In some other embodiments, the dielectric layer 90 may include barium titanium oxide (BaTiO$_3$), lead titanium oxide (PbTiO$_3$), lead zirconium oxide (PbZrO$_3$), lithium niobium oxide (LiNbO$_3$), sodium niobium oxide (NaNbO$_3$), potassium niobium oxide (KNbO$_3$), potassium tantalum oxide (KTaO$_3$), bismuth scandium oxide (BiScO$_3$), bismuth iron oxide (BiFeO$_3$), hafnium erbium oxide (Hf$_{1-x}$Er$_x$O), hafnium lanthanum oxide (Hf$_{1-x}$La$_x$O), hafnium yttrium oxide (Hf$_{1-x}$Y$_x$O), hafnium gadolinium oxide (Hf$_{1-x}$Gd$_x$O), hafnium aluminum oxide (Hf$_{1-x}$Al$_x$O), hafnium zirconium oxide (Hf$_{1-x}$Zr$_x$O, HZO), hafnium titanium oxide (Hf$_{1-x}$Ti$_x$O), hafnium tantalum oxide (Hf$_{1-x}$Ta$_x$O), or the like. In some embodiments, the dielectric layer 90 may include different ferroelectric materials or different types of memory materials. For example, in some embodiments, the dielectric layer 90 is a non-ferroelectric material, such as a multilayer memory structure including a layer of SiN$_x$ between two SiO$_x$ layers (e.g., an ONO structure). In some embodiments, the method of forming the dielectric layer 90 includes performing a suitable deposition technique, such as CVD, PECVD, metal oxide chemical vapor deposition (MOCVD), ALD, RPALD, PEALD, MBD or the like.

In some embodiments, the dielectric layer 90 has a thickness of about 1-20 nm, such as 5-10 nm. Other thickness ranges (e.g., more than 20 nm or 5-15 nm) may be applicable. In some embodiments, the dielectric layer 90 is formed in a fully amorphous state. In alternative embodiments, the dielectric layer 90 is formed in a partially crystalline state; that is, the dielectric layer 90 is formed in a mixed crystalline-amorphous state and having some degree of structural order. In yet alternative embodiments, the dielectric layer 90 is formed in a fully crystalline state. In some embodiments, the dielectric layer 90 is a single layer. In alternative embodiments, the dielectric layer 90 is a multi-layer structure.

In some embodiments, an annealing process is performed to the dielectric layer 90. In some embodiments, upon the annealing process, the dielectric layer 90 is transformed from an amorphous state to a partially or fully crystalline state. In alternative embodiments, upon the annealing process, the dielectric layer 90 is transformed from a partially crystalline state to a fully crystalline state.

Figure 18A:
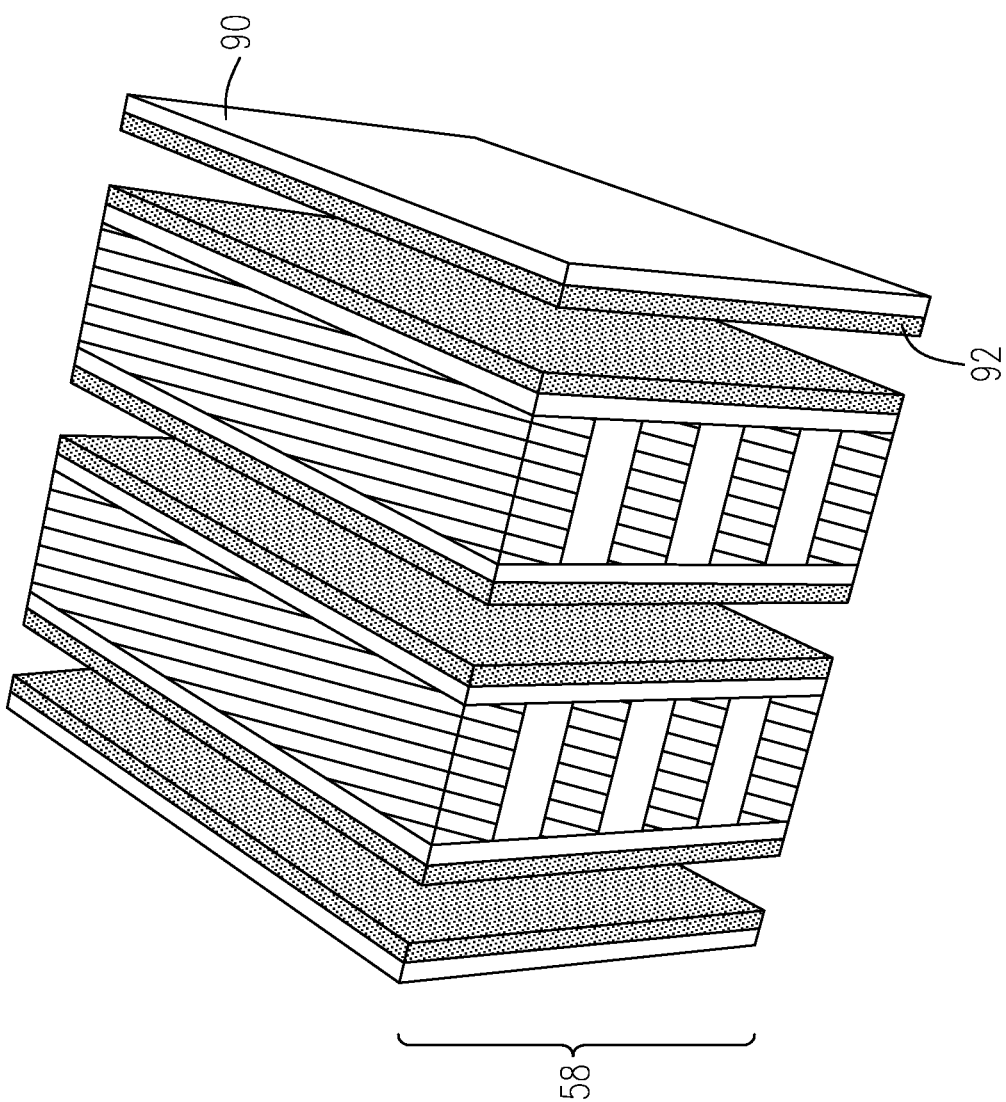
Figure 18B:
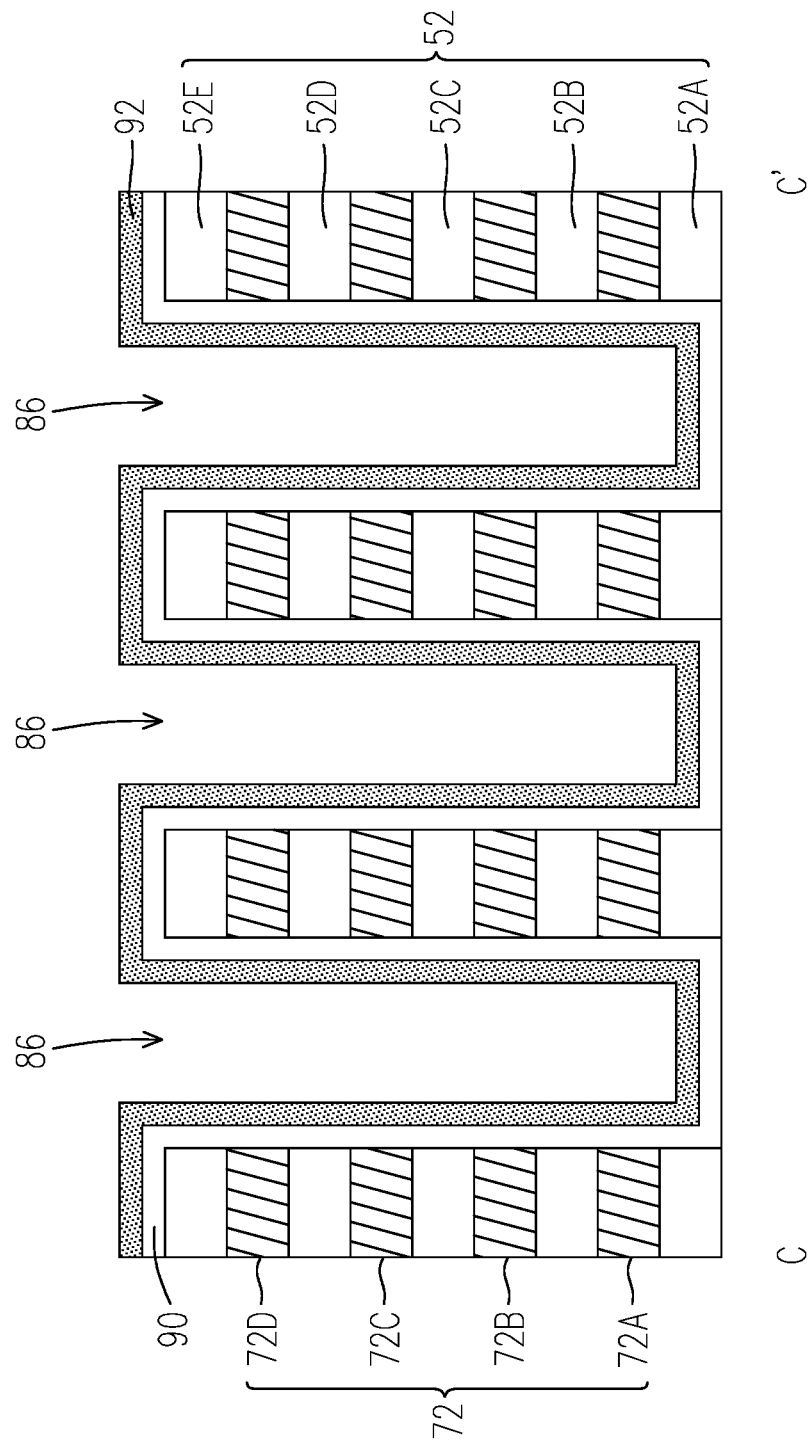

As illustrated in FIG. 18A and FIG. 18B, a channel layer 92 is conformally deposited in the trenches 86 over the dielectric layer 90. In some embodiments, the channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. The channel layer 92 may be deposited by CVD, PVD, ALD, PECVD, or the like. The channel layer 92 may extend along sidewalls and bottom surfaces of the trenches 86 over the ferroelectric layer 90. In some embodiments, the channel layer 92 may be further deposited on the IMD 70 and along the sidewall of each step of the staircase structure in the staircase region.

Figure 19:
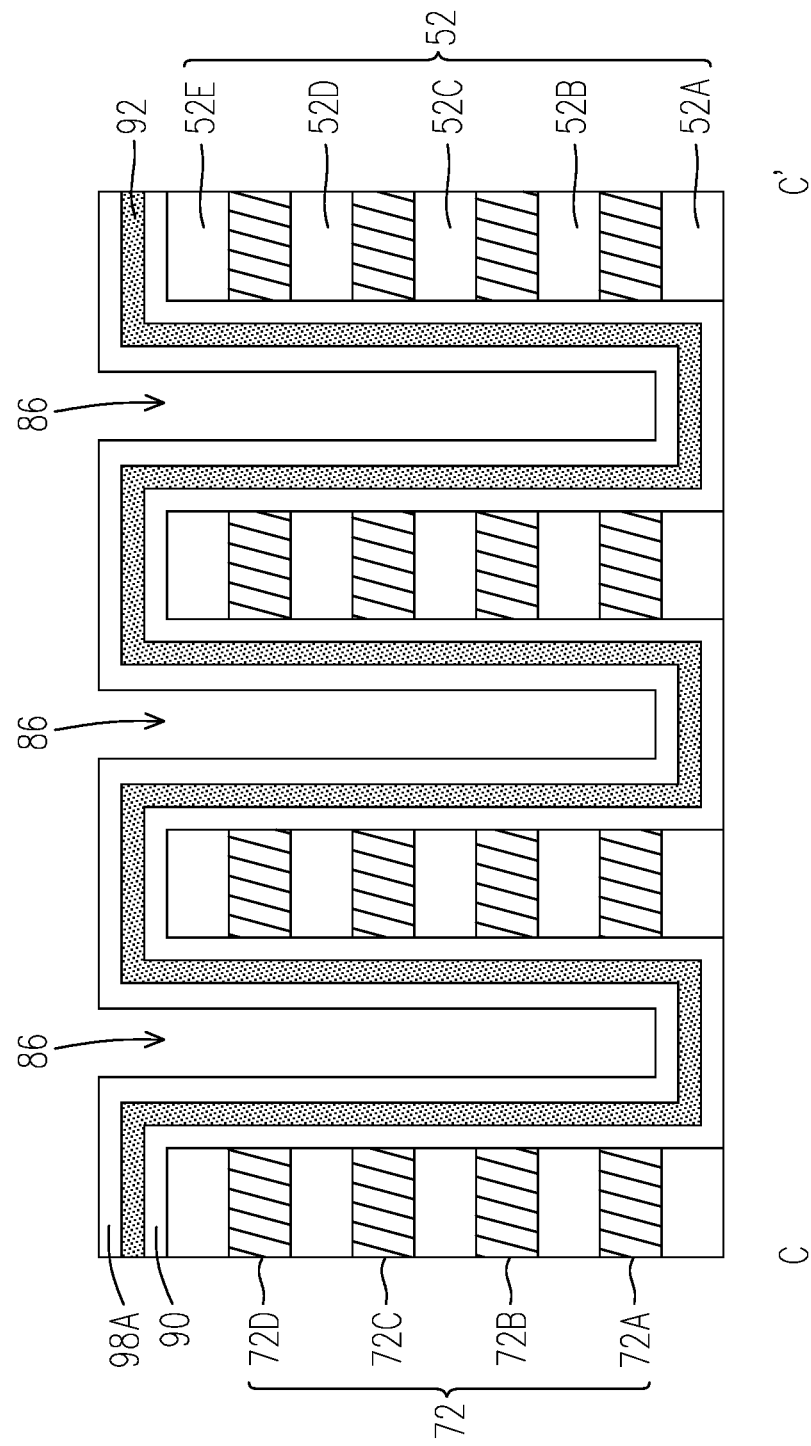

As illustrated in FIG. 19, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In certain embodiments, the dielectric material 98A are patterned to form dielectric pillars 98A in the subsequent steps.

Figure 20:
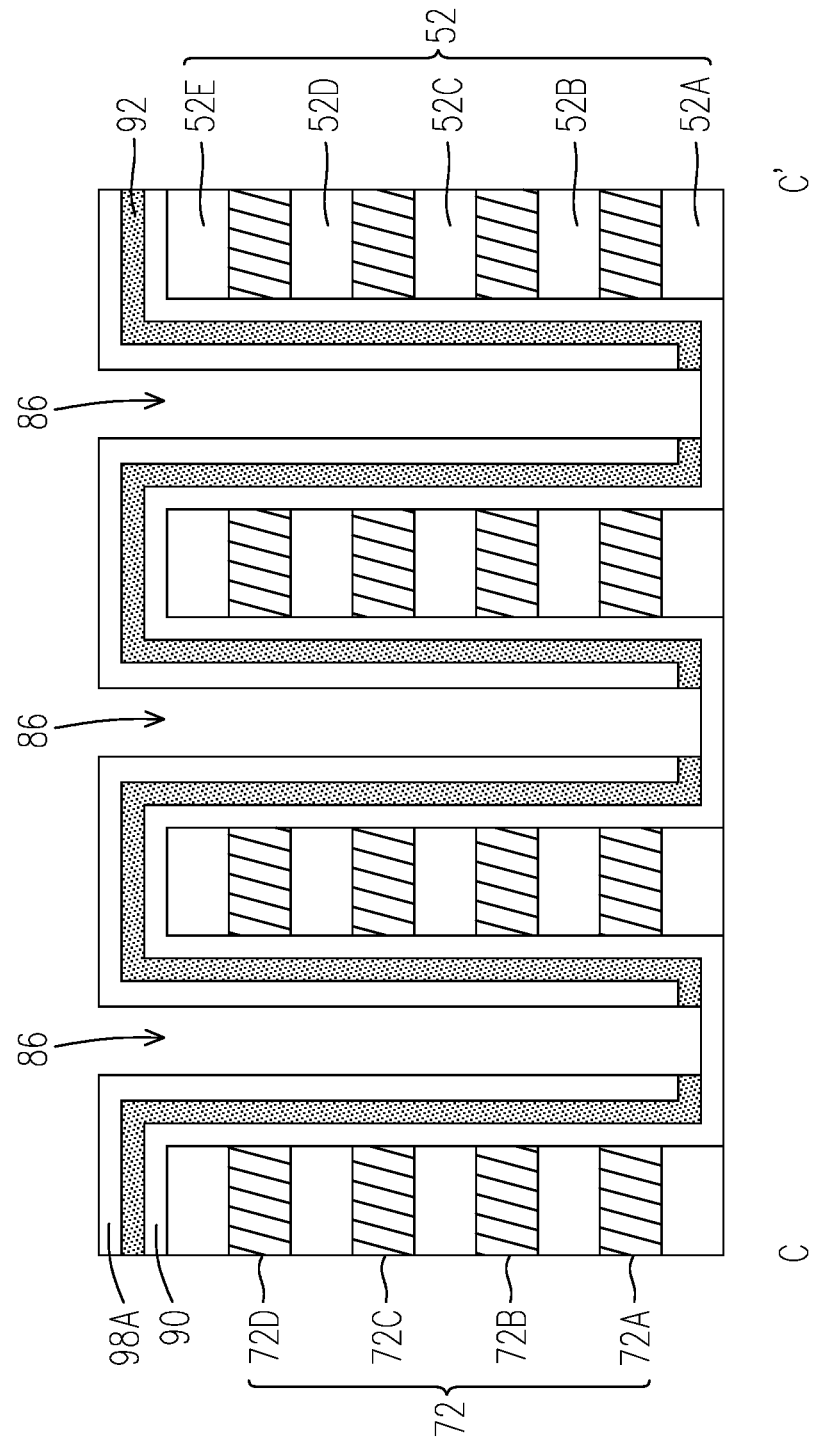

As illustrated in FIG. 20, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. Accordingly, the remaining dielectric material 98A and the channel layer 92 may expose portions of the dielectric layer 90 on bottom surfaces of the trenches 86. Thus, portions of the channel layer 92 on opposing sidewalls of the trenches 86 may be separated from each other, which improves isolation between the memory cells 202 of the memory device 200 (see FIG. 1A).

Figure 21:
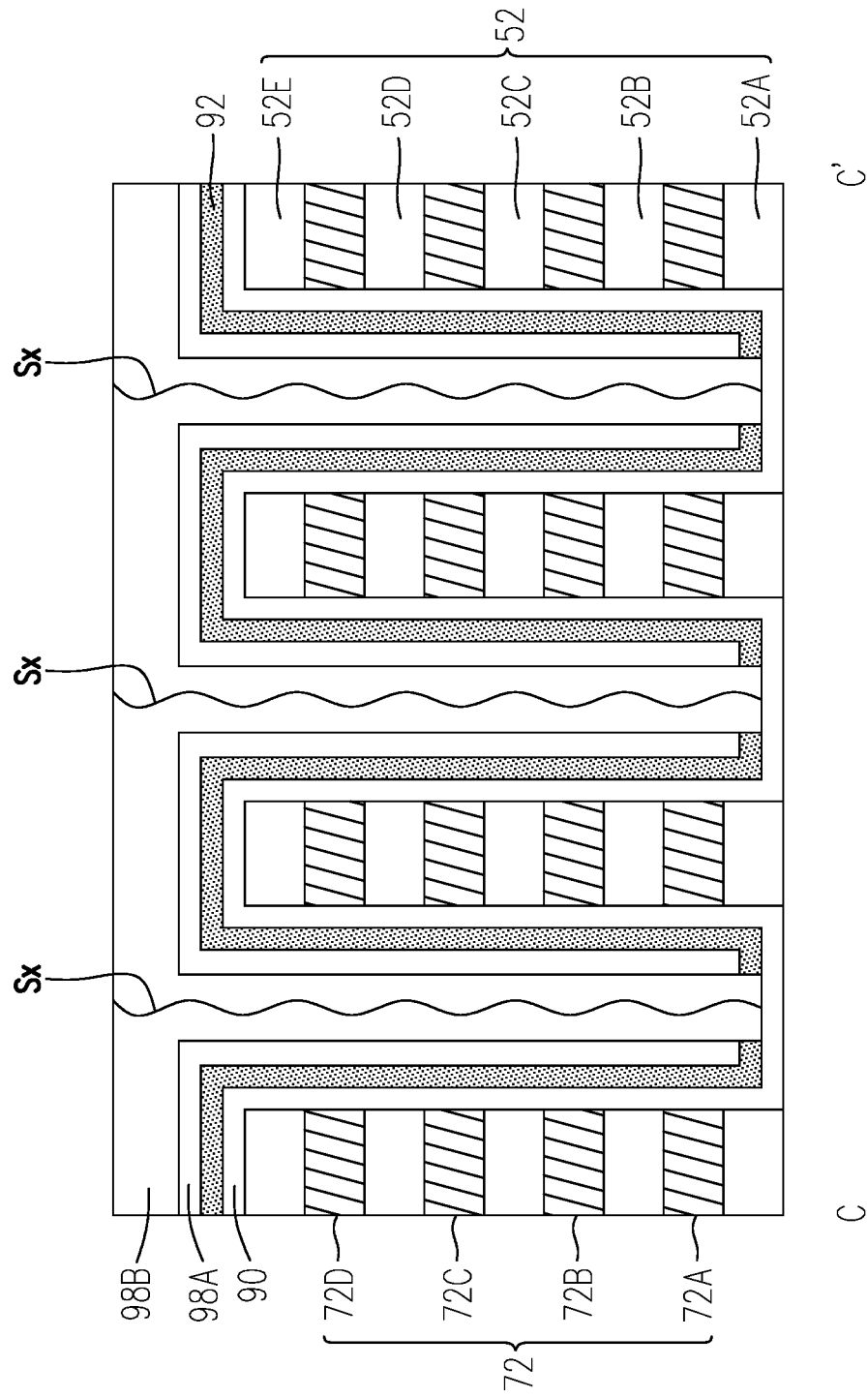

As illustrated in FIG. 21, a dielectric material 98B is deposited to completely fill the trenches 86. The dielectric material 98B may be formed of one or more materials and by processes the same as or similar to those of the dielectric material 98A. In some alternative embodiments, the dielectric material 98B and the dielectric material 98A include different materials. Due to the high aspect ratio of the trenches 86, the dielectric material 98B filled into each of the trenches 86 include seams Sx extending over a center of the dielectric material 98B.

Figure 22A:
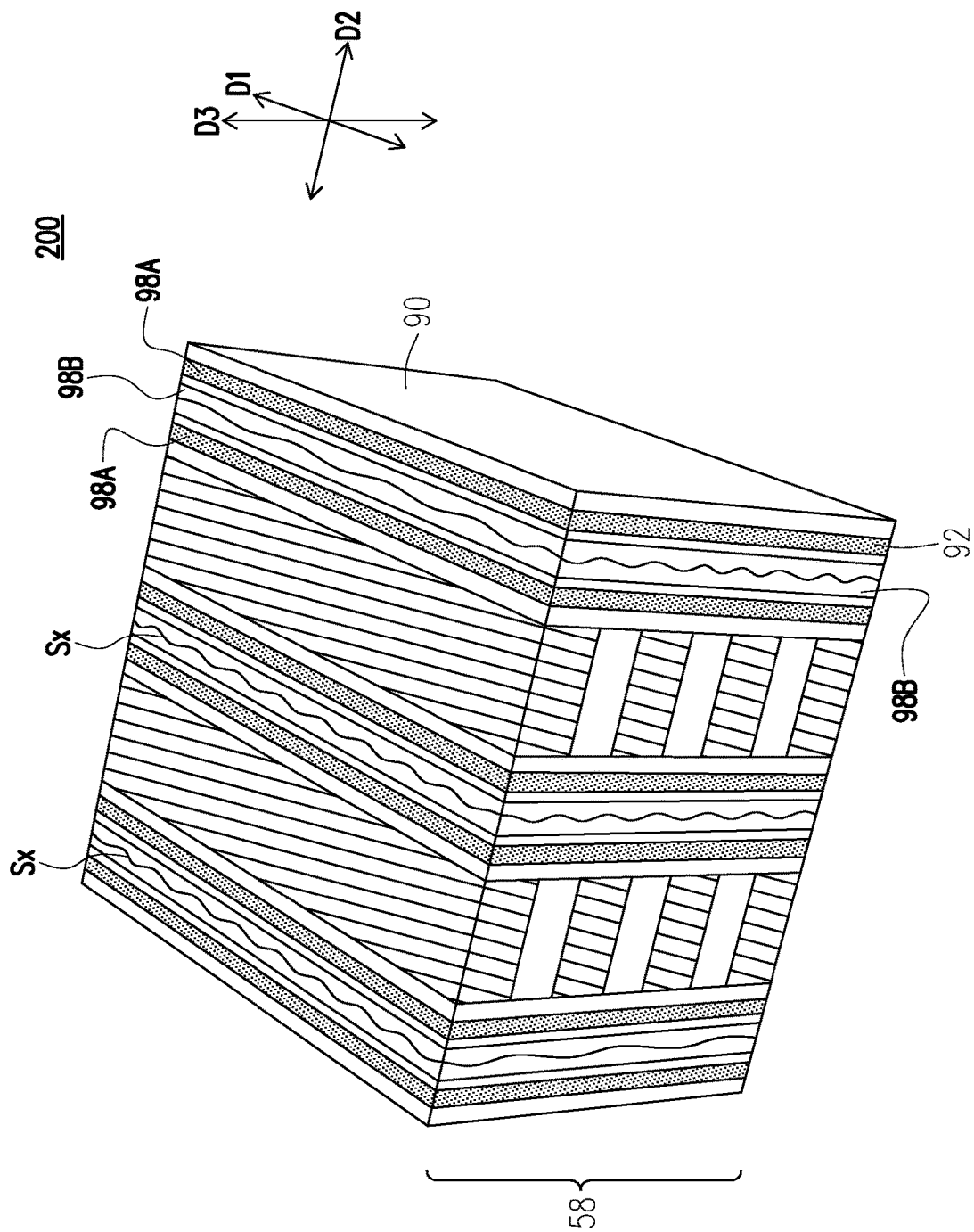
Figure 22B:
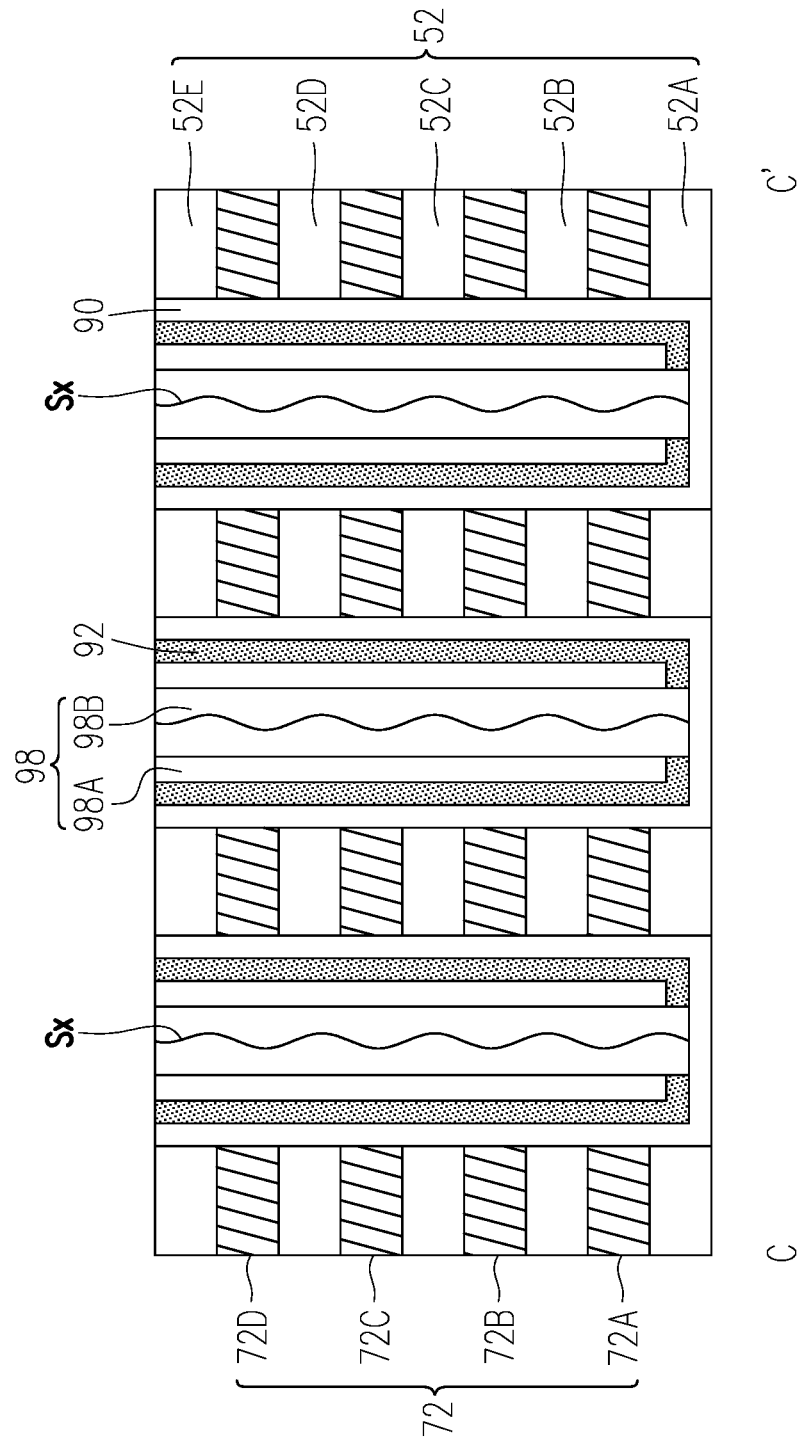

As illustrated in FIG. 22A and FIG. 22B, a removal process is applied to the dielectric materials 98A/98B, the channel layer 92, and the dielectric layer 90 to remove excess materials over the multi-layer stack 58. In some embodiments, a planarization process such as a CMP, an etch-back process, combinations thereof, or the like may be utilized. In some embodiments, the planarization process exposes the multi-layer stack 58 such that top surfaces of the multi-layer stack 58 (e.g., the dielectric layer 52E), the dielectric layer 90, the channel layer 92, the dielectric materials 98A/98B, and the IMD 70 (in the staircase region) are leveled after the planarization process is completed.

FIG. 23A through FIG. 29C illustrate intermediate steps of manufacturing conductive pillars 106 and 108 (e.g., source/drain pillars) in the memory device 200. The conductive pillars 106 and 108 may extend along a direction perpendicular to the conductive lines 72 such that individual cells of the memory device 200 may be selected for read and write operations. FIGS. 23A, 24A, 25A, 26A, 27A, 28A and 29A are illustrated in a partial three-dimensional view. In FIGS. 23B, 24B, 25B, 26B, and 27B cross-sectional views are provided along line C-C' of FIG. 1A. In FIGS. 28B and 29B, cross-sectional views are provided along line D-D' of FIG. 1A. Furthermore, FIGS. 25C, 26C, 27C, 28C and 29C illustrate top-down views of region RG1 shown in FIG. 25A.

Figure 23A:
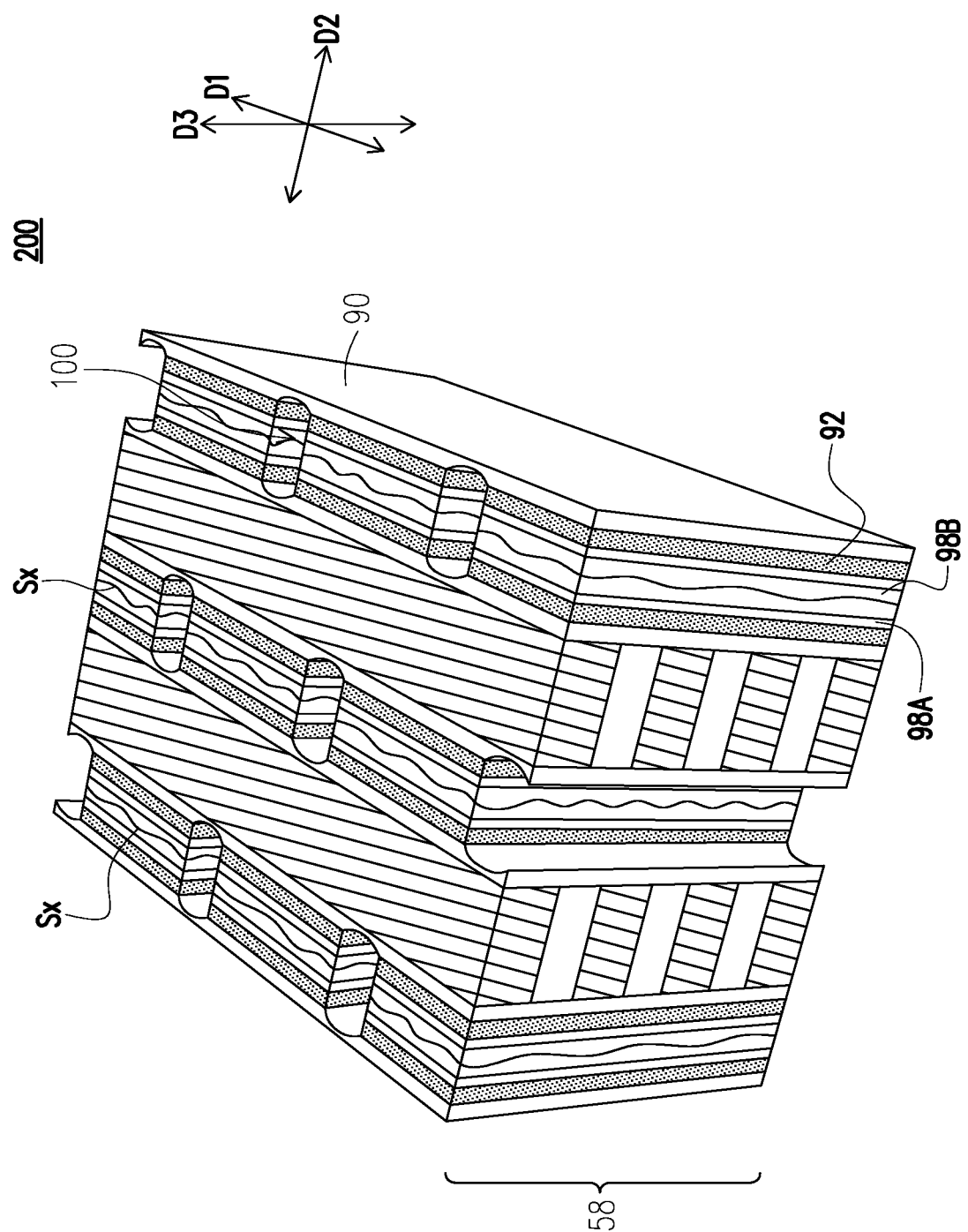
Figure 23B:
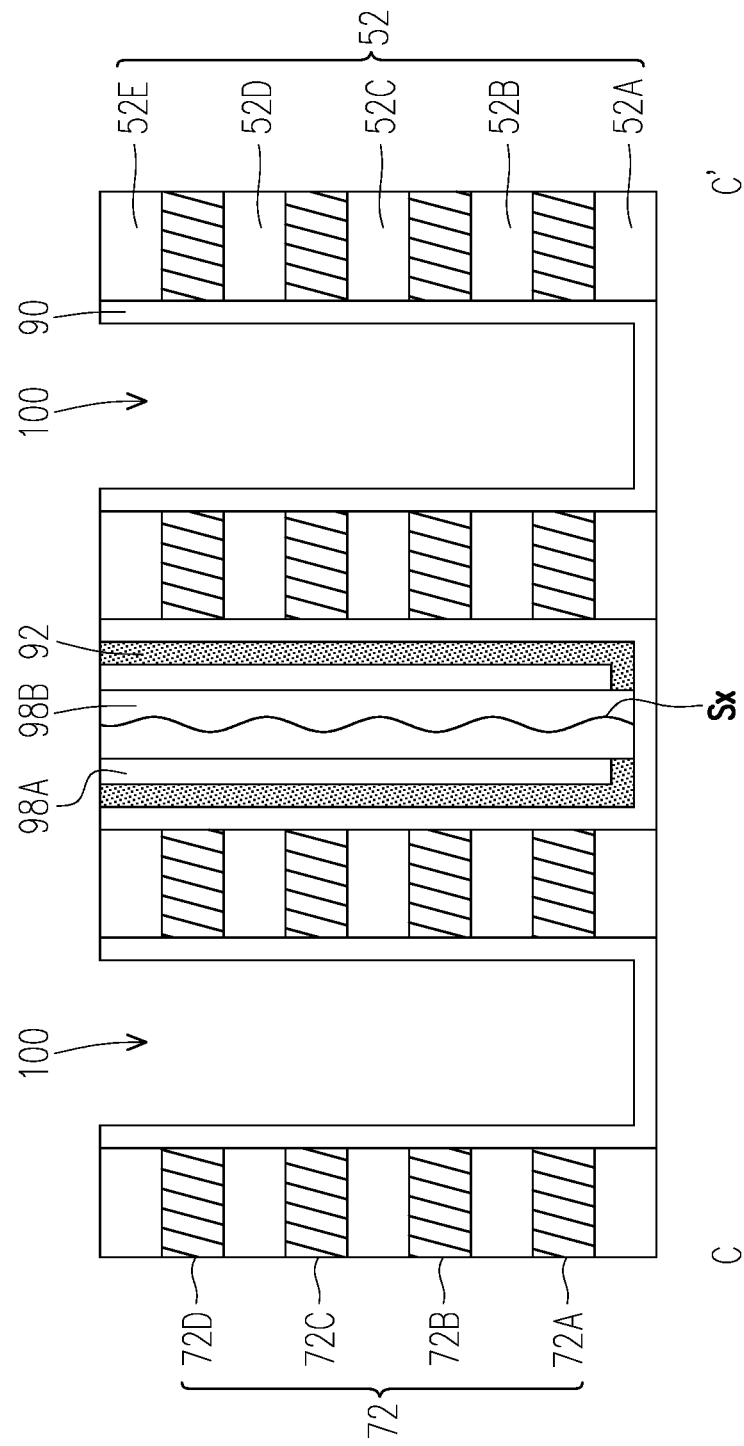

As illustrated in FIGS. 23A and 23B, trenches 100 are patterned through the channel layer 92 and the dielectric materials 98A/98B. For example, the dielectric materials 98A/98B are patterned to form dielectric pillars 98A/98B separated by the trenches 100. In certain embodiments, a portion of the dielectric layer 90 may be patterned or removed as well. Patterning the trenches 100 may be performed through a combination of photolithography and etching, for example. The trenches 100 may be disposed between opposing sidewalls of the dielectric layer 90, and the trenches 100 may physically separate adjacent stacks of memory cells in the memory device 200 (see FIG. 1A). In some embodiments, the trenches 100 have an oval shape, but the disclosure is not limited thereto. In certain embodiments, the trenches 100 have a rectangular shape.

Figure 24A:
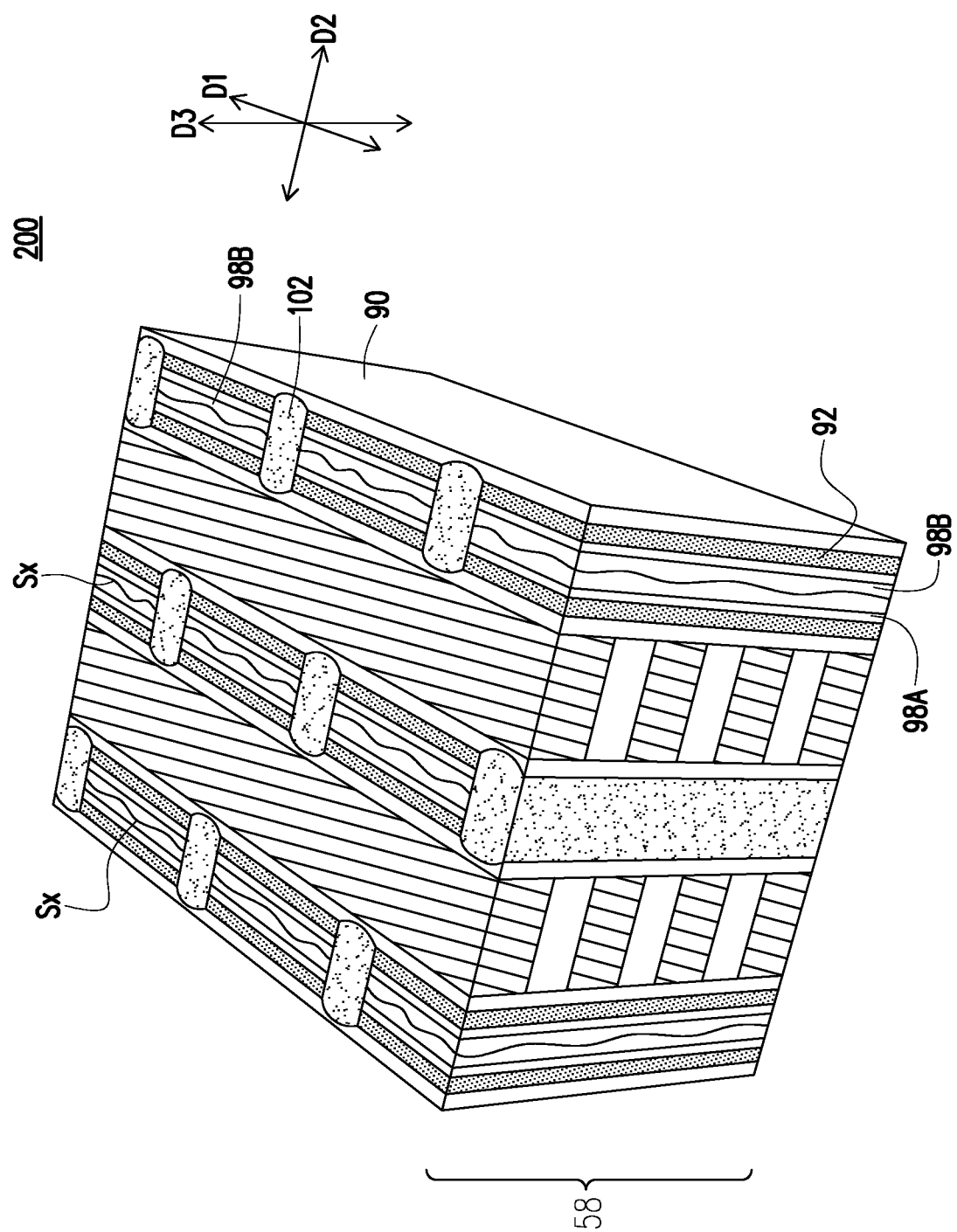
Figure 24B:
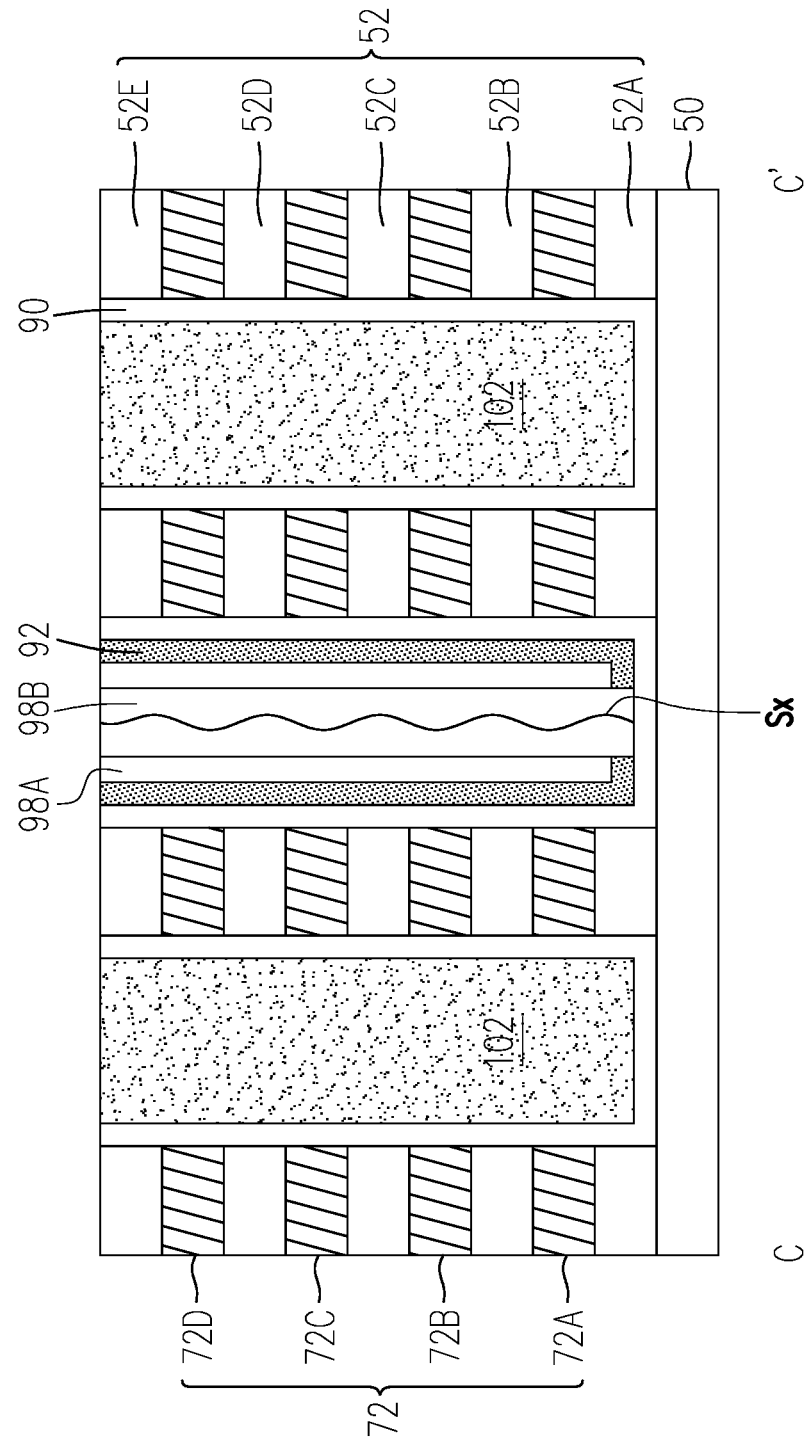

As illustrated in FIGS. 24A and 24B, isolation pillars 102 are formed in the trenches 100. In some embodiments, an isolation layer is deposited over the multi-stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer to form the isolation pillars 102. In the resulting structure, top surfaces of the multi-layer stack 58 (e.g., dielectric layer 52E), the dielectric layer 90, the channel layer 92, and the isolation pillars 102 may be substantially leveled (e.g., within process variations). In some embodiments, materials of the dielectric pillars 98A/98B and isolation pillars 102 may be selected so that they may be etched selectively relative to each other. For example, in some embodiments, the dielectric pillars 98A/98B include oxide and the isolation pillars 102 include nitride. In some embodiments, the dielectric materials 98A/98B (or dielectric pillars) include nitride and the isolation pillars 102 include oxide. Other materials are also possible.

Figure 25A:
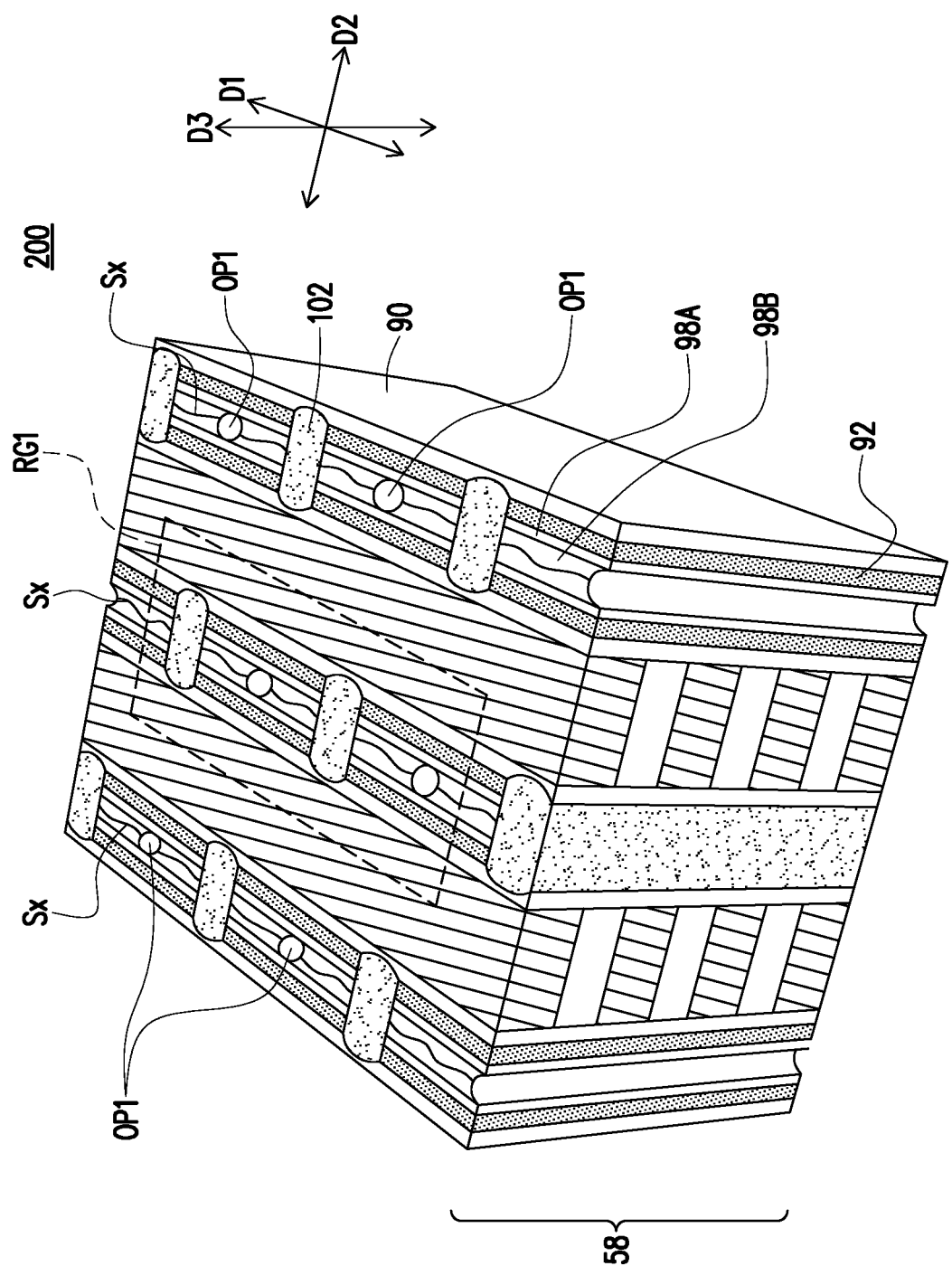
Figure 25B:
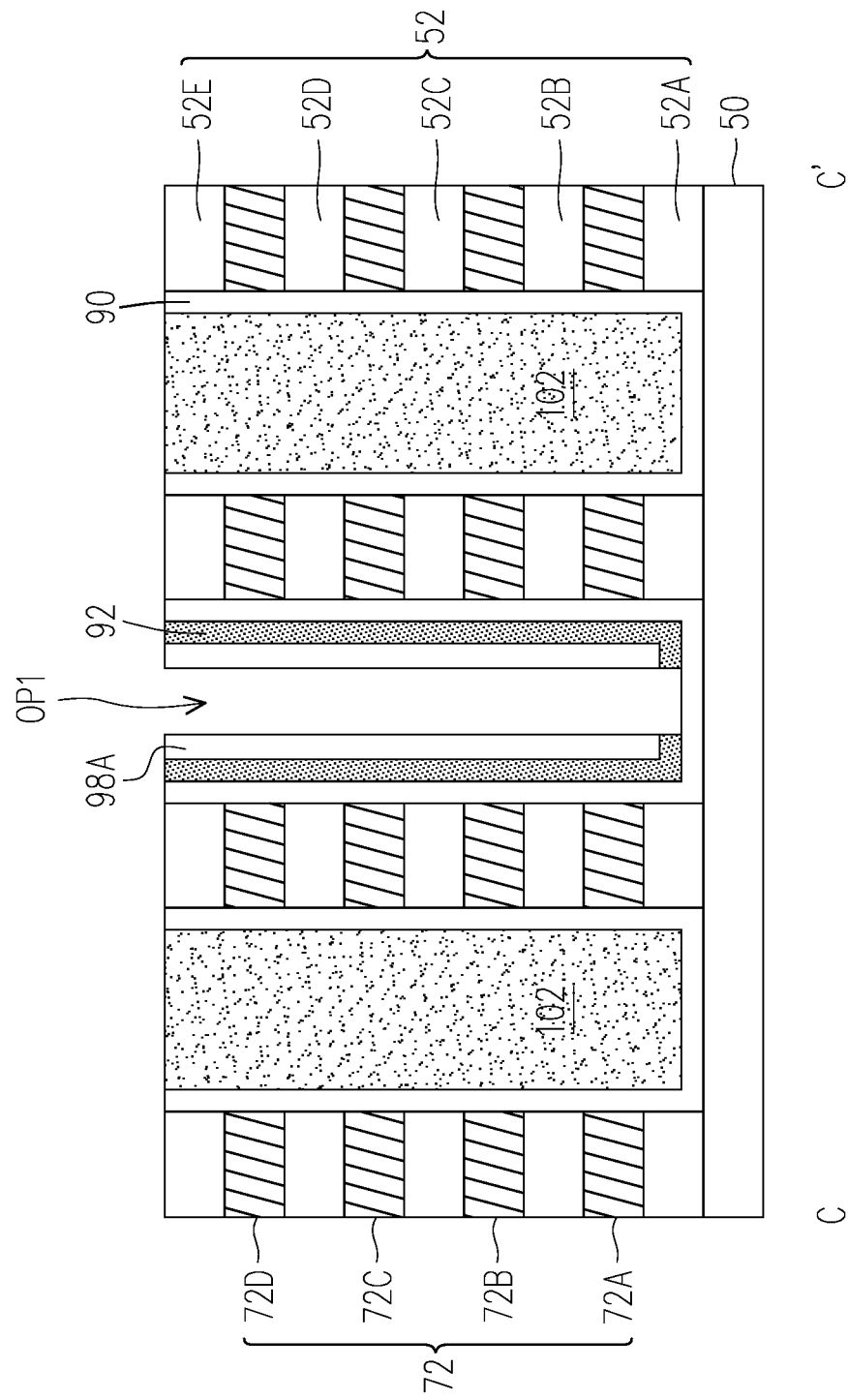
Figure 25C:
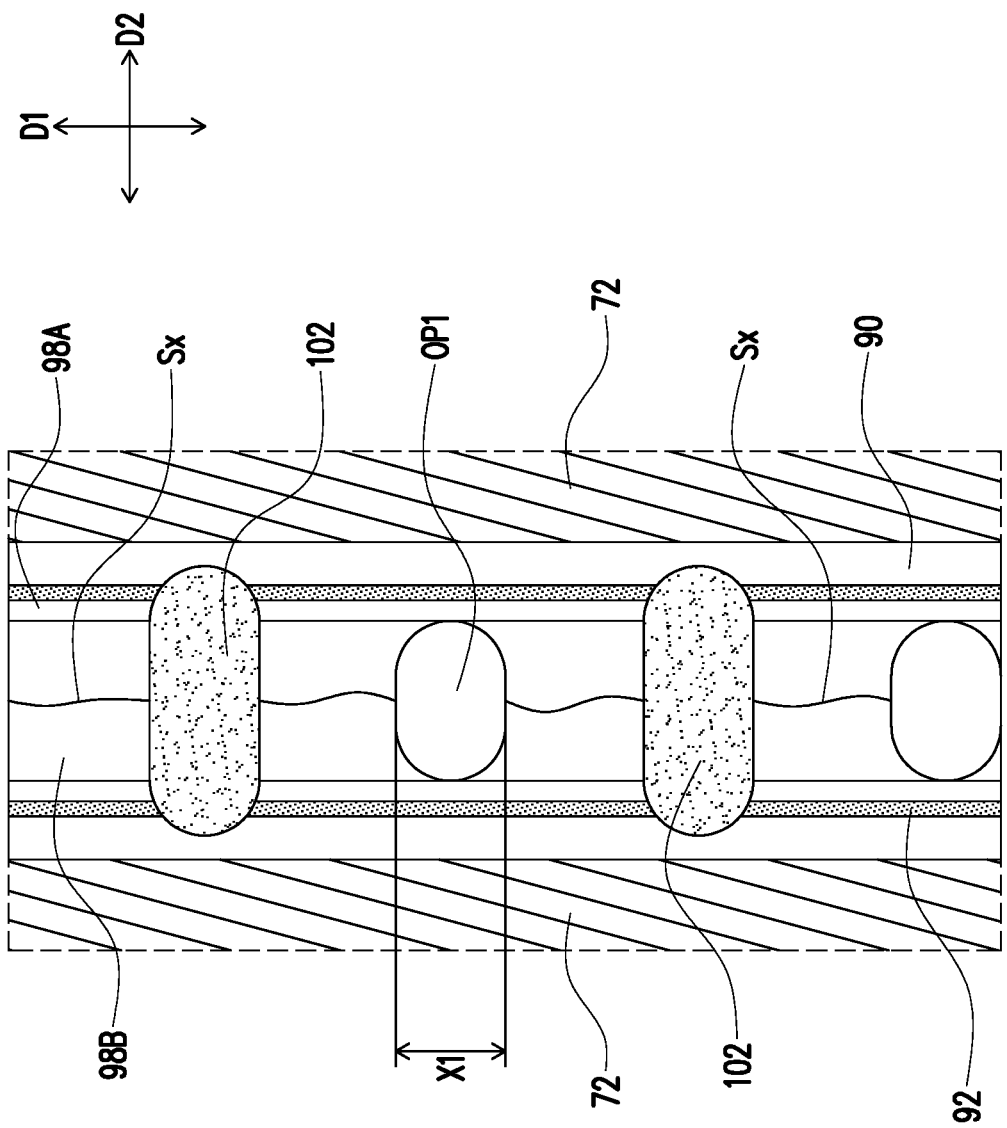

As illustrated in FIG. 25A to FIG. 25C, a first etching process is performed to remove portions of the dielectric pillar 98B to form openings OP1. For example, portions of the dielectric pillar 98B in between two isolation pillars 102 arranged along a first direction D1 are removed. In some embodiments, portions of the dielectric pillar 98B having the seam Sx are removed during the first etching process. In some embodiments, the first etching process may be any acceptable etching process, such as a dry etch (e.g., a reactive ion etch (RIE), a neutral beam etch (NBE), the like), a wet etch, the like, or a combination thereof. As illustrated in FIG. 25C, the openings OP1 may have a width of X1 along the first direction D1. Furthermore, the openings OP1 may have an oval shape.

Figure 26A:
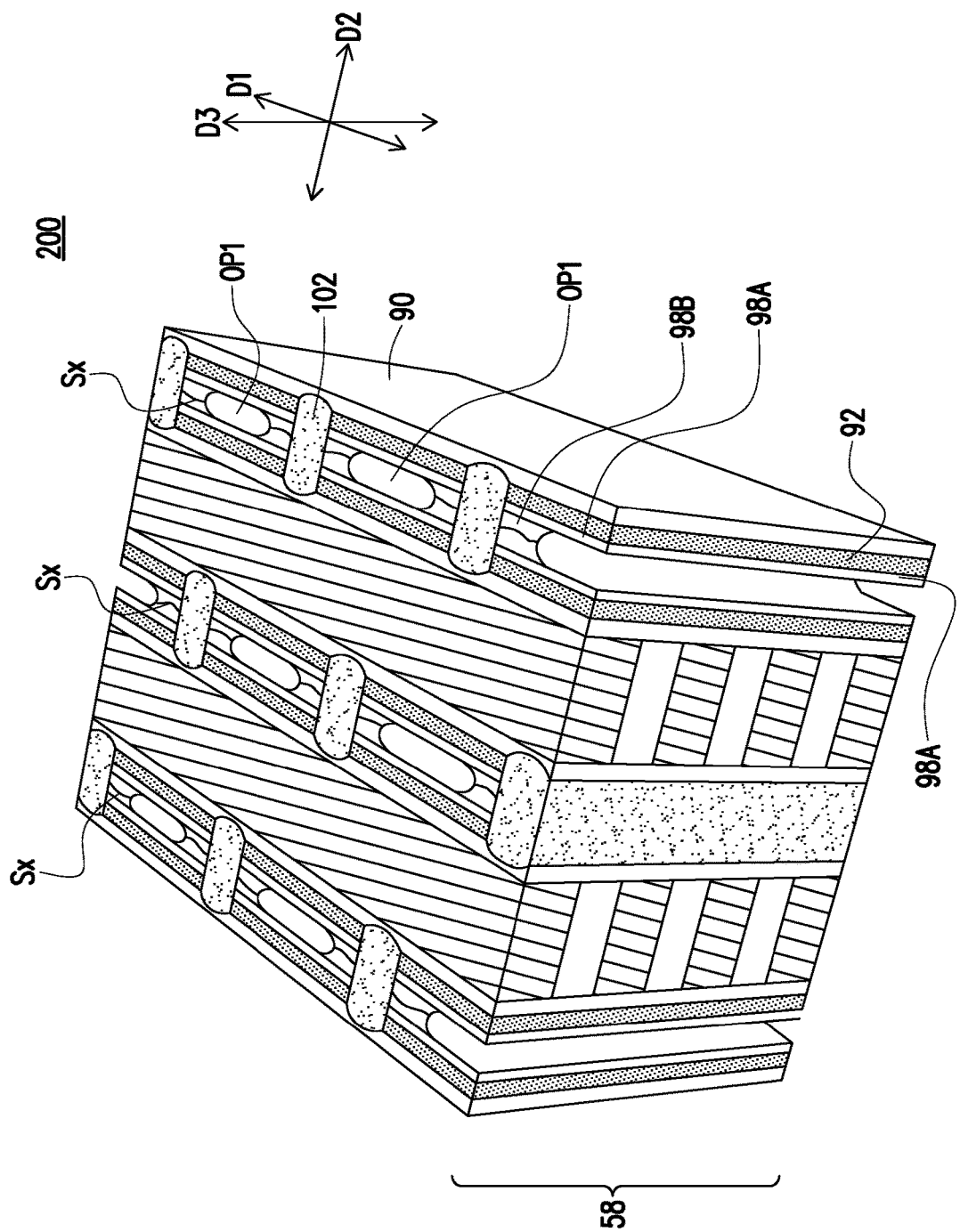

Referring to FIG. 26A to FIG. 26C, in some embodiments, a second etching process is performed to enlarge the width of the openings OP1, or to refine a shape of the openings OP1. For example, the second etching process may be a wet etch, or the like. As illustrated in FIG. 26C, the openings OP1 may have a width of X2 along the first direction D1 after the second etching process. The width X2 being greater than the width X1. In some embodiments, the width of the openings OP1 is enlarged along the first direction D1, but the width of the openings OP1 along a second direction D2 is maintained in the second etching process.

Figure 27A:
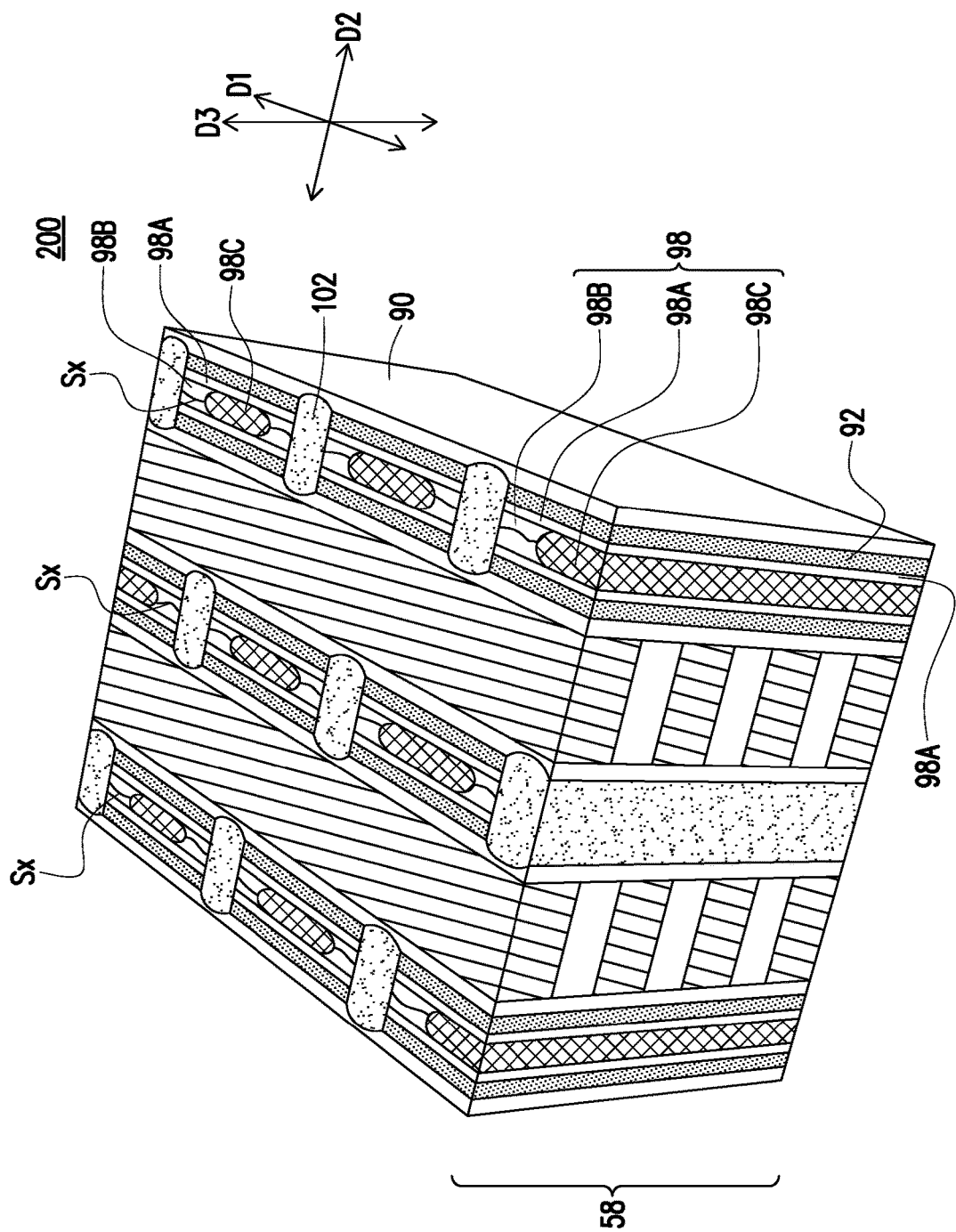
Figure 27B:
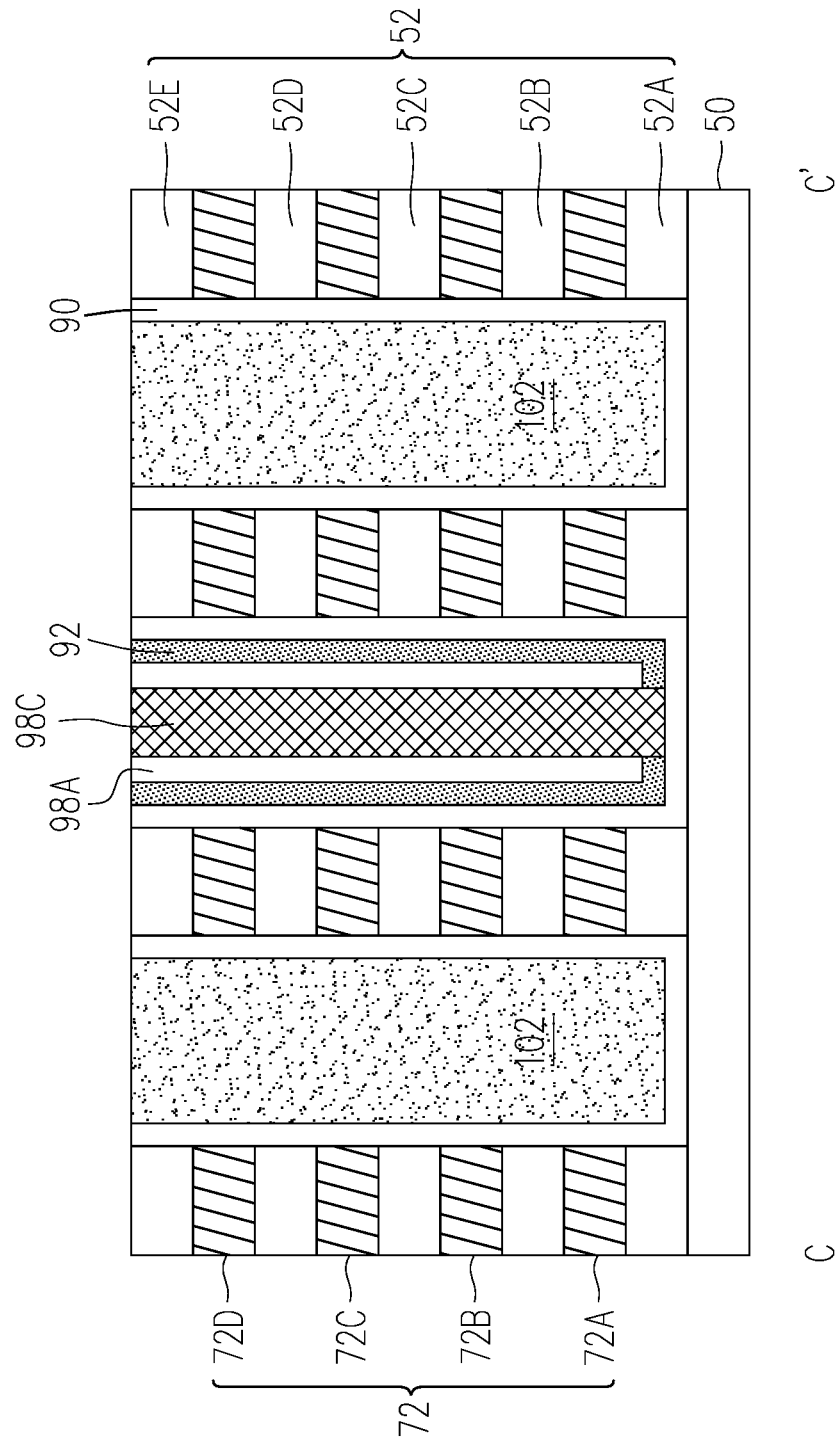

Referring to FIG. 27A to FIG. 27C, a plurality of gap filling pillars 98C is formed in the openings OP1. In the exemplary embodiment, the gap filling pillars 98C may be made of materials having different etching selectivity than the dielectric pillars 98A/98B. In other words, the gap filling pillars 98C are made of a different material than the dielectric pillars 98A/98B. In some embodiments, the gap filling pillars 98C is an oxide, silicon nitride, polysilicon, amorphous silicon, titanium nitride, or the like. The gap filling pillars 98C may be deposited through ALD, CVD or the like. In some embodiments, a CMP process may be performed to remove excess gap filling material of the gap filling pillars 98C. For example, top surfaces of the gap filling pillars 98C may be substantially aligned with top surfaces of the dielectric pillars 98A/98B and the isolation pillars 102 after the CMP process. In some embodiments, the dielectric pillars 98A/98B and the gap filling pillars 98C may be collectively referred as a dielectric layer 98.

As further illustrated in FIG. 27C, the channel layer 92 and the dielectric layer 90 are extending along the first direction D1, while the gap filling pillars 98C are located in between the channel layer 92 along the second direction D2. In some embodiments, the gap filling pillars 98C are formed with a curved sidewall SW1 and a curved sidewall SW2, wherein the curved sidewall SW1 is opposite to the curved sidewall SW2. The curved sidewalls SW1, SW2 are respectively facing the isolation pillars 102. In some embodiments, the gap filling pillars 98C further include planar sidewalls SW3, SW4. For example, the dielectric pillars 98A are covering and contacting the planar sidewalls SW3, SW4, while the channel layer 92 is covering and contacting sidewalls of the dielectric pillars 98A.

Figure 28A:
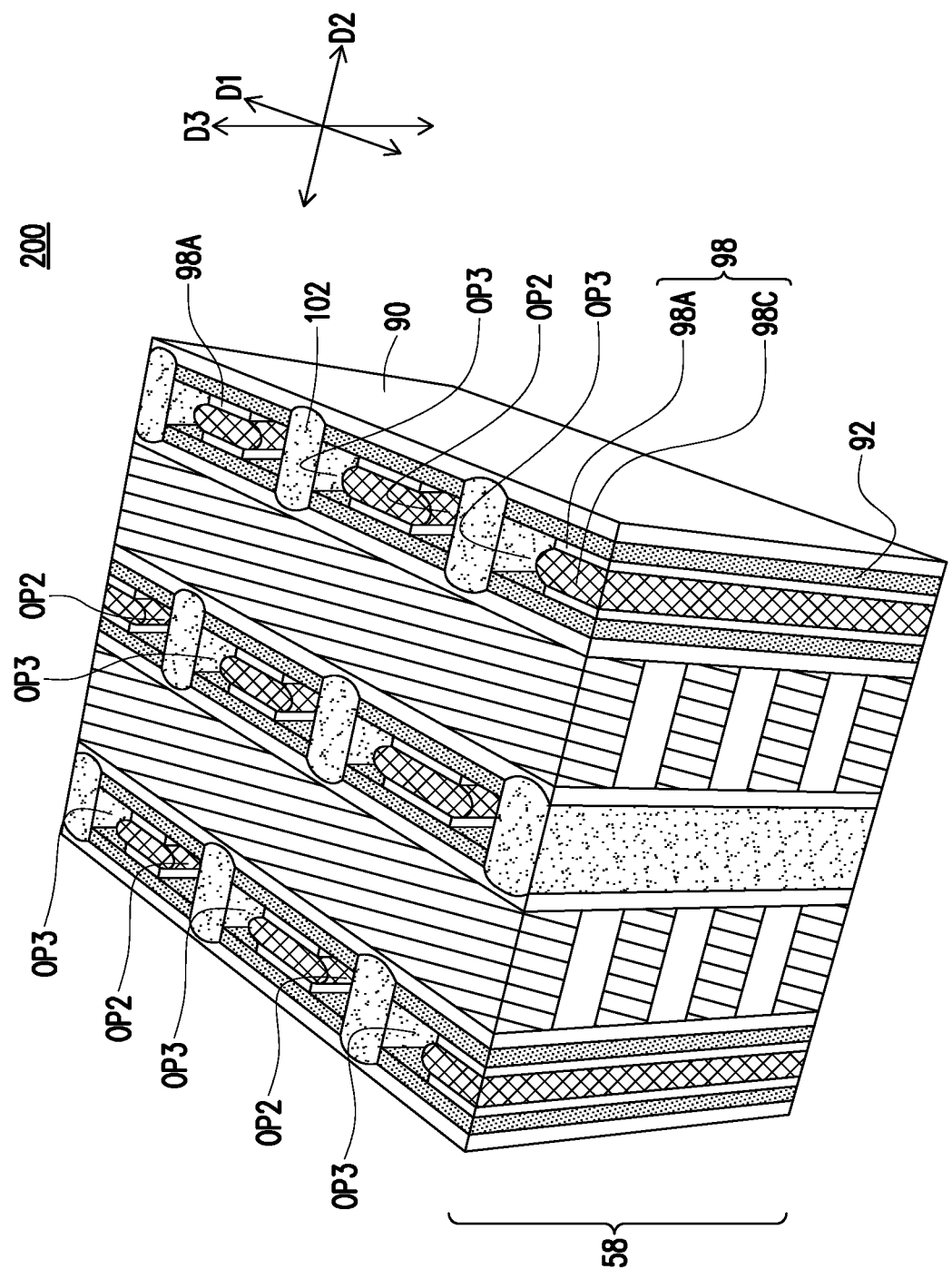
Figure 28B:
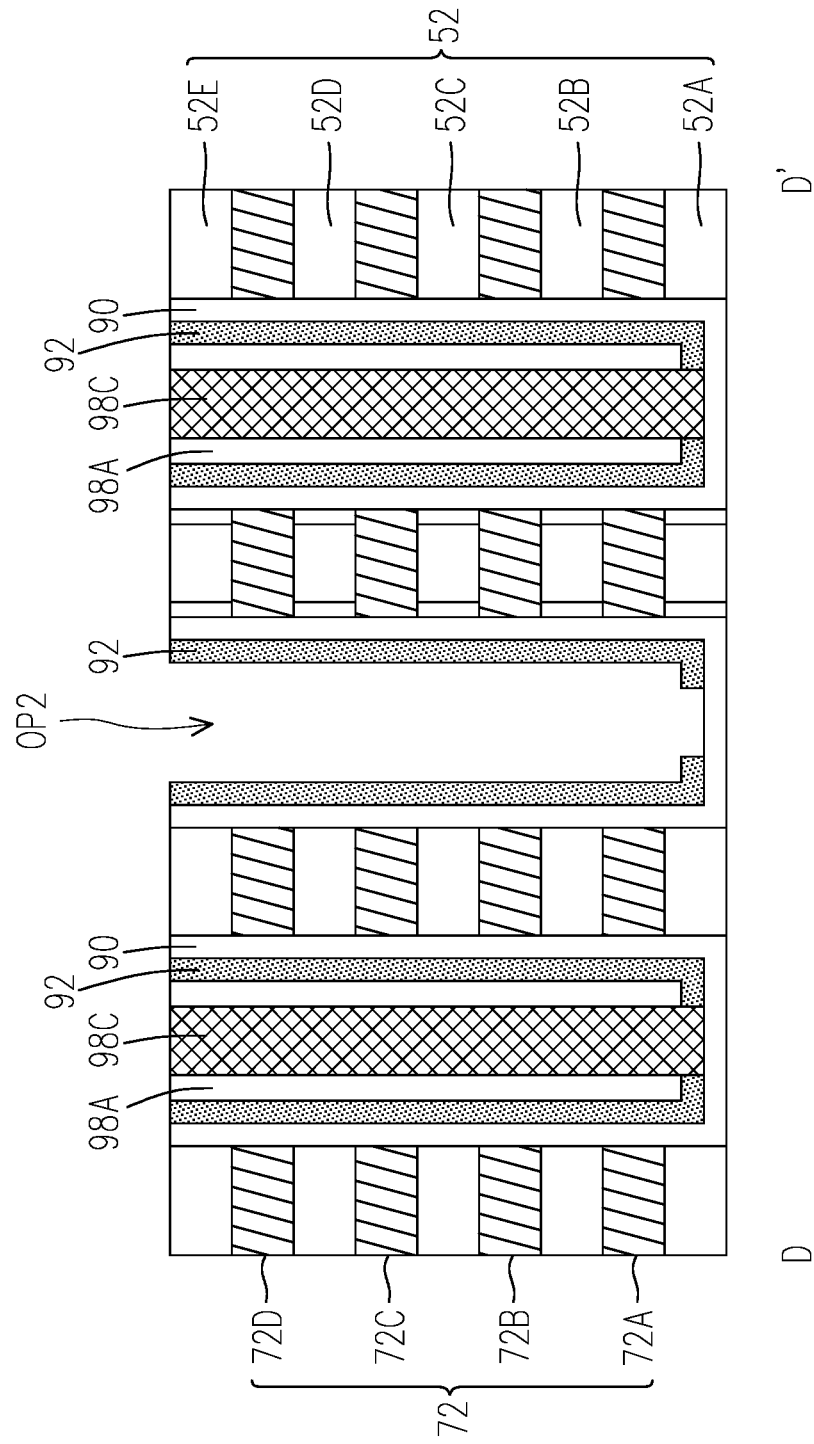
Figure 28C:
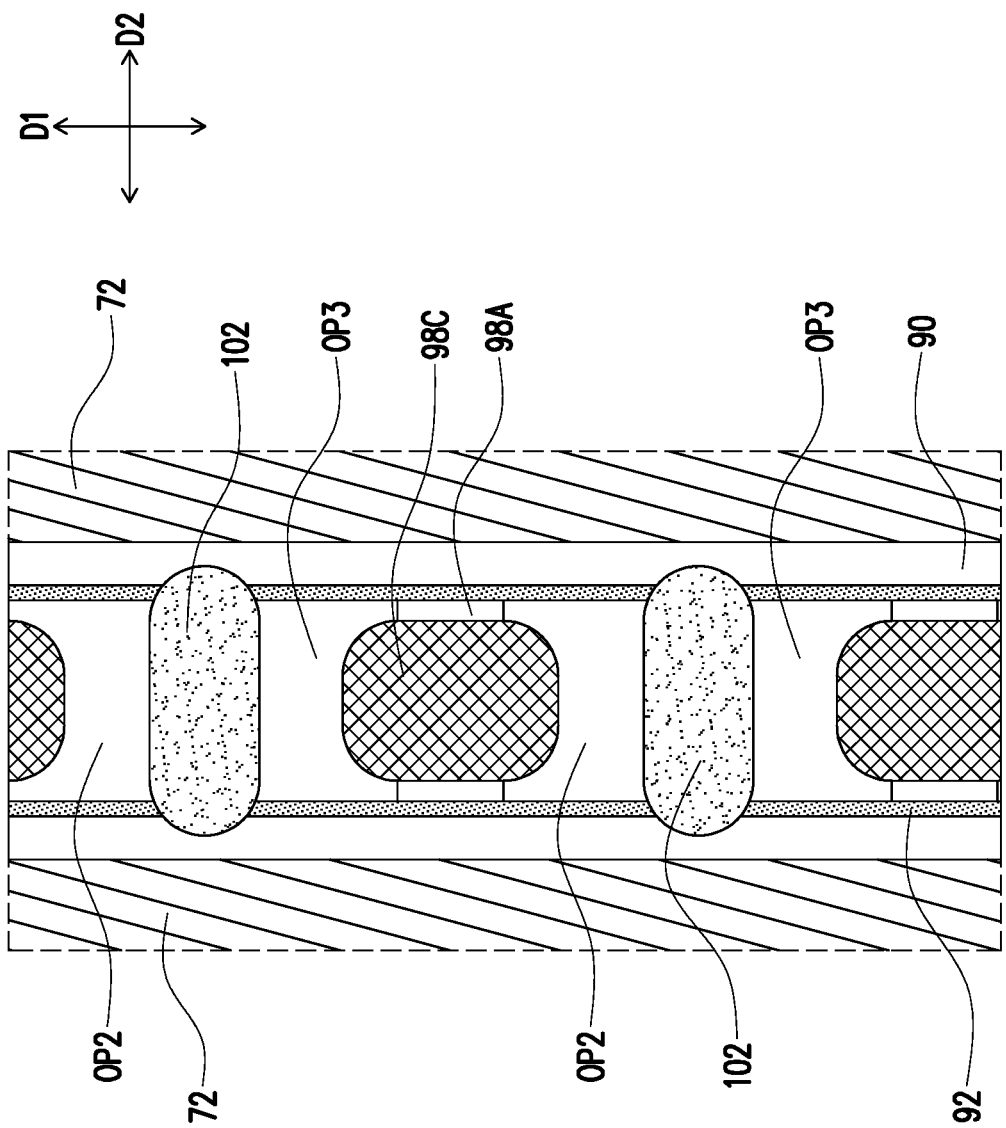

Referring to FIG. 28A to FIG. 28C, in a subsequent step, portions of the dielectric pillars 98A and portions of the dielectric pillars 98B are removed to form openings OP2 and openings OP3. In some embodiments, the openings OP2 corresponds to a position of the conductive pillars 106 (drain pillars), while the openings OP3 corresponds to a position of the conductive pillars 108 (source pillars) formed in subsequent steps. In the exemplary embodiment, the dielectric pillars 98B along with the seams Sx are completely removed, while a portion of the dielectric pillars 98A is retained. In some embodiments, the dielectric pillars 98A/98B are removed by a selective etching process. For example, the selective etching process selectively removes the dielectric pillars 98A/98B without damaging the gap filling pillars 98C, the isolation pillars 102 or the channel layer 92. In some embodiments, the selective etching process is performed by isotropic chemical ion etch, wet etch, or the like. The selective etching process has a higher selectivity for etching the dielectric pillars 98A/98B as compared to damaging/etching the gap filling pillars 98C, the isolation pillars 102 or the channel layer 92. For example, in one embodiment, the etching selectivity for etching the dielectric pillars 98A/98B with respect to the other materials is 1000:1. After the selective etching process, a length (or width) of the gap filling pillars 98C along the first direction D1 is greater than a length (or width) of the dielectric pillars 98A along the first direction D1.

Figure 29A:
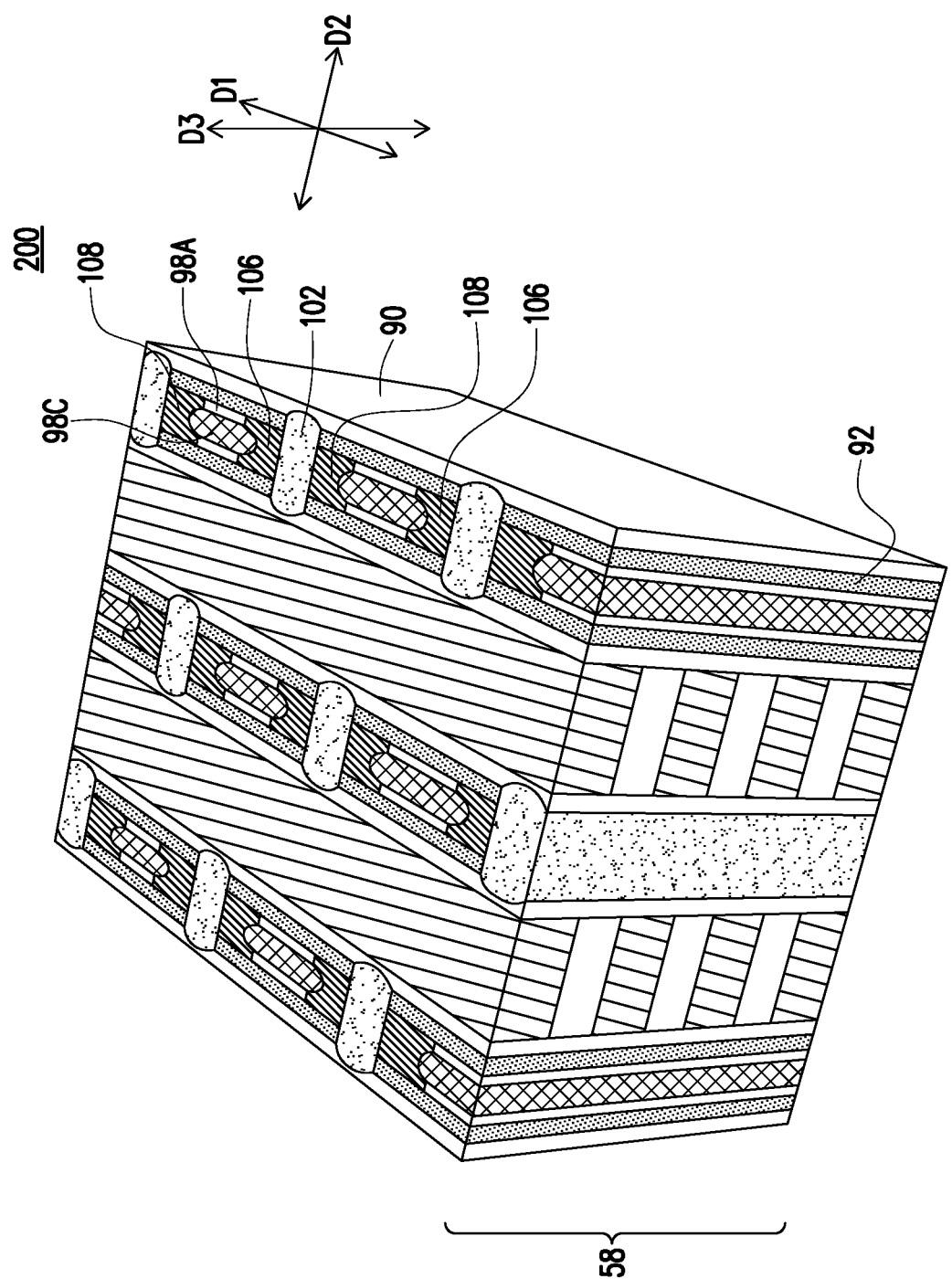
Figure 29B:
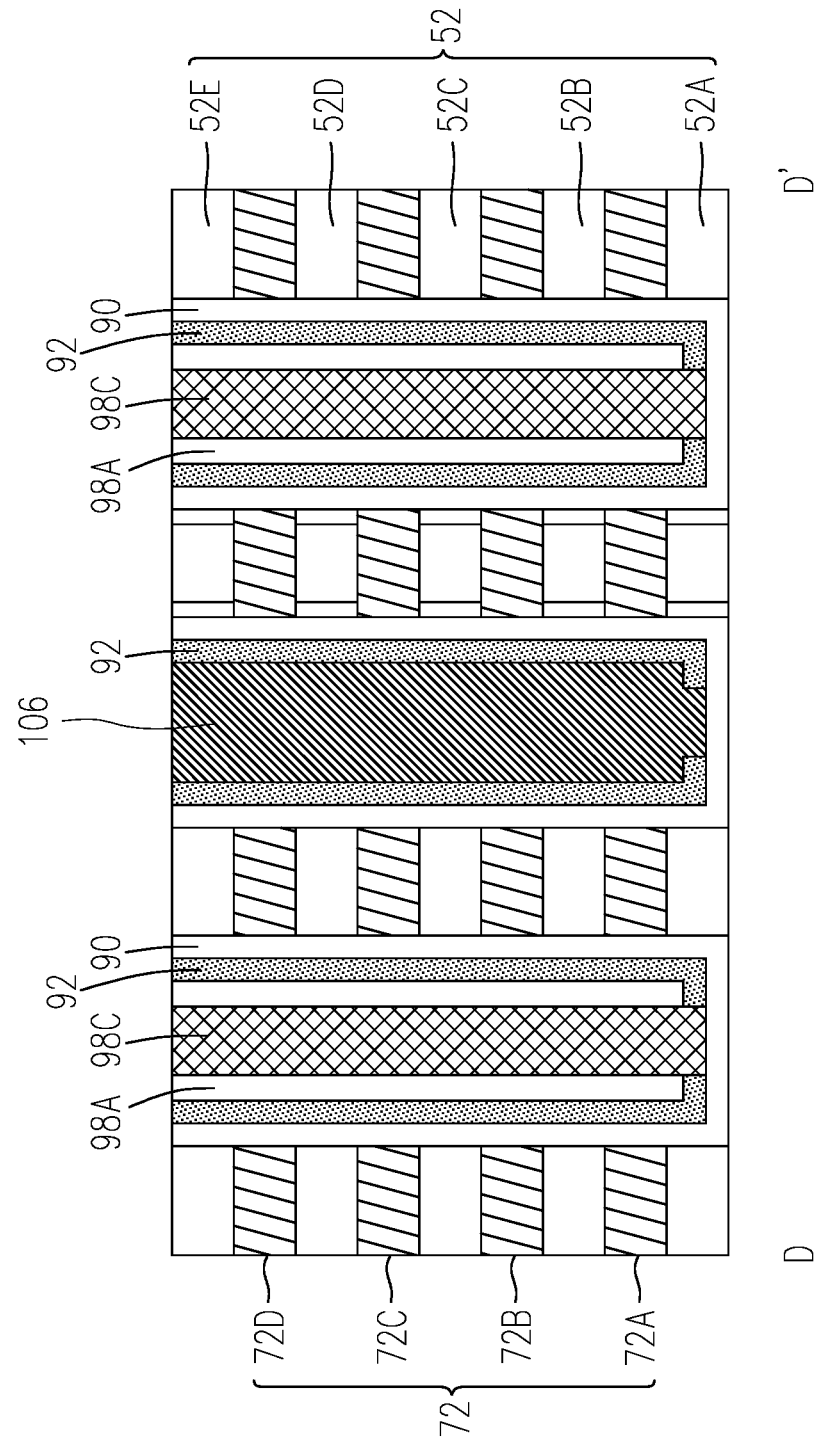
Figure 29C:
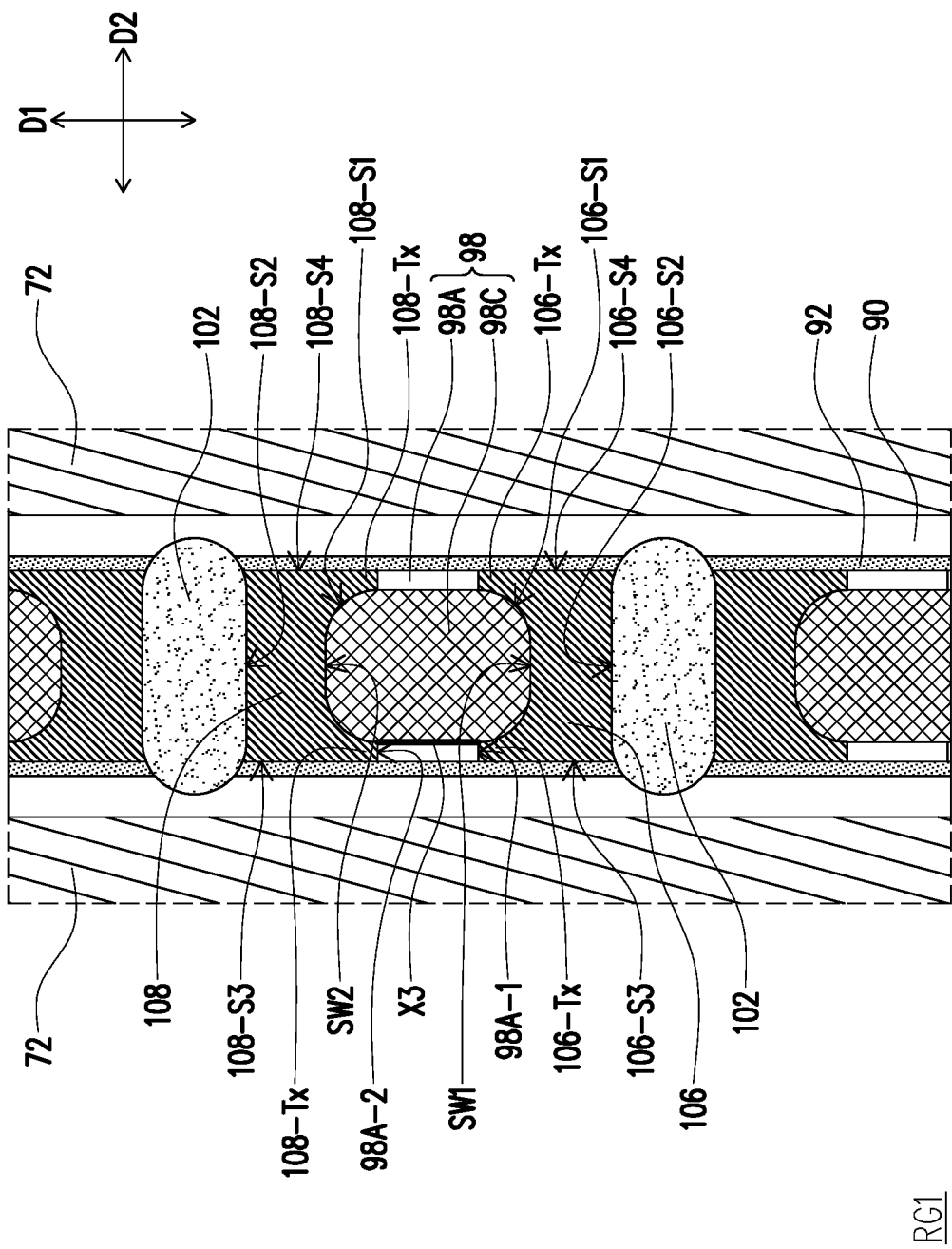

Referring to FIG. 29A to FIG. 29C, in a subsequent step, conductive pillars 106 are formed in the openings OP2, while conductive pillars 108 are formed in the openings OP3. In some embodiments, the conductive pillars 106, 108 are formed by filling the openings OP2, OP3 with a conductive material. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the dielectric layer 90, the channel layer 92, the conductive pillars 106, and the conductive pillars 108 may be substantially leveled (e.g., within process variations). In some embodiments, the conductive pillars 106 correspond to and are electrically connected to the bit lines in the memory device 200, and the conductive pillars 108 correspond to and are electrically connected to the source lines in the memory device 200.

Thus, stacked memory cells 202 may be formed in the memory device 200, in the manner shown in FIG. 1A. Each memory cell 202 includes a gate electrode (e.g., a portion of a corresponding conductive line 72), a gate dielectric (e.g., a portion of a corresponding dielectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

As further illustrated in FIG. 29A to FIG. 29C, in some embodiments, the dielectric pillars 98A are located in between the channel layer 92 and the gap filling pillars 98C, wherein a length of an interface X3 where the dielectric pillars 98A contact the gap filling pillars 98C along the first direction D1 is different from a length (or width) of the gap filling pillars 98C along the first direction D1. For example, the length of the interface X3 is smaller than the length of the gap filling pillars 98C.

In some embodiments, the conductive pillars 106 (drain pillars) has a curved surface 106-S1, a planar surface 106-S2 opposite to the curved surface 106-S1, and side surfaces 106-S3, 106-S4 joining the curved surface 106-S1 to the planar surface 106-S2. In certain embodiments, the curved surface 106-S1 is joined with side surfaces 106-S3 through tip portions 106-Tx. For example, the tip portions 106-Tx are planar tip portions located at two sides of the curved surface 106-S1, whereby the tip portions 106-Tx is connected to the curved surface 106-S1 and the side surfaces 106-S3. In some embodiments, the curved surface 106-S1 is in contact with the gap filling pillars 98C, the planar surface 106-S2 is in contact with the isolation pillars 102, the side surfaces 106-S3, 106-S4 are in contact with the channel layer 92, while the tip portions 106-Tx are in contact with the dielectric pillars 98A.

Similarly, the conductive pillars 108 (source pillars) has a curved surface 108-S1, a planar surface 108-S2 opposite to the curved surface 108-S1, and side surfaces 108-S3, 108-S4 joining the curved surface 108-S1 to the planar surface 108-S2. In certain embodiments, the curved surface 108-S1 is joined with side surfaces 108-S3 through tip portions 106-Tx. For example, the tip portions 108-Tx are planar tip portions located at two sides of the curved surface 108-S1, whereby the tip portions 108-Tx is connected to the curved surface 108-S1 and the side surfaces 108-S3. In some embodiments, the curved surface 108-S1 is in contact with the gap filling pillars 98C, the planar surface 108-S2 is in contact with the isolation pillars 102, the side surfaces 108-S3, 108-S4 are in contact with the channel layer 92, while the tip portions 108-Tx are in contact with the dielectric pillars 98A.

In the exemplary embodiment, the curved sidewall SW1 of the gap filling pillars 98C is facing and contacting the conductive pillars 106, while the curved sidewall SW2 of the gap filling pillars 98C is facing and contacting the conductive pillars 108. In some embodiments, the curved sidewalls SW1, SW2 of the gap filling pillars 98C are misaligned with ends of the dielectric pillars 98A. For example, the dielectric pillars 98A include a first end 98A-1 and a second end 98A-2 opposite to the first end 98A-1, wherein the first end 98A-1 and the second end 98A-2 are misaligned with the tips of the curved sidewalls SW1, SW2. In certain embodiments, the first end 98A-1 of the dielectric pillars 98A is in contact with the conductive pillars 106 (drain pillars), while the second 98A-2 of the dielectric pillars 98A is in contact with the conductive pillars 108 (source pillars). Furthermore, the first end 98A-1 is in contact with the tip portions 106-Tx of the conductive pillars 106, while the second end 98A-2 is in contact with the tip portions 108-Tx of the conductive pillars 108.

Figure 30A:
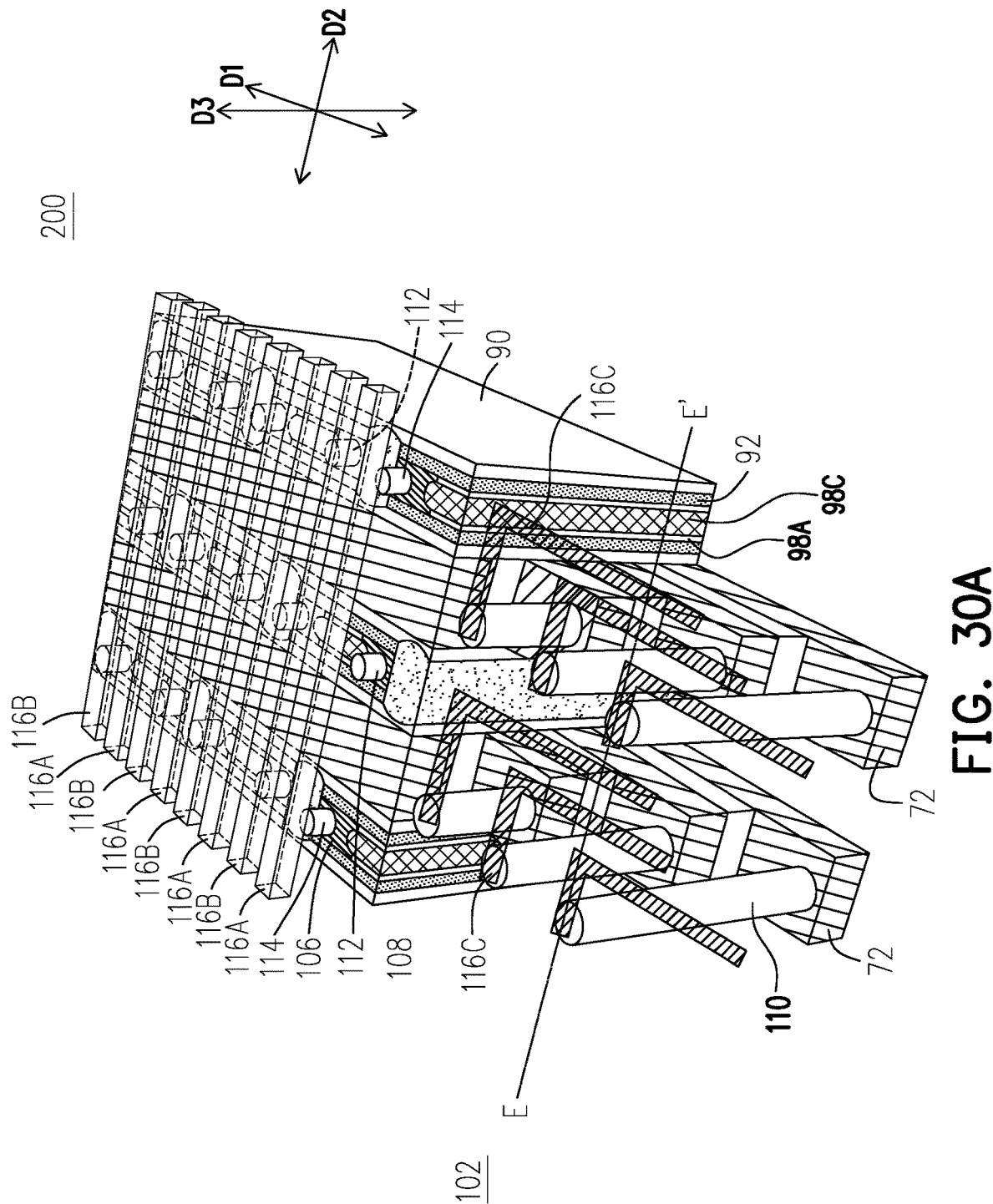
Figure 30B:
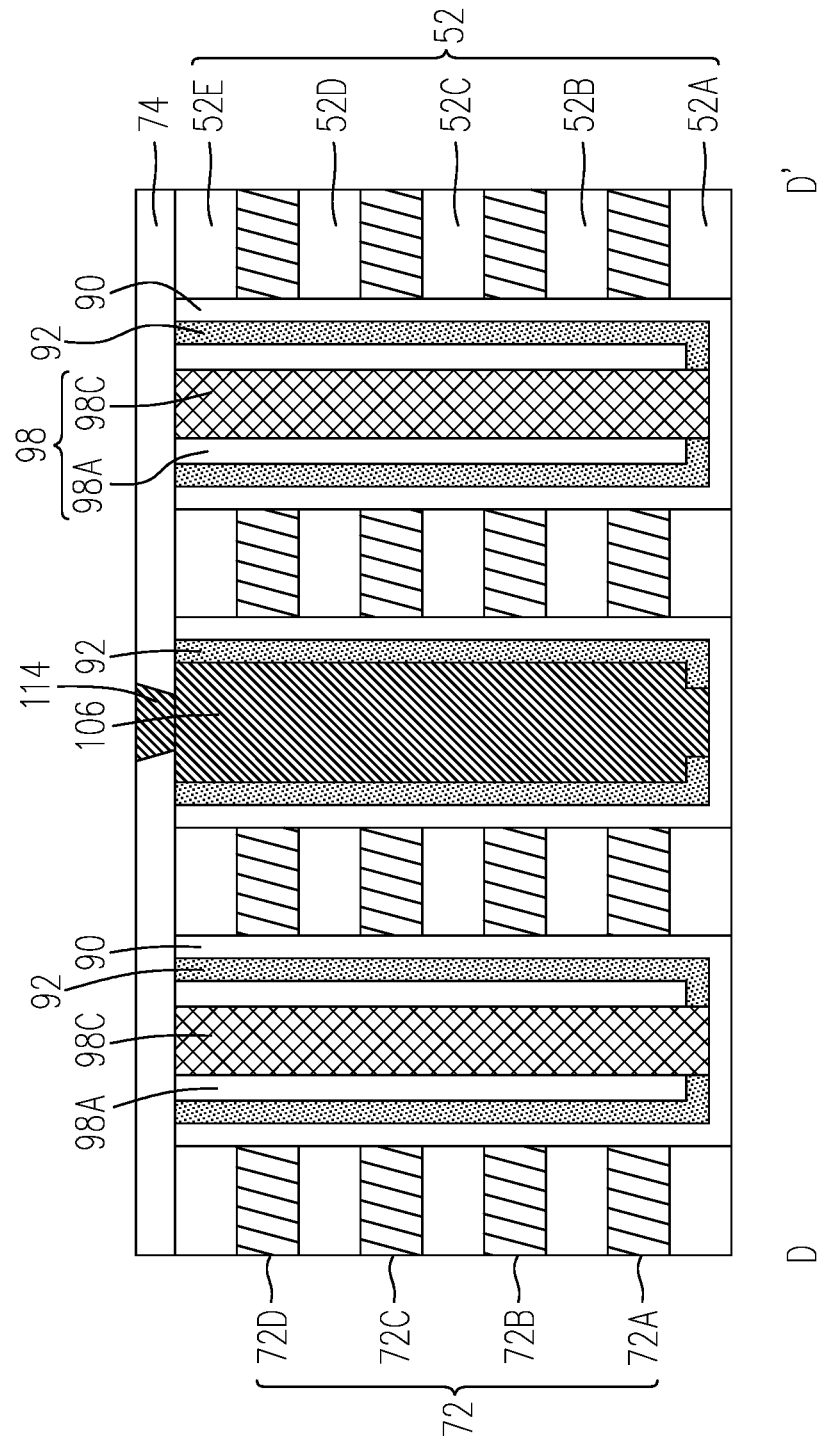
Figure 30C:
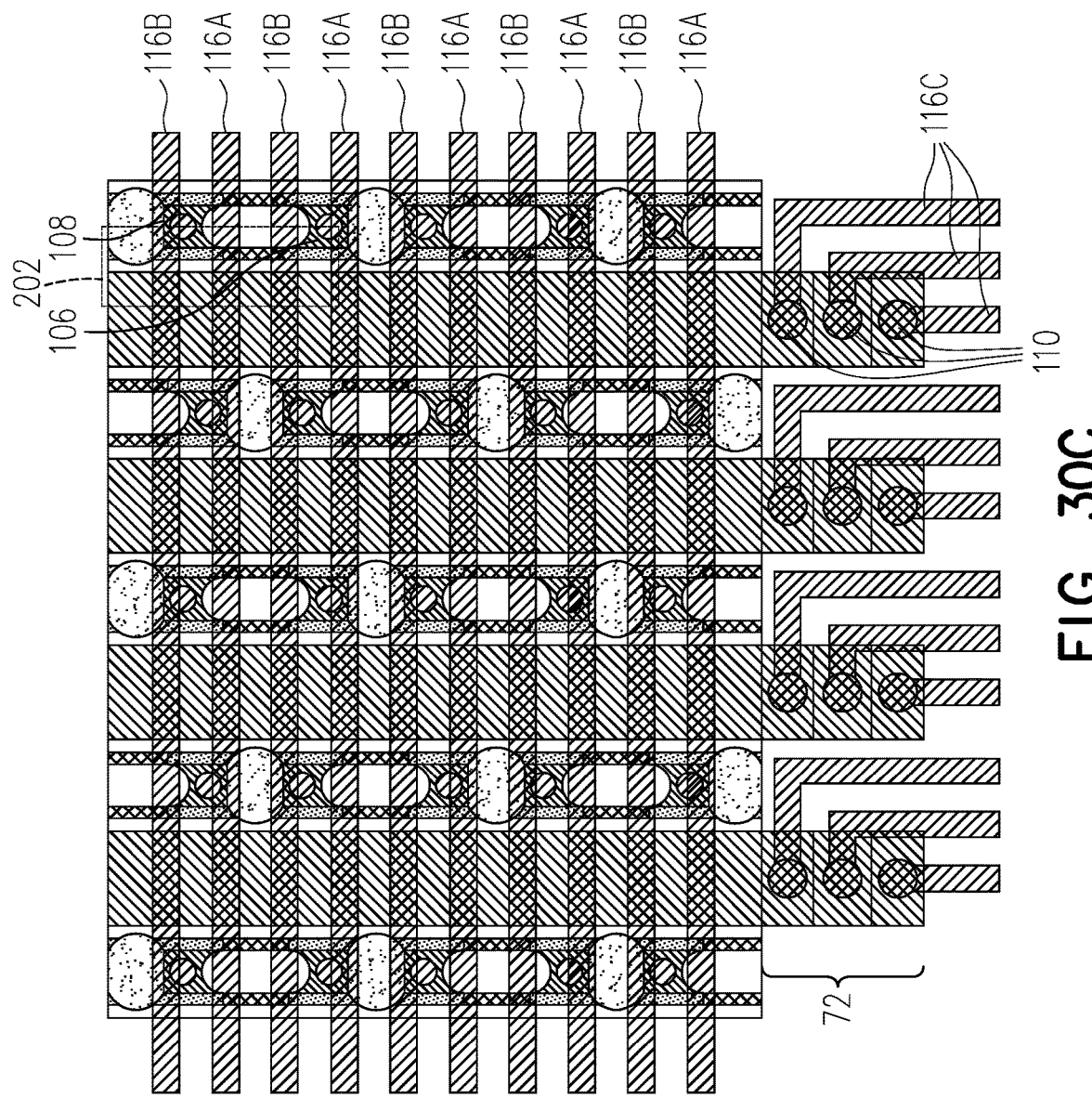
Figure 30D:
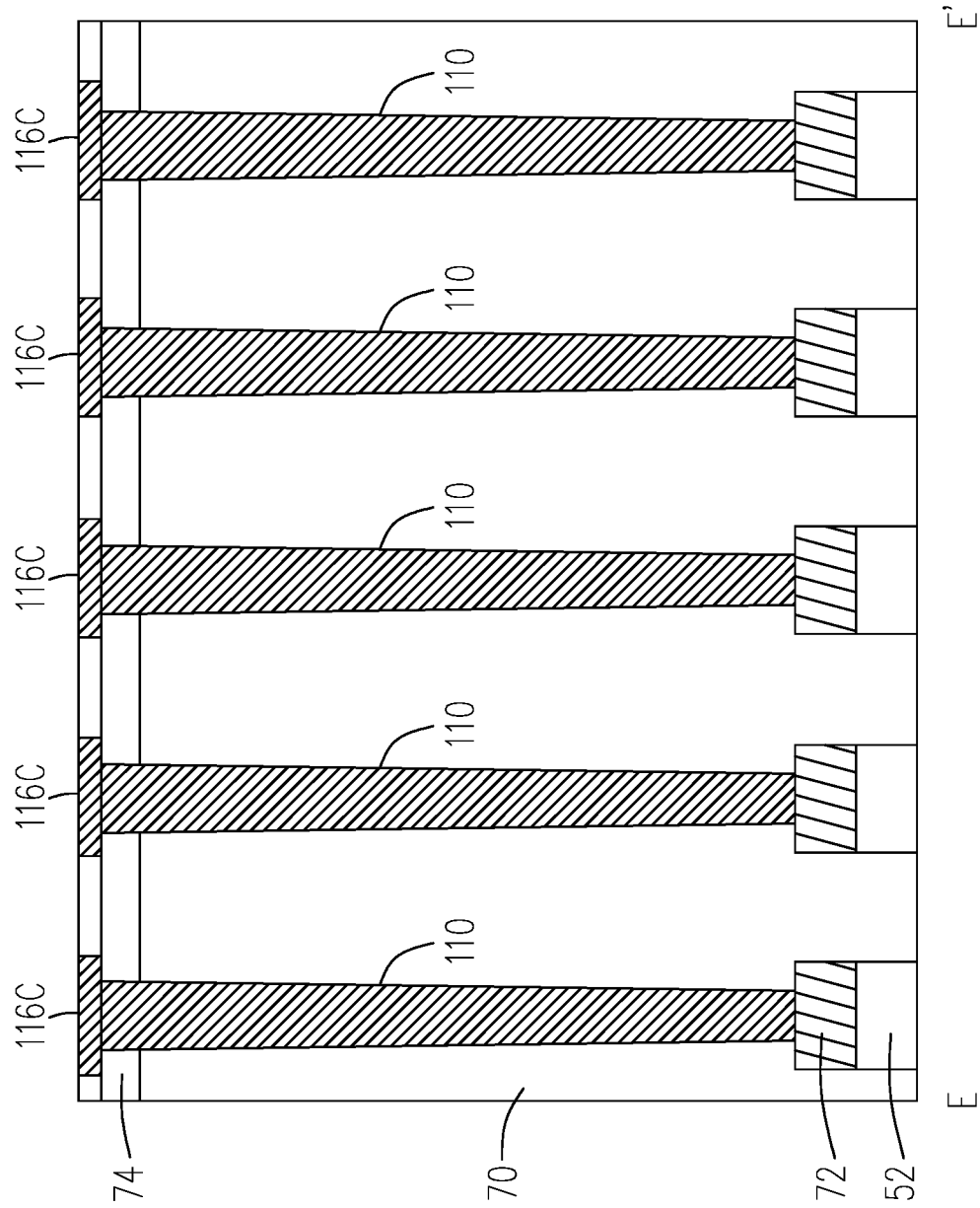
Figure 30E:
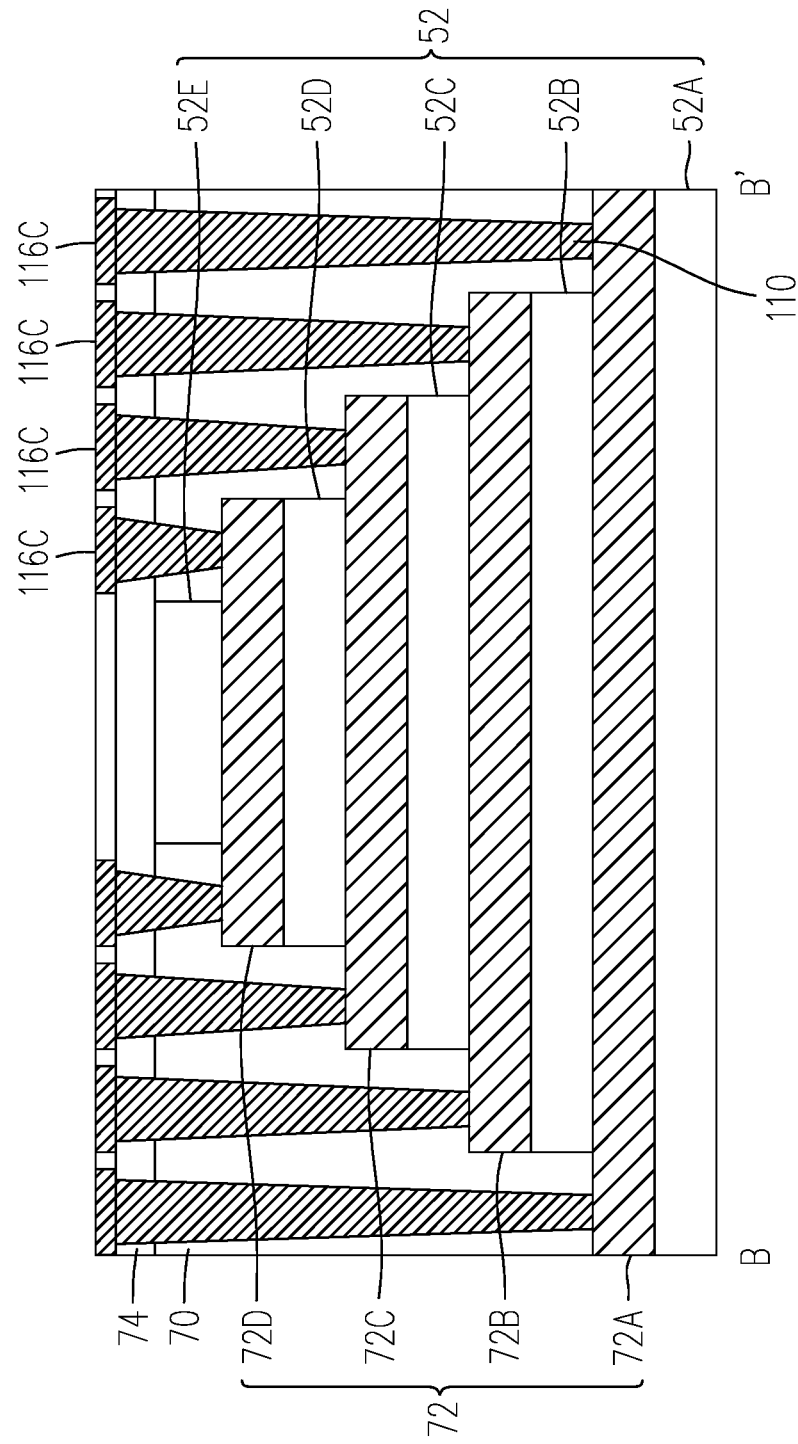
Figure 31A:
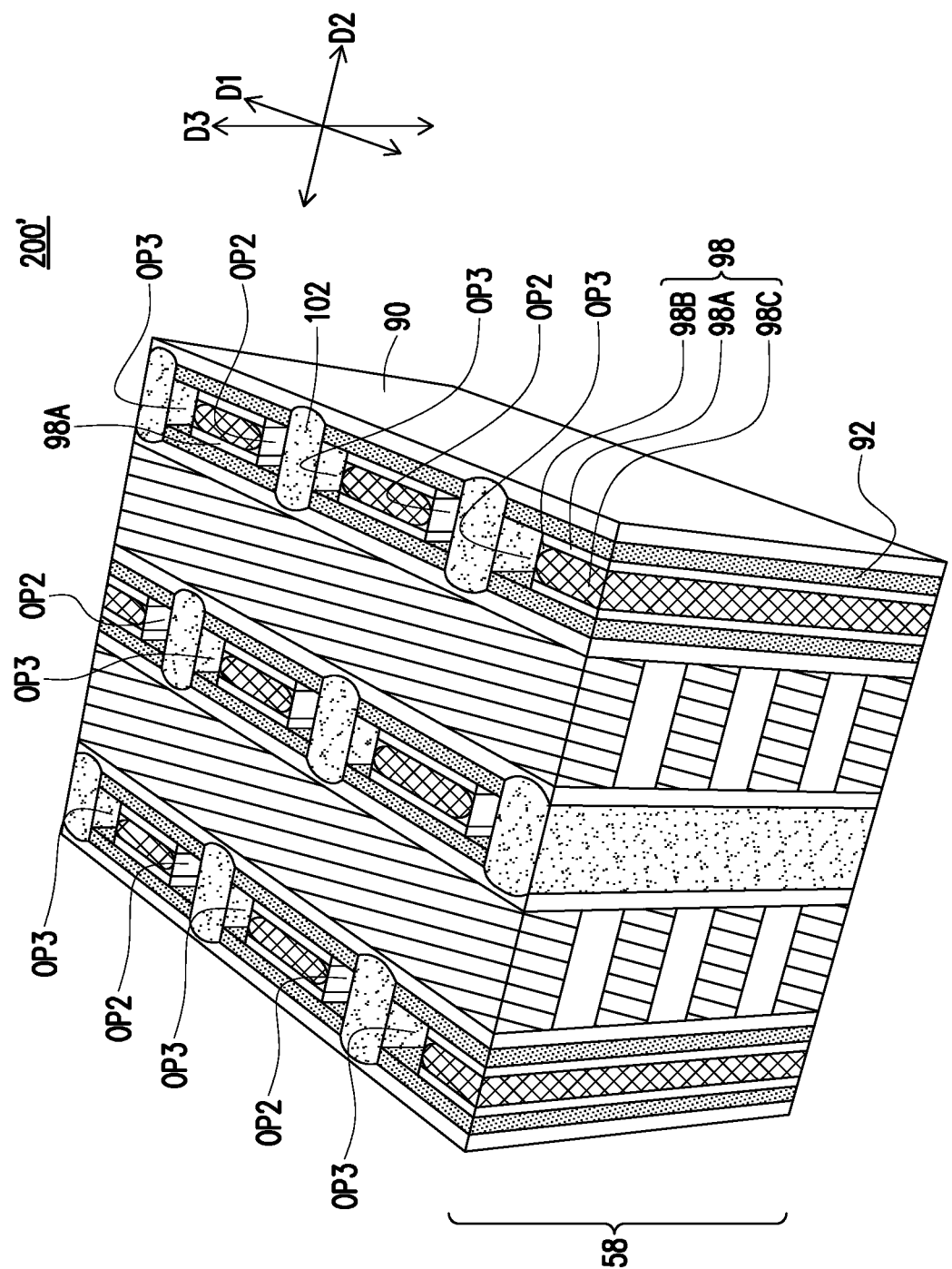
FIG. 31A to FIG. 32C illustrate various views in a method of manufacturing a memory device in accordance with some other embodiments of the disclosure.
Figure 31B:
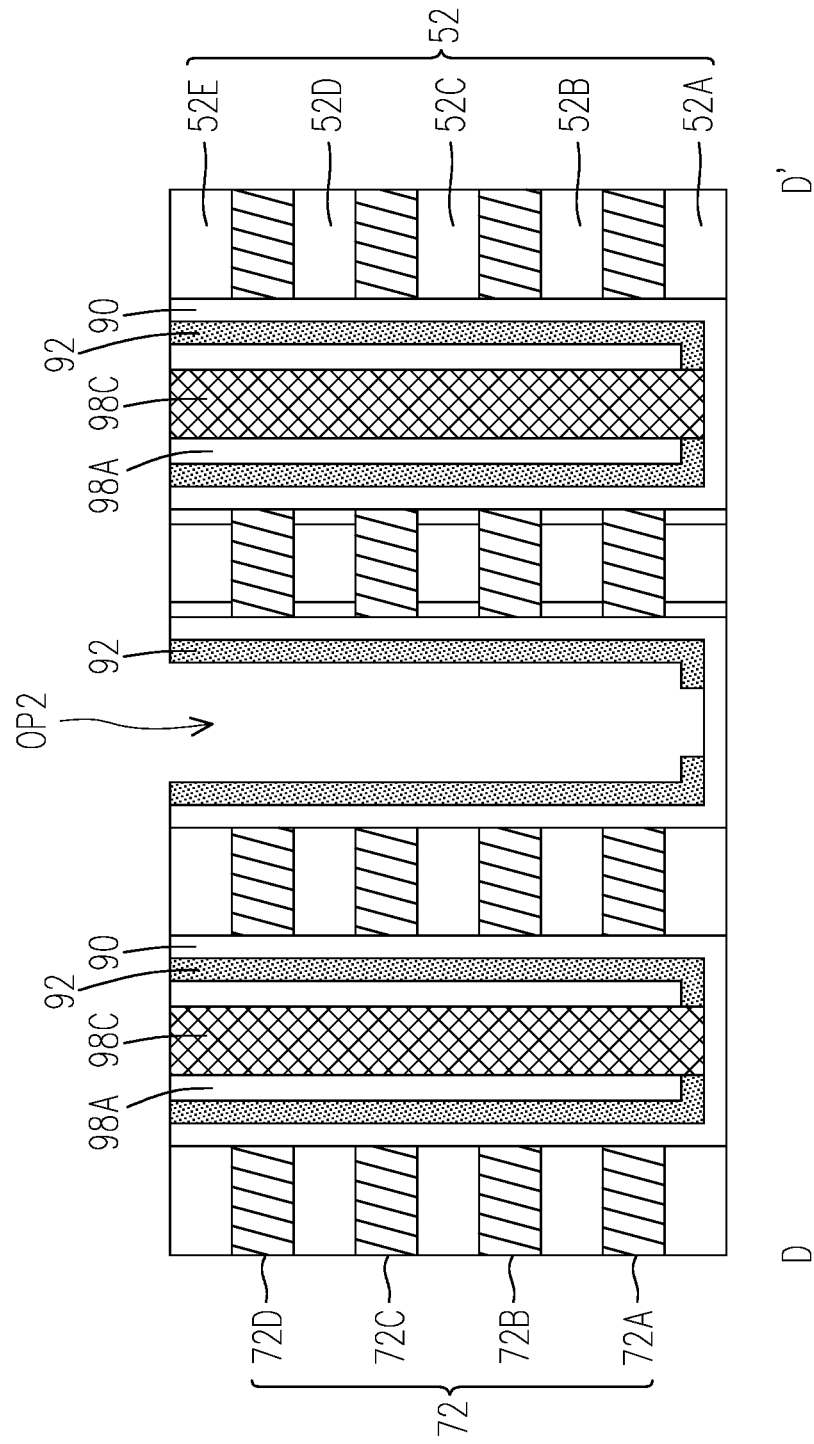
Figure 31C:
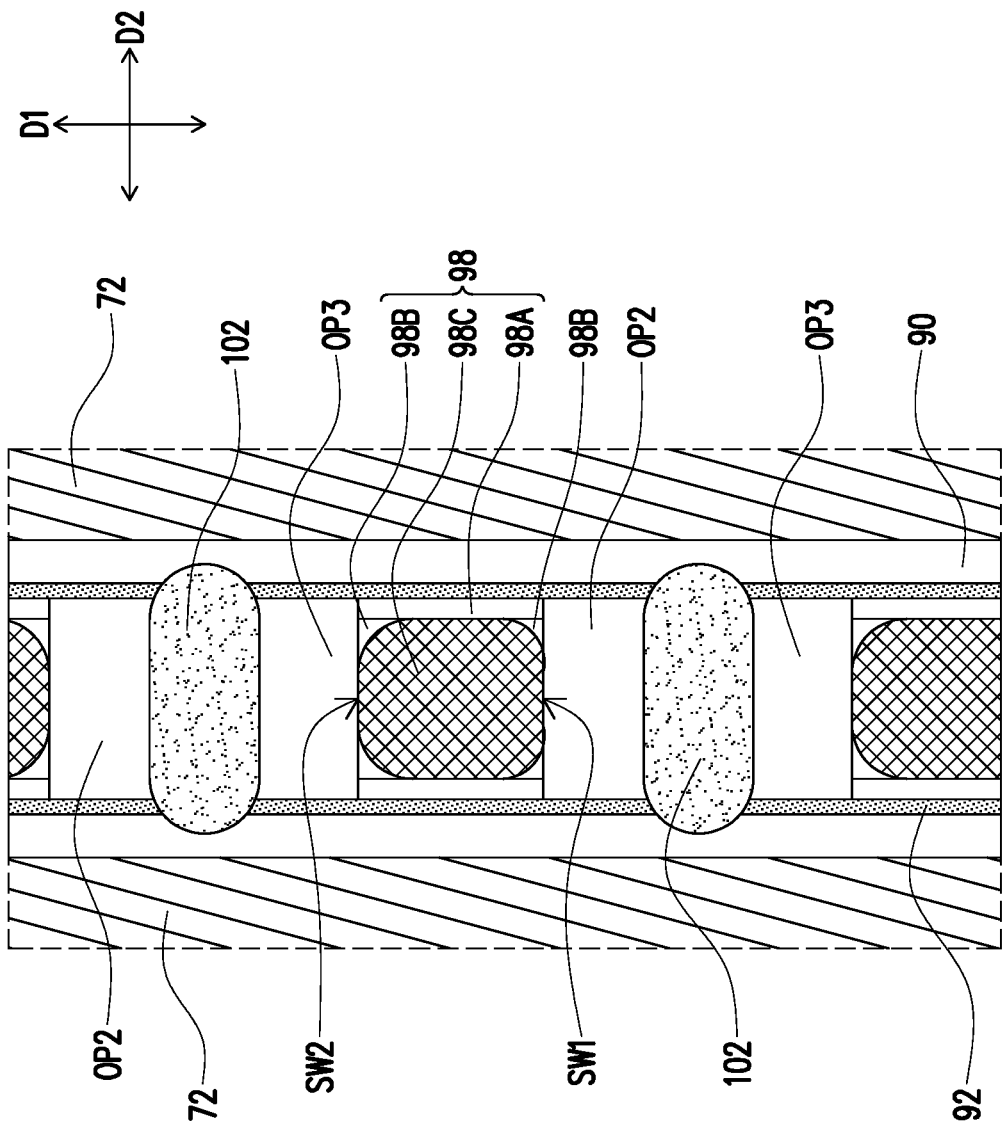

Referring to FIG. 30A to FIG. 30E, an IMD layer 74 is formed on top surfaces of the multi-layer stack 58 (e.g., the dielectric layer 52E), the dielectric layer 90, the channel layer 92, the conductive pillars 106, and the conductive pillars 108 and the IMD 70 (in the staircase region). Conductive contacts 110, 112, and 114 are made on the conductive lines 72, the conductive pillars 106, and the conductive pillars 108, respectively. FIG. 30A illustrates a perspective view of the memory device 200; FIG. 30B illustrates a cross-sectional view of the device along line D-D' of FIG. 1A; FIG. 30C illustrates a top-down view of the memory device 200; and FIG. 30D illustrates a cross-sectional view along the line E-E' of FIG. 30A; and FIG. 30E illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the contacts 110 in the openings.

As also illustrated by the perspective view of FIG. 30A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory device to an underlying/overlying circuitry (e.g., control circuitry) and/or signal, power, and ground lines in the semiconductor die. For example, as shown in FIG. 30D, the conductive contacts 110 may extend through the IMD 74 and IMD 70 to electrically connect conductive lines 116C to the conductive lines 72 and the underlying active devices on the substrate. Other conductive contacts or vias may be formed through the IMD 74 to electrically connect the conductive lines 116A and 116B to the underlying active devices on the substrate. In alternate embodiments, routing and/or power lines to and from the memory device may be provided by an interconnect structure formed over the memory device 200 in addition to or in lieu of the interconnect structure 320

(FIG. 2). Accordingly, the memory device 200 may be completed. In the memory device 200, since the dielectric pillars 98B having the seams Sx are completely removed, a source/drain bridging risk of the conductive pillars 106, 108 is omitted, and the memory device 200 may have controllable cell behavior. Overall, the memory device 200 will have improved performance.

FIG. 31A to FIG. 32C illustrate various views in a method of manufacturing a memory device in accordance with some other embodiments of the disclosure. The method of forming the memory device 200' illustrated in FIG. 31A to FIG. 32C may be similar to the method of forming the memory device 200 illustrated in FIG. 2 to FIG. 30E. Therefore, the same reference numerals are used to refer to the same or liked parts, and its detailed description will not be repeated herein. In some embodiments, the same method illustrated in FIG. 2 to FIG. 27C may be performed to form the gap filling pillars 98C that is surrounded by the dielectric pillars 98A, 98B, and located in between the isolation pillars 102. Thereafter, referring to FIG. 31A to FIG. 31C, portions of the dielectric pillars 98A and portions of the dielectric pillars 98B are removed to form openings OP2 and openings OP3. For example, the dielectric pillars 98A, 98B may be patterned by photolithography processes.

In the exemplary embodiment, the openings OP2 corresponds to a position of the conductive pillars 106 (drain pillars), while the openings OP3 corresponds to a position of the conductive pillars 108 (source pillars) formed in subsequent steps. In some embodiments, the openings OP2, OP3 are rectangular openings. In other words, after patterning the dielectric pillars 98A, 98B, a portion of the dielectric pillars 98B having the seams Sx is completely removed, while another portion of the dielectric pillars 98B without the seams Sx is retained. In some embodiments, the remaining dielectric pillars 98B may be partially covering the curved sidewall SW1 and partially covering the curved sidewall SW2. In some embodiments, portions of the curved sidewall SW1 and portions of the curved sidewall SW2 are revealed by the dielectric pillars 98B. In certain embodiments, the dielectric pillars 98B are located at four corners of the gap filling pillars 98C. Furthermore, surfaces of the dielectric pillars 98B may be aligned with tips of the curved sidewalls SW1, SW2.

Figure 32A:
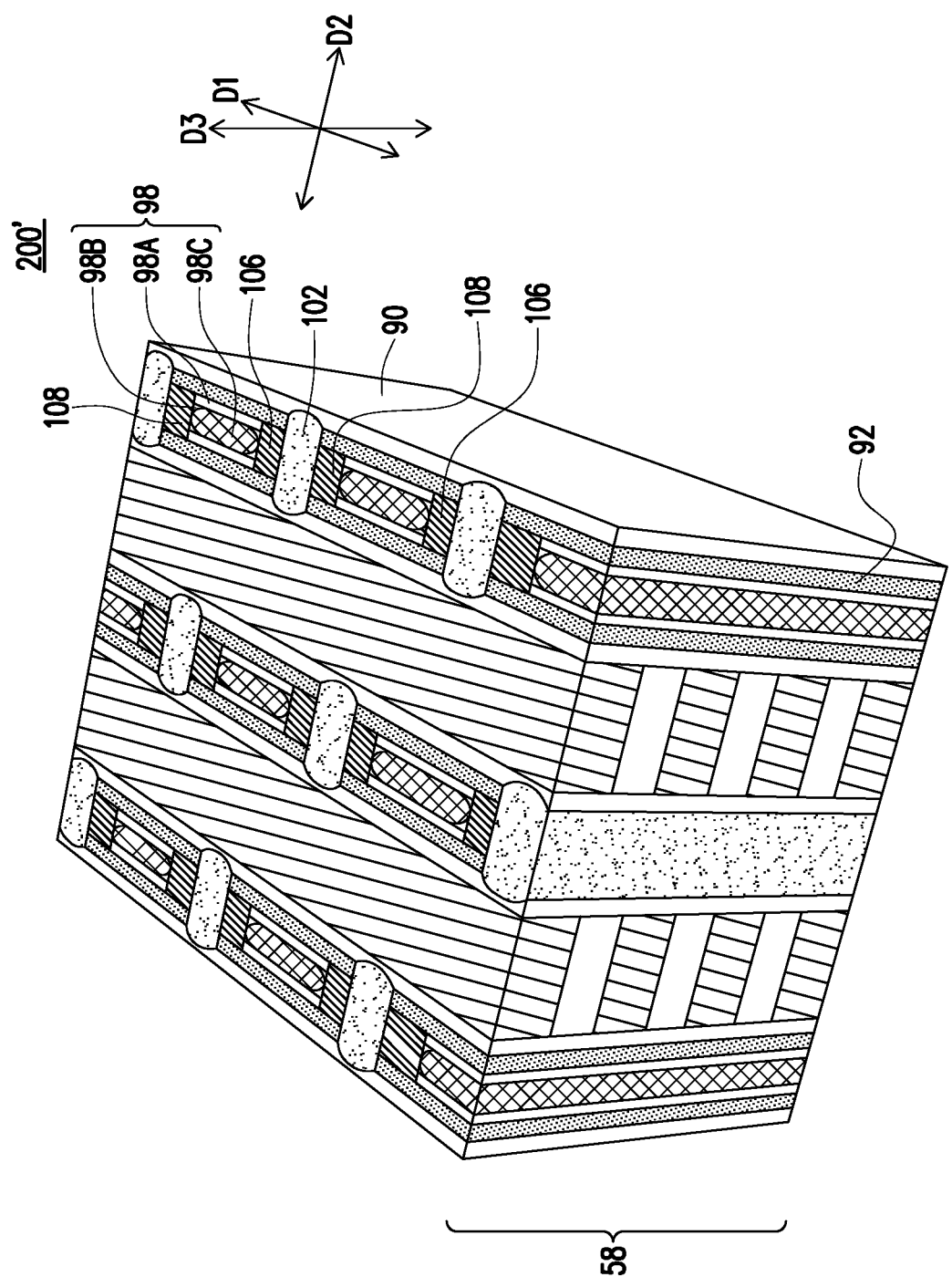
Figure 32B:
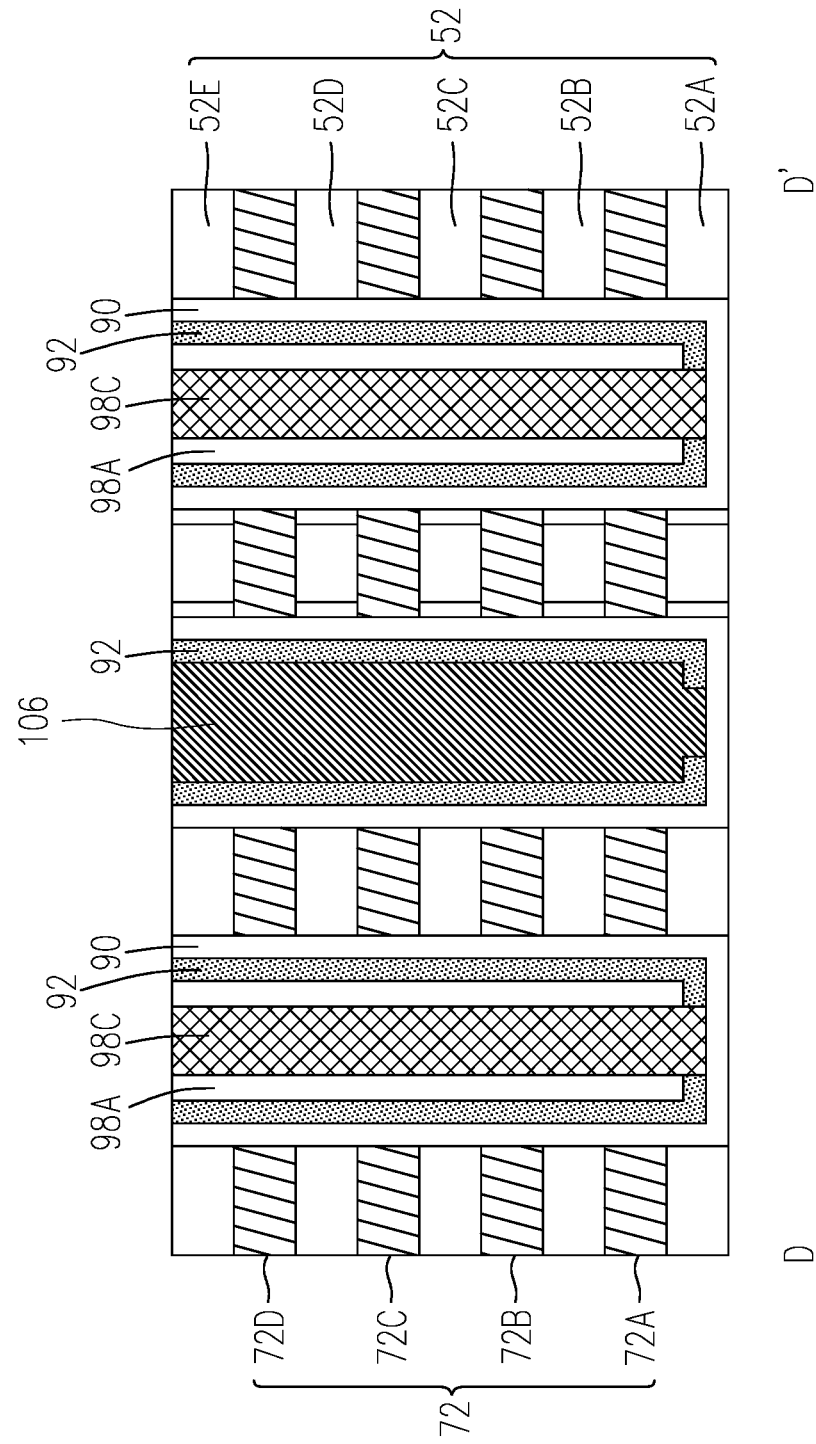
Figure 32C:
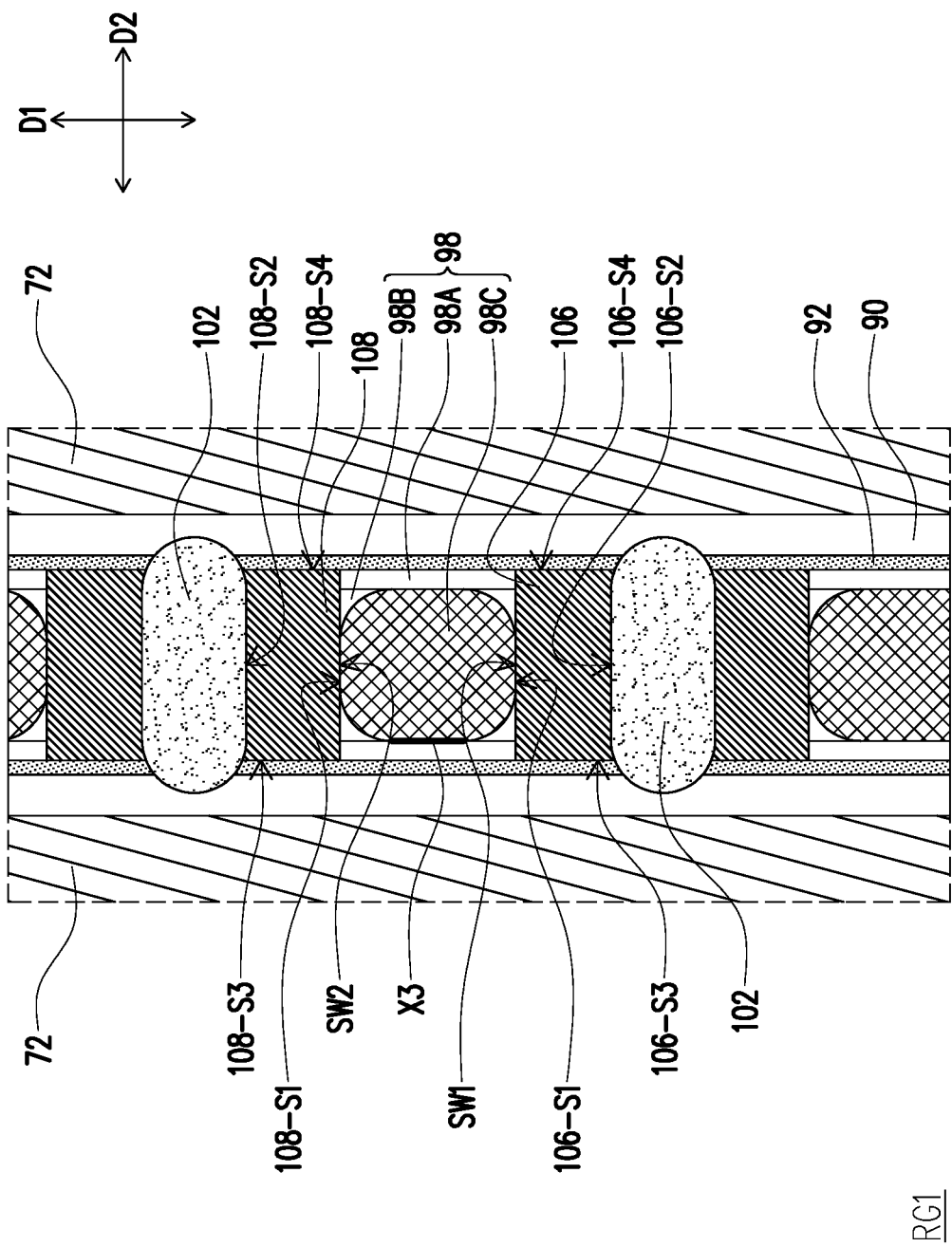
Figure 33A:
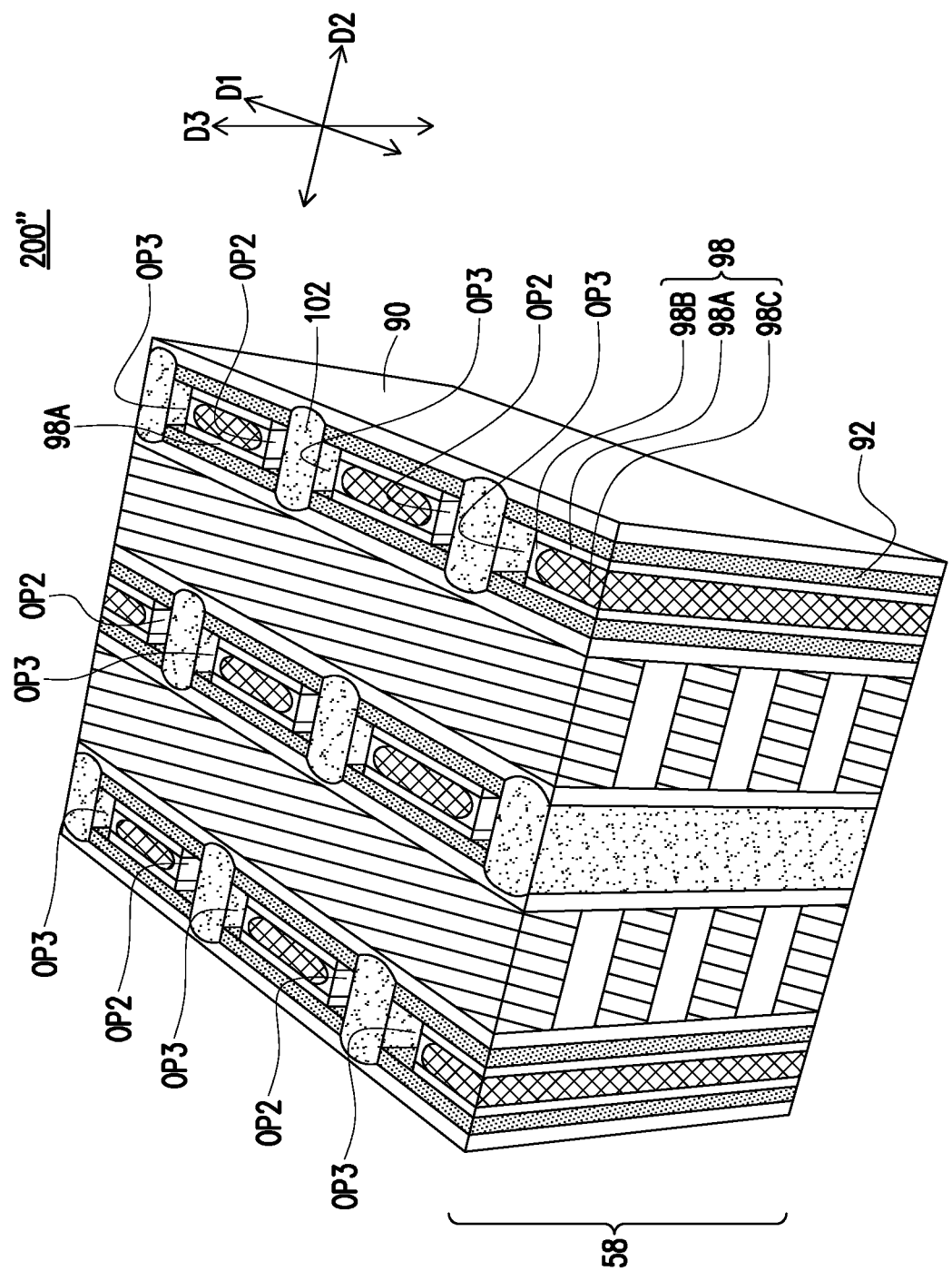
FIG. 33A to FIG. 34C illustrate various views in a method of manufacturing a memory device in accordance with some other embodiments of the disclosure.
Figure 33B:
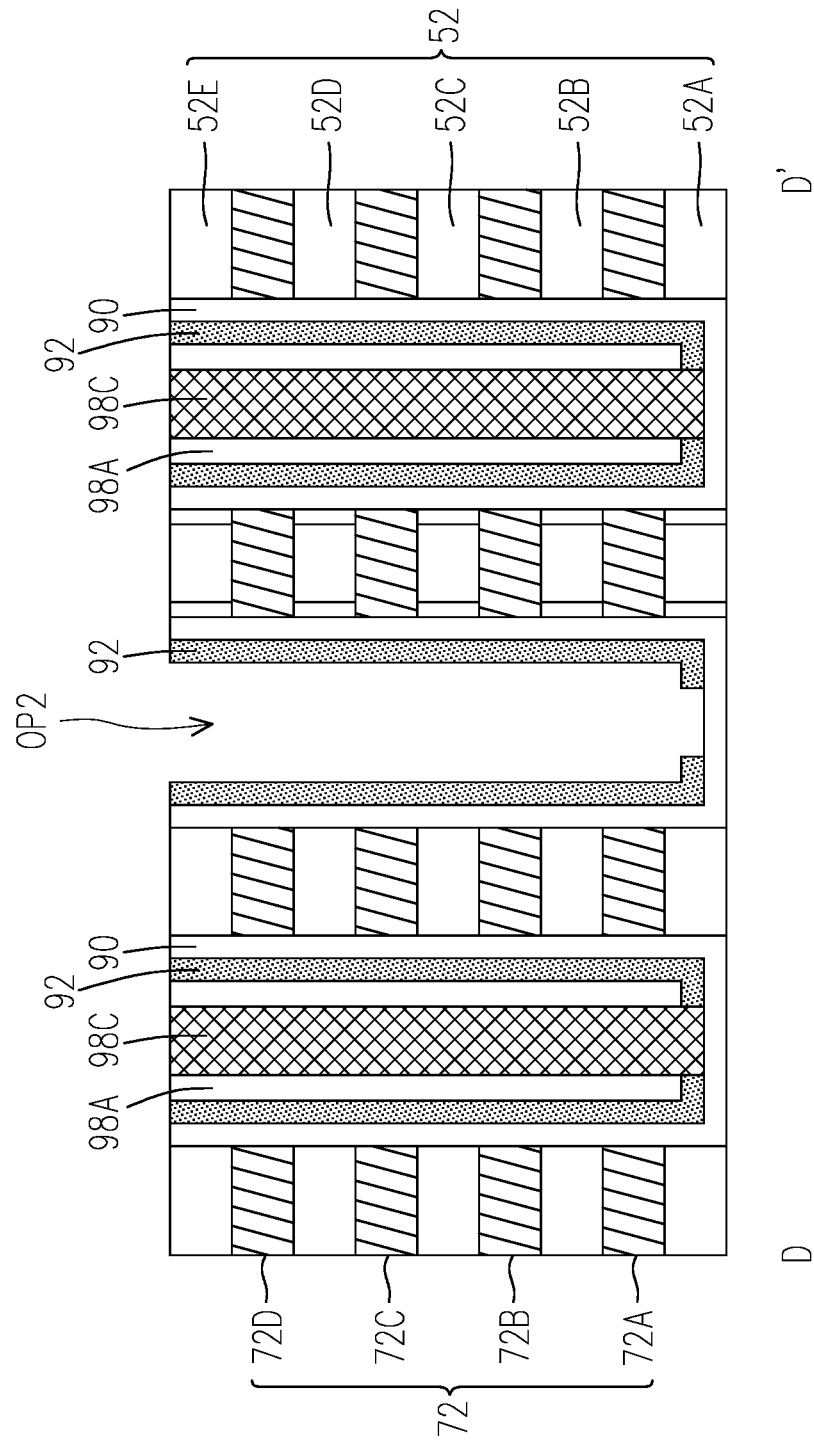
Figure 33C:
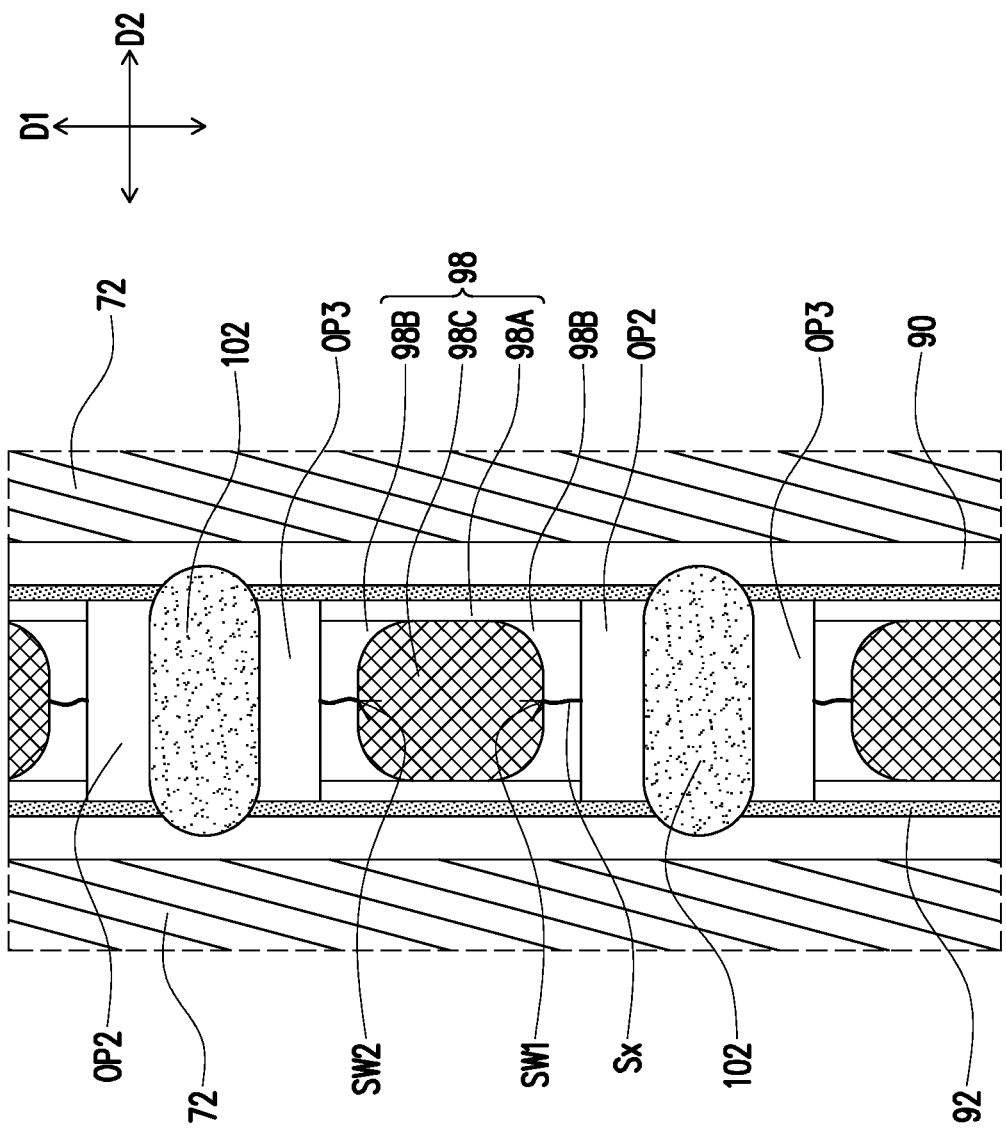

Referring to FIG. 32A to FIG. 32C, in a subsequent step, conductive pillars 106 are formed in the openings OP2, while conductive pillars 108 are formed in the openings OP3. In some embodiments, the conductive pillars 106 correspond to and are electrically connected to the bit lines in the memory device 200', and the conductive pillars 108 correspond to and are electrically connected to the source lines in the memory device 200'. As illustrated in FIG. 32A to FIG. 32C, the conductive pillars 106 (drain pillars) has a planar surface 106-S1, a planar surface 106-S2 opposite to the planar surface 106-S1, and side surfaces 106-S3, 106-S4 joining the planar surface 106-S1 to the planar surface 106-S2. In some embodiments, the planar surface 106-S1 is in contact with the gap filling pillars 98C and the dielectric pillars 98A, 98B, the planar surface 106-S2 is in contact with the isolation pillars 102, and the side surfaces 106-S3, 106-S4 are in contact with the channel layer 92. Similarly, the conductive pillars 108 (source pillars) has a planar surface 108-S1, a planar surface 108-S2 opposite to the planar surface 108-S1, and side surfaces 108-S3, 108-S4 joining the planar surface 108-S1 to the planar surface 108-S2. In some embodiments, the planar surface 108-S1 is in contact with the gap filling pillars 98C and the dielectric pillars 98A, 98B, the planar surface 108-S2 is in contact with the isolation pillars 102, and the side surfaces 108-S3, 106-S4 are in contact with the channel layer 92.

In some embodiments, the dielectric pillars 98A are located in between the channel layer 92 and the gap filling pillars 98C, wherein a length of an interface X3 where the dielectric pillars 98A contact the gap filling pillars 98C along the first direction D1 is different from a length (or width) of the gap filling pillars 98C along the first direction D1. For example, the length of the interface X3 is smaller than the length of the gap filling pillars 98C. In certain embodiments, the length (or width) of the gap filling pillars 98C is substantially equal to a length of the dielectric pillars 98A.

After forming the conductive pillars 106, 108, the same method described in FIG. 30A to FIG. 30E may be performed to form the conductive contacts 112, 114 and 110 and conductive lines 116A, 116B, and 116C. Accordingly, the memory device 200' may be completed. In the memory device 200', since portions of the dielectric pillars 98B having the seams Sx are completely removed, a source/drain bridging risk of the conductive pillars 106, 108 is omitted, and the memory device 200' may have controllable cell behavior. Overall, the memory device 200' will have improved performance.

FIG. 33A to FIG. 34C illustrate various views in a method of manufacturing a memory device in accordance with some other embodiments of the disclosure. The method of forming the memory device 200" illustrated in FIG. 33A to FIG. 34C may be similar to the method of forming the memory device 200 illustrated in FIG. 2 to FIG. 30E. Therefore, the same reference numerals are used to refer to the same or liked parts, and its detailed description will not be repeated herein. In some embodiments, the same method illustrated in FIG. 2 to FIG. 27C may be performed to form the gap filling pillars 98C that is surrounded by the dielectric pillars 98A, 98B, and located in between the isolation pillars 102. Thereafter, referring to FIG. 33A to FIG. 34C, portions of the dielectric pillars 98A and portions of the dielectric pillars 98B are removed to form openings OP2 and openings OP3. For example, the dielectric pillars 98A, 98B may be patterned by photolithography processes.

In the exemplary embodiment, the openings OP2 corresponds to a position of the conductive pillars 106 (drain pillars), while the openings OP3 corresponds to a position of the conductive pillars 108 (source pillars) formed in subsequent steps. In some embodiments, the openings OP2, OP3 are rectangular openings. In some embodiments, after patterning the dielectric pillars 98A, 98B, a portion of the dielectric pillars 98B having the seams Sx is completely removed, however, another portion of the dielectric pillars 98B having the seams Sx is retained. In some embodiments, the remaining dielectric pillars 98B may be completely covering the curved sidewall SW1 and completely covering the curved sidewall SW2. For example, the dielectric pillars 98B may have a curved surface covering the curved sidewalls SW1, SW2, and have a planar surface facing away from the curved sidewalls SW1, SW2.

Figure 34A:
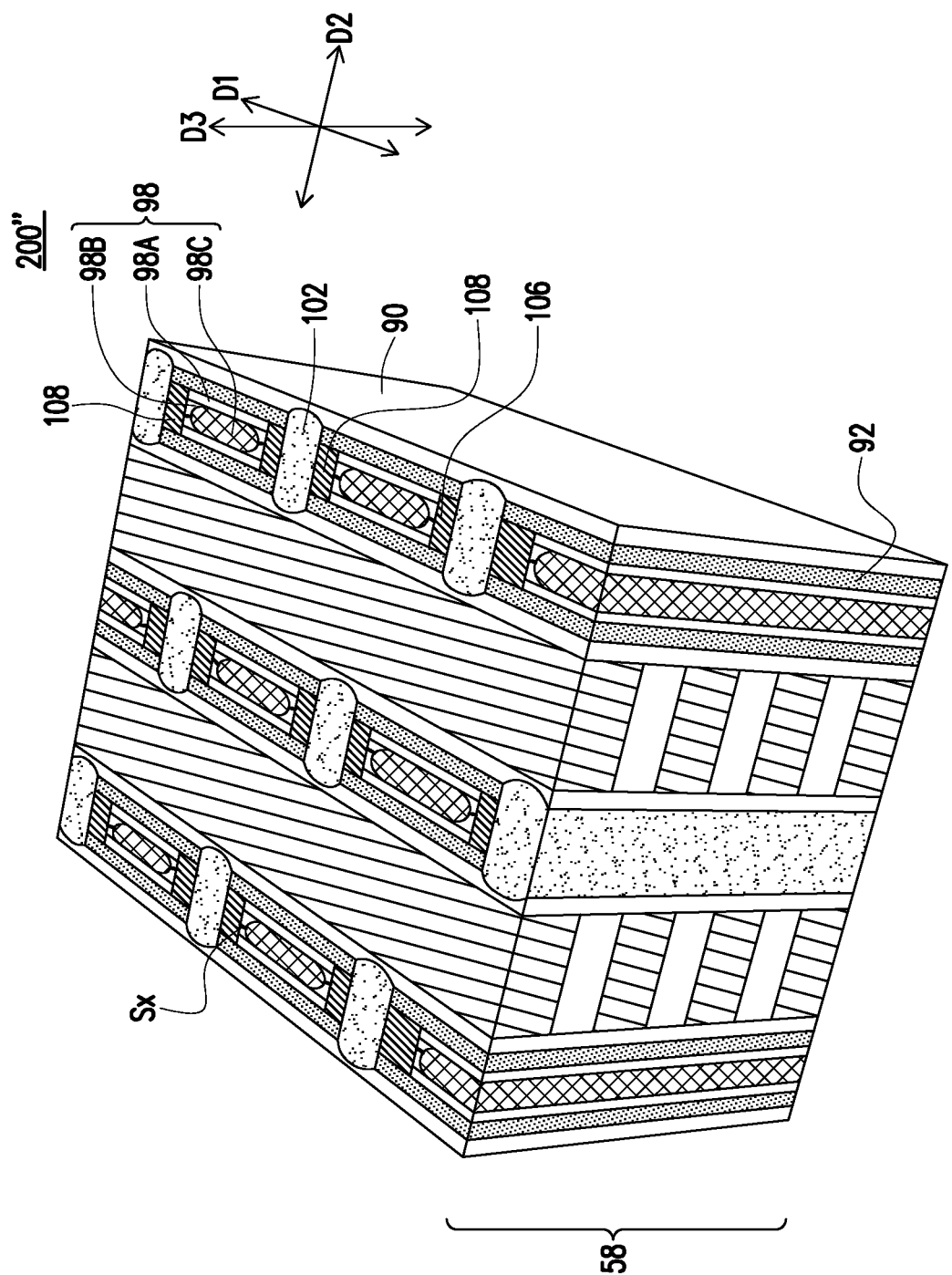
Figure 34B:
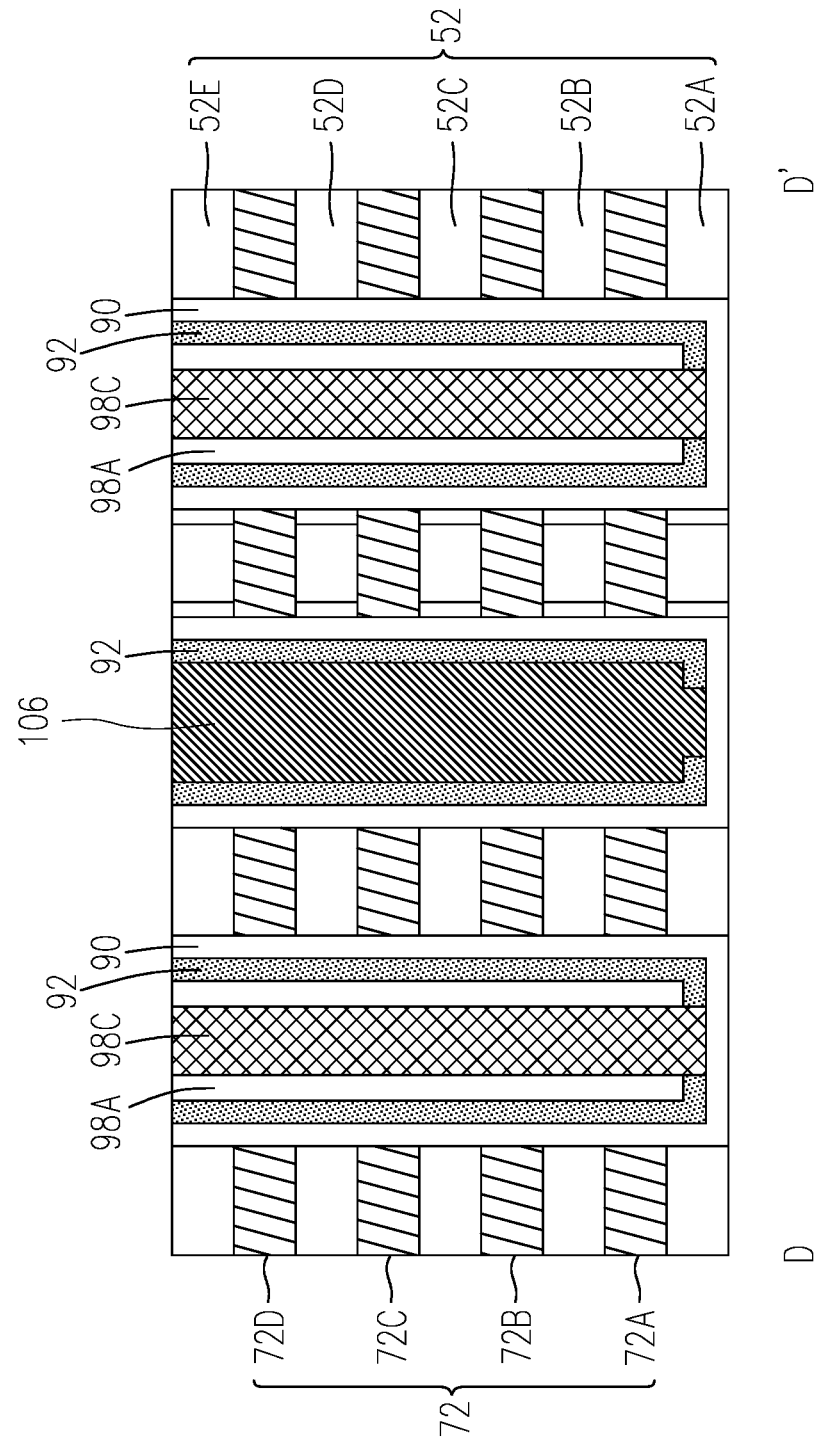
Figure 34C:
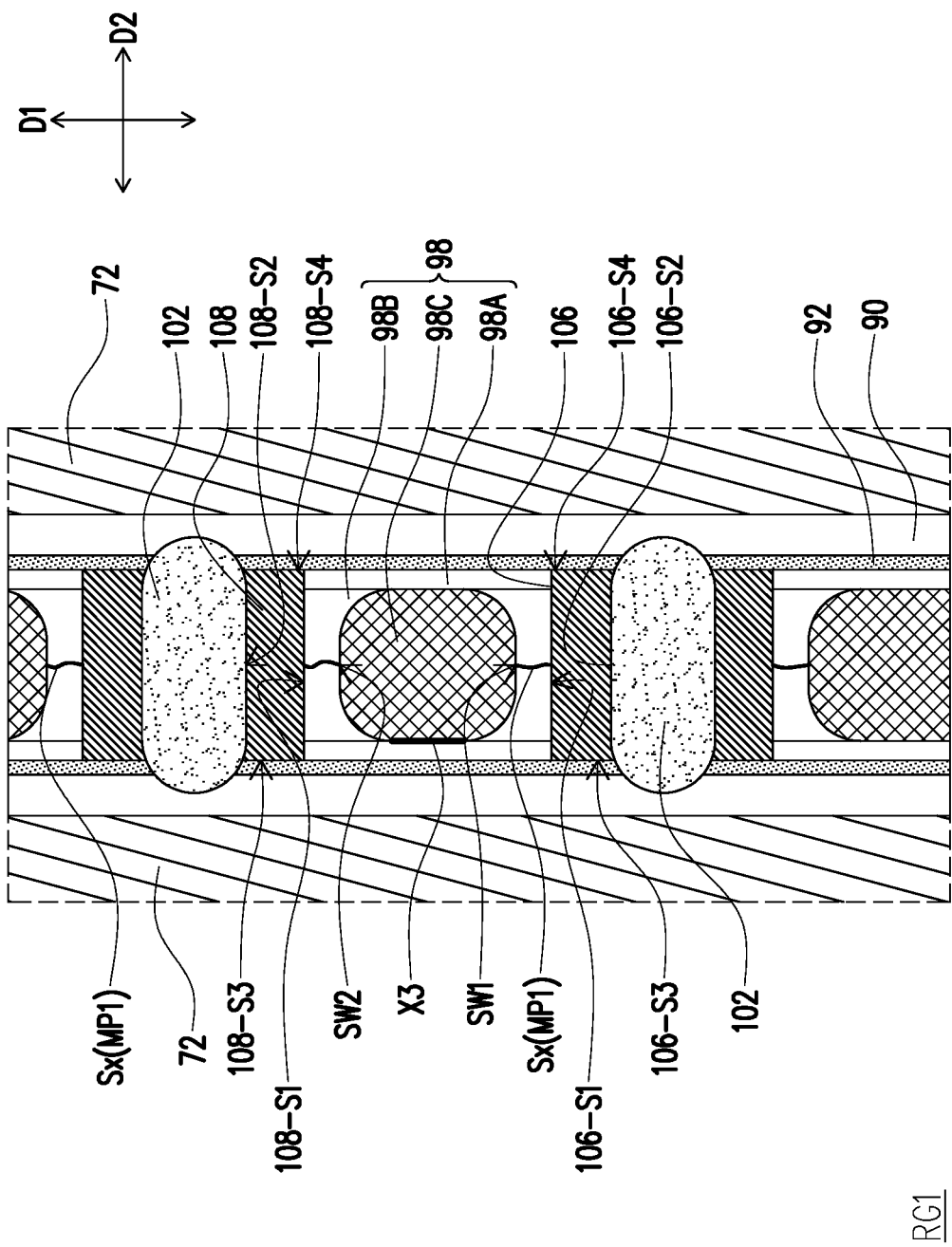

Referring to FIG. 34A to FIG. 34C, in a subsequent step, conductive pillars 106 are formed in the openings OP2, while conductive pillars 108 are formed in the openings OP3. In some embodiments, the conductive pillars 106 correspond to and are electrically connected to the bit lines in the memory device 200", and the conductive pillars 108 correspond to and are electrically connected to the source lines in the memory device 200". As illustrated in FIG. 34A to FIG. 34C, the conductive pillars 106 (drain pillars) has a planar surface 106-S1, a planar surface 106-S2 opposite to the planar surface 106-S1, and side surfaces 106-S3, 106-S4 joining the planar surface 106-S1 to the planar surface 106-S2. In some embodiments, the planar surface 106-S1 is in contact with the dielectric pillars 98A, 98B, the planar surface 106-S2 is in contact with the isolation pillars 102, and the side surfaces 106-S3, 106-S4 are in contact with the channel layer 92. Similarly, the conductive pillars 108 (source pillars) has a planar surface 108-S1, a planar surface 108-S2 opposite to the planar surface 108-S1, and side surfaces 108-S3, 108-S4 joining the planar surface 108-S1 to the planar surface 108-S2. In some embodiments, the planar surface 108-S1 is in contact with the dielectric pillars 98A, 98B, the planar surface 108-S2 is in contact with the isolation pillars 102, and the side surfaces 108-S3, 108-S4 are in contact with the channel layer 92. Furthermore, the dielectric pillars 98B separates the conductive pillars 106, 108 from the gap filling pillars 98C.

As illustrated in FIG. 34C, the dielectric pillars 98B having the seams Sx are retained. As such, when forming the conductive pillars 106, 108 into the openings OP2, OP3, the conductive materials may fill into the seams Sx and form metal pipes MP1. For example, the metal pipes MP1 may extend from the conductive pillars 106, 108 towards the gap filling pillars 98C. In some embodiments, the dielectric pillars 98A are located in between the channel layer 92 and the gap filling pillars 98C, wherein a length of an interface X3 where the dielectric pillars 98A contact the gap filling pillars 98C along the first direction D1 is different from a length (or width) of the gap filling pillars 98C along the first direction D1. For example, the length of the interface X3 is smaller than the length of the gap filling pillars 98C. In certain embodiments, the length (or width) of the gap filling pillars 98C is smaller than a length of the dielectric pillars 98A.

After forming the conductive pillars 106, 108, the same method described in FIG. 30A to FIG. 30E may be performed to form the conductive contacts 112, 114 and 110 and conductive lines 116A, 116B, and 116C. Accordingly, the memory device 200" may be completed. In the memory device 200", since gap filling pillars 98C are located in between and separating the conductive pillars 106 from the conductive pillars 108, even if seams Sx exists, the metal pipes MP1 passing through the seams Sx will be blocked by the gap filling pillars 98C. As such, a source/drain bridging risk of the conductive pillars 106, 108 is omitted, and the memory device 200" may have controllable cell behavior. Overall, the memory device 200" will have improved performance.

FIG. 35A to FIG. 36B illustrate various views in a method of manufacturing a memory device in accordance with some comparative embodiments of the disclosure. The method of forming the memory device 200X illustrated in FIG. 35A to FIG. 36B may be similar to the method of forming the memory device 200 illustrated in FIG. 2 to FIG. 30E. Therefore, the same reference numerals are used to refer to the same or liked parts, and its detailed description will not be repeated herein. In some embodiments, the same method illustrated in FIG. 2 to FIG. 24B may be performed to form the isolation pillars 102 and the dielectric pillars 98A, 98B separating the isolation pillars 102.

Figure 35A:
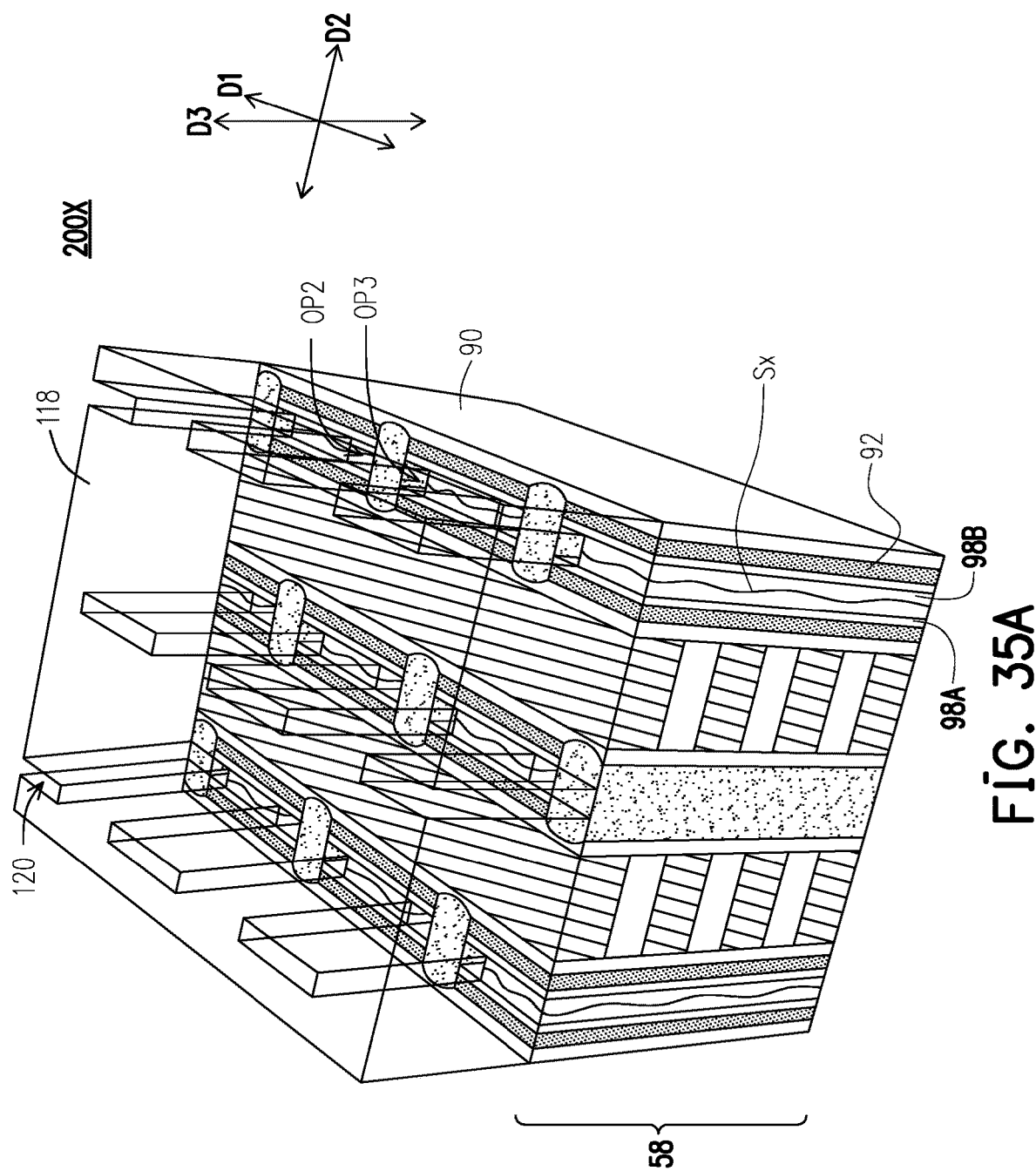
FIG. 35A to FIG. 36B illustrate various views in a method of manufacturing a memory device in accordance with some comparative embodiments of the disclosure.
Figure 35B:
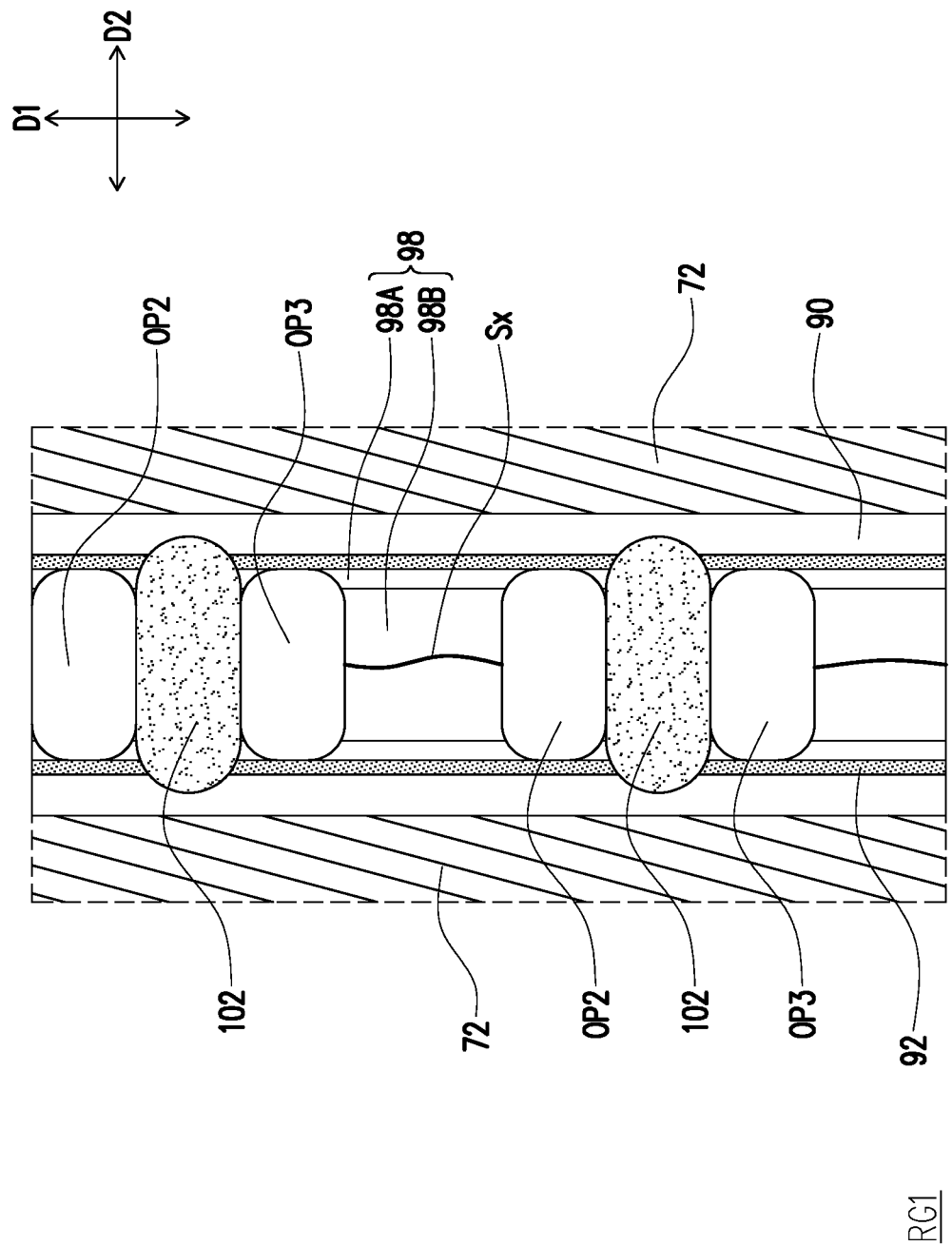

Referring to FIG. 35A and FIG. 35B, after forming the isolation pillars 102, a photoresist 118 is provided over the multi-layer stack 58, the dielectric pillars 98A/98B, the isolation pillars 102, the channel layer 92, and the dielectric layer 90. In some embodiments, the photoresist 118 is patterned by an acceptable photolithography technique to define the openings 120. Each of the openings 120 may expose two separate regions of the dielectric pillars 98A/98B beside the isolation pillar 102. Subsequently, portions of the dielectric pillars 98A/98B exposed by the openings 120 may be removed by an acceptable etching process, such as by a dry etch (e.g., RIE, NBE, the like), a wet etch, the like, or a combination thereof. For example, the dielectric pillars 98A/98B are removed to form the openings OP2, OP3. In some embodiments, the seams Sx in the dielectric pillars 98B are retained, and the seams Sx may extend from the openings OP2 to the openings OP3.

Figure 36A:
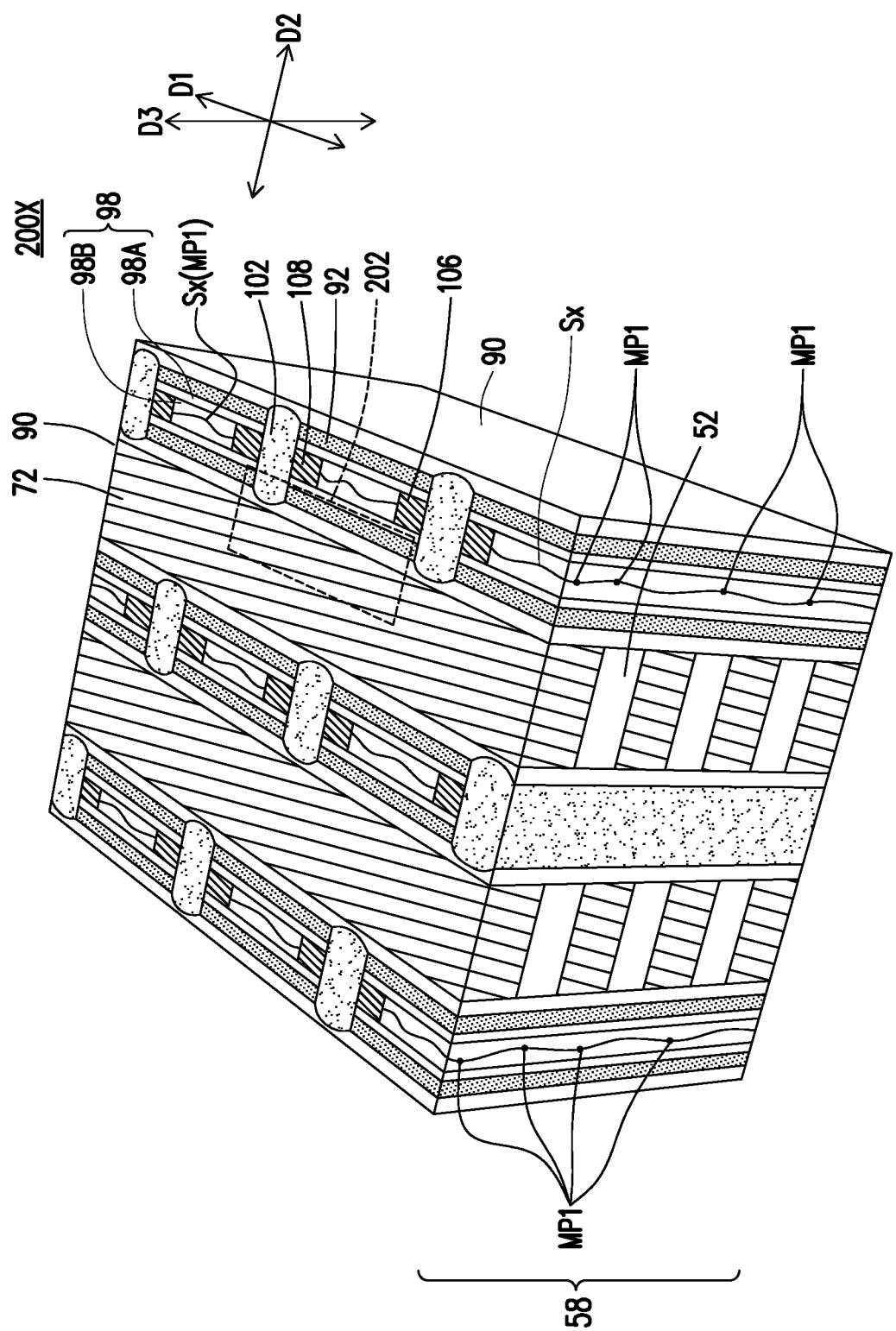
Figure 36B:
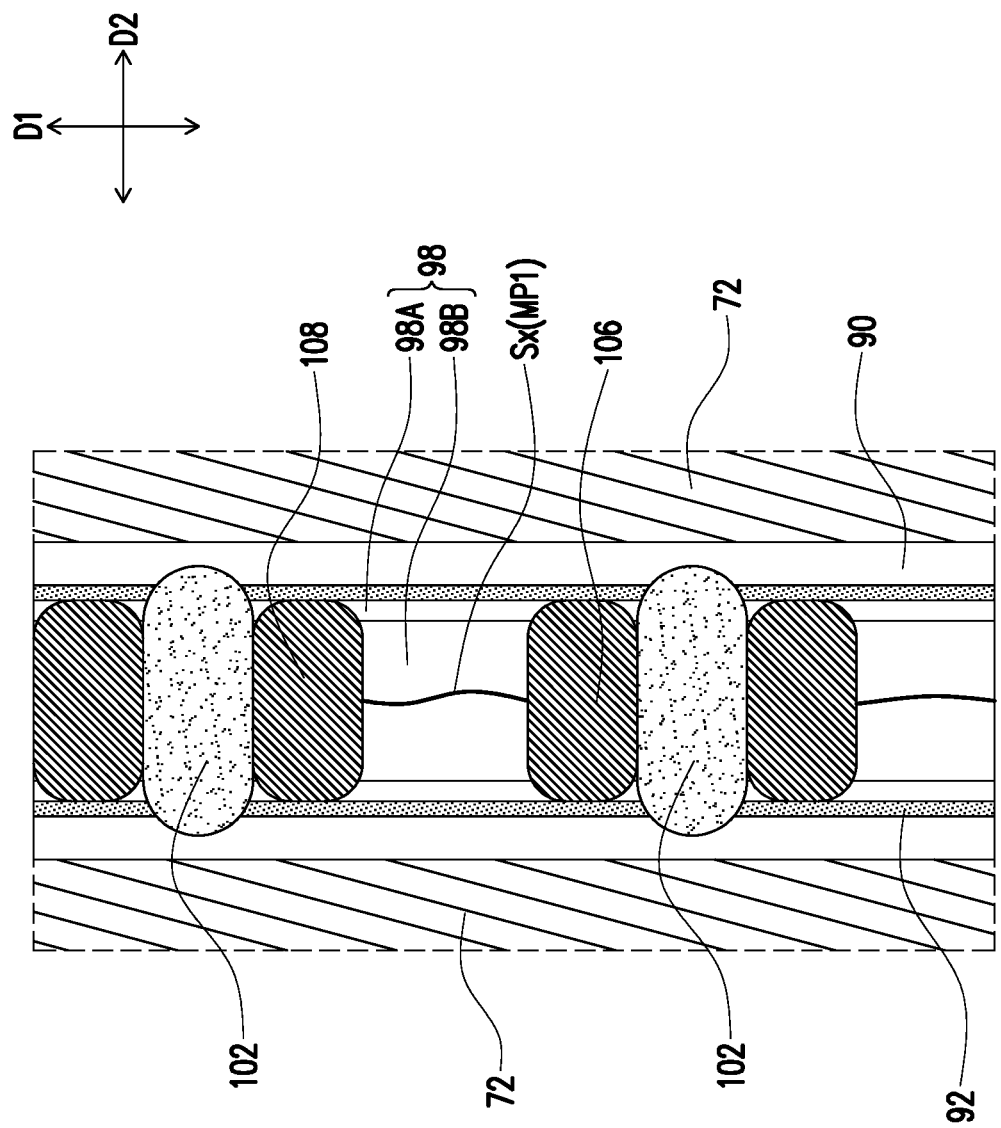

Referring to FIG. 36A and FIG. 36B, in a subsequent step, conductive pillars 106 are formed in the openings OP2, while conductive pillars 108 are formed in the openings OP3. In some embodiments, the conductive pillars 106 correspond to and are electrically connected to the bit lines in the memory device 200X, and the conductive pillars 108 correspond to and are electrically connected to the source lines in the memory device 200X. Furthermore, it is noted that seams SX are included in the dielectric pillar 98B. As such, when forming the conductive pillars 106, 108 into the openings OP2, OP3, the conductive materials may fill into the seams Sx and form metal pipes MP1. For example, the metal pipes MP1 may extend through the seams Sx and extend from the conductive pillars 106 towards the conductive pillars 108.

After forming the conductive pillars 106, 108, the same method described in FIG. 30A to FIG. 30E may be performed to form the conductive contacts 112, 114 and 110 and conductive lines 116A, 116B, and 116C. Accordingly, the memory device 200X may be completed. In the memory device 200" of the comparative embodiment, since a gap filling pillar 98C is formed in between and separating the conductive pillars 106 from the conductive pillars 108, metal pipes MP1 may extend through the seams Sx and cause bridging between the conductive pillars 106, 108, which results in uncontrollable cell behavior. Overall, a performance of the memory device 200X is deteriorated.

In the above-mentioned embodiments, the memory device includes gap filling pillars located in between the first conductive pillars (drain pillars) and the second conductive pillars (source pillars). Therefore, even if seams exist in the dielectric pillars, conductive materials (or metal pipes) passing through the seams will be blocked by the gap filling pillars. As such, a source/drain bridging risk of the conductive pillars is omitted, and the memory device may have controllable cell behavior. Overall, the memory device will have improved performance.

In accordance with some embodiments of the present disclosure, a memory device includes a plurality of first conductive pillars, a plurality of second conductive pillars, a plurality of gap filling pillars, a channel layer and first dielectric pillars. The gap filling pillars are located in between the first conductive pillars and the second conductive pillars. The channel layer is extending in a first direction, and located on side surfaces of the first conductive pillars and the second conductive pillars. The first dielectric pillars are located in between the channel layer and the plurality of gap filling pillars, wherein a length of an interface where the first dielectric pillars contact the gap filling pillars along the first direction is different from a length of the gap filling pillars along the first direction.

In accordance with some other embodiments of the present disclosure, a memory device includes a multi-layer stack, a plurality of first dielectric pillars, a channel layer and a plurality of gap filling pillars. The multi-layer stack is disposed on a substrate and includes a plurality of conductive layers and a plurality of dielectric layers alternately stacked. The first dielectric pillars are disposed on the substrate and penetrating through the multi-layer stack. The channel layer is located on side surfaces of the first dielectric pillars. The gap filling pillars are located in between the first dielectric pillars and separated from the channel layer, wherein the gap filling pillars have a first sidewall and a second sidewall opposite to the first sidewall, and the first sidewall and the second sidewall are misaligned with ends of the first dielectric pillars.

In accordance with yet another embodiment of the present disclosure, a method of forming a memory device is described. The method includes the following steps. First dielectric pillars and second dielectric pillars are formed over a substrate. A channel layer is formed on side surfaces of the first dielectric pillars, wherein the channel layer is extending in a first direction. A first etching process is performed to remove portions of the second dielectric pillars to form first openings. A plurality of gap filling pillars is formed in the first openings, wherein the first dielectric pillars are located in between the channel layer and the plurality of gap filling pillars. Portions of the first dielectric pillars and another portion of the second dielectric pillars are removed to form second openings and third openings, wherein after removing the portions of the first dielectric pillars, a length of an interface where the first dielectric pillars contact the plurality of gap filling pillars along the first direction is different from a length of the plurality of gap filling pillars along the first direction. A plurality of first conductive pillars is formed in the second openings and a plurality of second conductive pillars is formed in the third openings, wherein the plurality of gap filling pillars is located in between the plurality of first conductive pillars and the plurality of second conductive pillars, and the channel layer is located on side surfaces of the plurality of first conductive pillars and the plurality of second conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of first conductive pillars and a plurality of second conductive pillars;
   a plurality of gap filling pillars located in between the plurality of first conductive pillars and the plurality of second conductive pillars;
   a channel layer extending in a first direction, and located on side surfaces of the plurality of first conductive pillars and the plurality of second conductive pillars; and
   first dielectric pillars located in between the channel layer and the plurality of gap filling pillars, wherein a length of an interface where the first dielectric pillars contact the plurality of gap filling pillars along the first direction is different from a length of the plurality of gap filling pillars along the first direction.

2. The memory device according to claim 1, wherein the plurality of first conductive pillars has a first curved surface, and the plurality of second conductive pillars has a second curved surface, and the first curved surface and the second curved surface are in contact with the plurality of gap filling pillars.

3. The memory device according to claim 1, wherein the plurality of gap filling pillars has a first curved sidewall and a second curved sidewall opposite to the first curved sidewall, the first curved sidewall is facing the plurality of first conductive pillars, and the second curved sidewall is facing the plurality of second conductive pillars.

4. The memory device according to claim 3, further comprising second dielectric pillars partially covering the first curved sidewall and the second curved sidewall.

5. The memory device according to claim 3, further comprising second dielectric pillars covering the first curved sidewall and the second curved sidewall, wherein the second dielectric pillars separate the plurality of first conductive pillars and the plurality of second conductive pillars from the plurality of gap filling pillars.

6. The memory device according to claim 5, wherein a plurality of metal pipes is extending from the plurality of first conductive pillars and the plurality of second conductive pillars into the second dielectric pillars.

7. The memory device according to claim 1, wherein the plurality of gap filling pillars and the first dielectric pillars are made of materials having different etching selectivity.

8. The memory device according to claim 1, further comprising a plurality of isolation pillars separating the plurality of first conductive pillars from the plurality of second conductive pillars.

9. A memory device, comprising:
   a multi-layer stack, disposed on a substrate and comprising a plurality of conductive layers and a plurality of dielectric layers alternately stacked;
   a plurality of first dielectric pillars, disposed on the substrate and penetrating through the multi-layer stack;
   a channel layer located on side surfaces of the plurality of first dielectric pillars; and
   a plurality of gap filling pillars located in between the plurality of first dielectric pillars and separated from the channel layer, wherein the plurality of gap filling pillars has a first sidewall and a second sidewall opposite to the first sidewall, and the first sidewall and the second sidewall are misaligned with ends of the plurality of first dielectric pillars.

10. The memory device according to claim 9, further comprising a plurality of source pillars and a plurality of drain pillars located on two sides of the plurality of gap filling pillars, wherein the channel layer is contacting the plurality of source pillars and the plurality of drain pillars.

11. The memory device according to claim 10, wherein the ends of the plurality of first dielectric pillars include a first end and a second end opposite to the first end, the first end is in contact with the plurality of drain pillars, and the second end is in contact with the source pillars.

12. The memory device according to claim 11, wherein:
   the plurality of drain pillars has a first curved surface and first tip portions joined with the first curved surface, the first curved surface is in contact with the first sidewall of the plurality of gap filling pillars, and the first tip portions are in contact with the first end of the plurality of first dielectric pillars; and
   the plurality of source pillars has a second curved surface and second tip portions joined with the first curved surface, the second curved surface is in contact with the second sidewall of the plurality of gap filling pillars, and the second tip portions are in contact with the second end of the plurality of first dielectric pillars.

13. The memory device according to claim 11, further comprising a plurality of second dielectric pillars located in between the first end of the first dielectric pillars and the plurality of drain pillars, and located in between the second end of the first dielectric pillars and the plurality of source pillars.

14. The memory device according to claim 13, wherein seams exist in the plurality of second dielectric pillars.

15. The memory device according to claim 9, further comprising:
   a plurality of isolation pillars located on two sides of the plurality of gap filling pillars; and
   a ferroelectric layer covering side surfaces of the channel and side surfaces of the plurality of isolation pillars.

* * * * *